(12) United States Patent
Chida

(10) Patent No.: US 11,315,527 B2
(45) Date of Patent: Apr. 26, 2022

(54) DISPLAY DEVICE AND ELECTRONIC DEVICE

(71) Applicant: Semiconductor Energy Laboratory Co., Ltd., Atsugi (JP)

(72) Inventor: Akihiro Chida, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/190,470

(22) Filed: Mar. 3, 2021

(65) Prior Publication Data

US 2021/0193081 A1 Jun. 24, 2021

Related U.S. Application Data

(63) Continuation of application No. 16/465,316, filed as application No. PCT/IB2017/058033 on Dec. 18, 2017.

(30) Foreign Application Priority Data

Dec. 22, 2016 (JP) .............................. JP2016-248914
Aug. 23, 2017 (JP) .............................. JP2017-159979

(51) Int. Cl.
*G09G 5/36* (2006.01)
*G09G 5/00* (2006.01)

(52) U.S. Cl.
CPC .............. *G09G 5/36* (2013.01); *G09G 5/006* (2013.01); *G09G 2300/0439* (2013.01); *G09G 2340/0442* (2013.01)

(58) Field of Classification Search
None
See application file for complete search history.

(56) References Cited

U.S. PATENT DOCUMENTS

| | | |
|---|---|---|
| 8,253,654 B2 | 8/2012 | Alberth, Jr. |
| 9,202,987 B2 | 12/2015 | Takayama et al. |

(Continued)

FOREIGN PATENT DOCUMENTS

| | | |
|---|---|---|
| CN | 101647050 A | 2/2010 |
| CN | 103440822 A | 12/2013 |

(Continued)

OTHER PUBLICATIONS

International Search Report (Application No. PCT/IB2017/058033) dated Apr. 3, 2018.

(Continued)

*Primary Examiner* — Christopher R Lamb
(74) *Attorney, Agent, or Firm* — Robinson Intellectual Property Law Office; Eric J. Robinson

(57) ABSTRACT

A display device whose aspect ratio can be changed is provided. The display device includes a plurality of display units and a plurality of driver circuit units. The plurality of display units each include a light-emitting portion and a connection region. The plurality of driver circuit units each include a driver circuit portion and a connection region. The connection regions of the adjacent units overlap with each other and one shaft passes through the connection regions. The adjacent units are electrically connected to each other with the one shaft. With such a structure, an angle between the adjacent units electrically connected to each other with one shaft can be changed, which enables the aspect ratio of the display device to be changed.

12 Claims, 30 Drawing Sheets

(56) References Cited

U.S. PATENT DOCUMENTS

| | | | |
|---|---|---|---|
| 9,307,585 B2 | 4/2016 | Miura | |
| 9,536,860 B2 | 1/2017 | Yoon et al. | |
| 9,601,557 B2 | 3/2017 | Yang et al. | |
| 9,608,004 B2 | 3/2017 | Takayama et al. | |
| 9,671,919 B2 | 6/2017 | Kurasawa et al. | |
| 9,799,708 B2 | 10/2017 | Hong et al. | |
| 9,802,397 B2 | 10/2017 | Abe et al. | |
| 9,952,700 B2 | 4/2018 | Kurasawa et al. | |
| 10,056,435 B2 | 8/2018 | Hong et al. | |
| 10,139,942 B2 | 11/2018 | Kurasawa et al. | |
| 10,225,936 B2 | 3/2019 | Yang et al. | |
| 10,644,079 B2 | 5/2020 | Hong et al. | |
| 2002/0094701 A1* | 7/2002 | Biegelsen | H01L 25/0655 |
| | | | 439/32 |
| 2008/0224948 A1 | 9/2008 | Alberth | |
| 2014/0138637 A1 | 5/2014 | Yang et al. | |
| 2014/0299362 A1* | 10/2014 | Park | H05K 1/0283 |
| | | | 174/254 |
| 2014/0307430 A1 | 10/2014 | Lo et al. | |
| 2015/0262331 A1 | 9/2015 | Bang et al. | |
| 2015/0357395 A1 | 12/2015 | Cheon et al. | |
| 2015/0359135 A1 | 12/2015 | Cavallaro et al. | |
| 2015/0378393 A1 | 12/2015 | Erad et al. | |
| 2016/0111481 A1 | 4/2016 | Jeong et al. | |
| 2016/0198567 A1 | 7/2016 | Hong et al. | |
| 2016/0204185 A1 | 7/2016 | Iijima et al. | |
| 2016/0293571 A1 | 10/2016 | Yoon et al. | |
| 2016/0359135 A1 | 12/2016 | Wang et al. | |
| 2017/0047358 A1 | 2/2017 | Takayama et al. | |
| 2017/0271398 A1* | 9/2017 | Oh | H01L 25/0753 |
| 2020/0258951 A1 | 8/2020 | Hong et al. | |

FOREIGN PATENT DOCUMENTS

| | | |
|---|---|---|
| CN | 104221471 A | 12/2014 |
| CN | 104769719 A | 7/2015 |
| CN | 105518766 A | 4/2016 |
| CN | 105977276 A | 9/2016 |
| EP | 2838317 A | 2/2015 |
| EP | 3242282 A | 11/2017 |
| GB | 2522364 | 10/2018 |
| JP | 07-121122 A | 5/1995 |
| JP | 2003-174153 A | 6/2003 |
| JP | 2005-114796 A | 4/2005 |
| JP | 2010-054643 A | 3/2010 |
| JP | 2012-169139 A | 9/2012 |
| JP | 2013-030496 A | 2/2013 |
| JP | 2013-062255 A | 4/2013 |
| JP | 2013-120286 A | 6/2013 |
| JP | 2015-156009 A | 8/2015 |
| JP | 2016-503515 | 2/2016 |
| JP | 2016-102669 A | 6/2016 |
| JP | 2016-136515 A | 7/2016 |
| KR | 2009-0112761 A | 10/2009 |
| KR | 2014-0022180 A | 2/2014 |
| KR | 2015-0072432 A | 6/2015 |
| KR | 2016-0047064 A | 5/2016 |
| KR | 10-1646690 | 8/2016 |
| KR | 2016-0118459 A | 10/2016 |
| KR | 2017-0095948 A | 8/2017 |
| TW | 201427516 | 7/2014 |
| WO | WO-2008/115612 | 9/2008 |
| WO | WO-2009/072422 | 6/2009 |
| WO | WO-2014/078024 | 5/2014 |
| WO | WO-2016/106734 | 7/2016 |

OTHER PUBLICATIONS

Written Opinion (Application No. PCT/IB2017/058033) dated Apr. 3, 2018.

Chinese Office Action (Application No. 201780075077.7) dated Jul. 14, 2021.

\* cited by examiner

FIG. 1D1 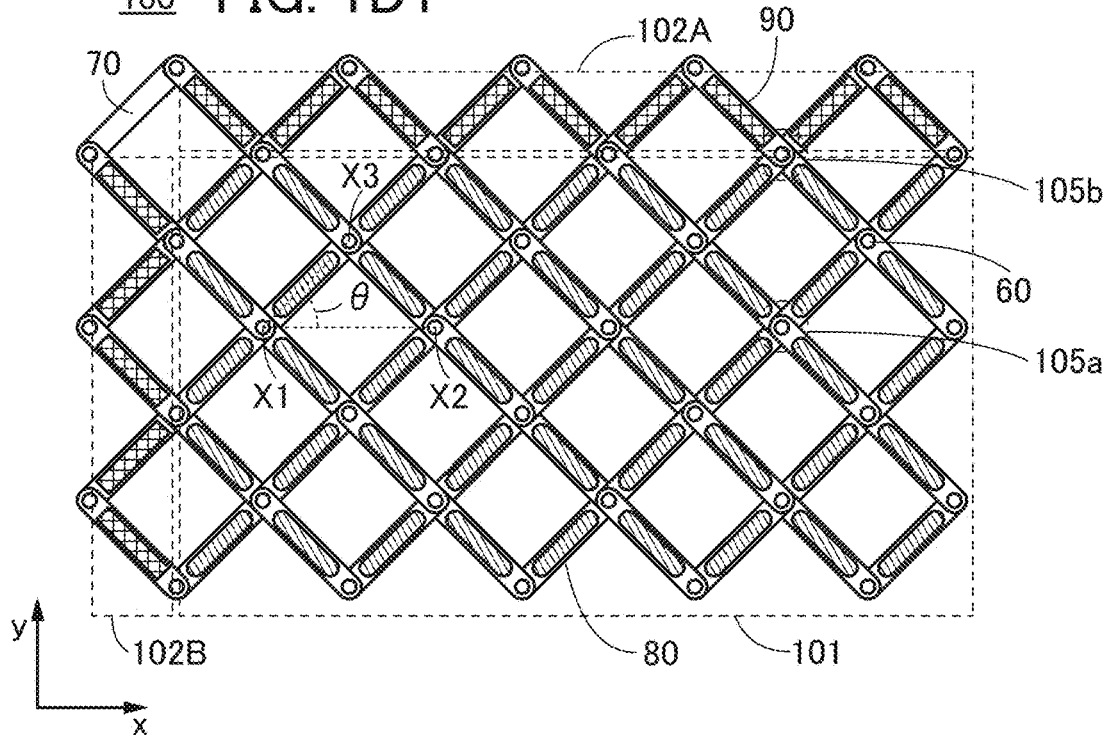
FIG. 1D2 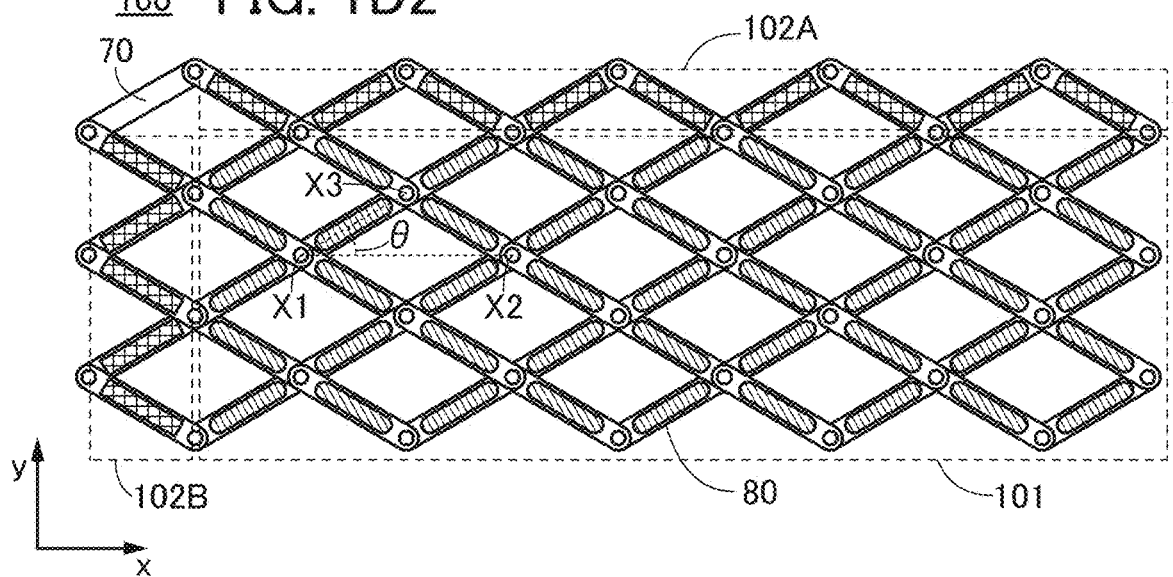

FIG. 8A
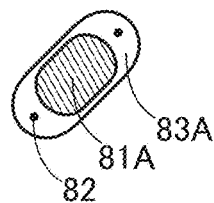
FIG. 8B
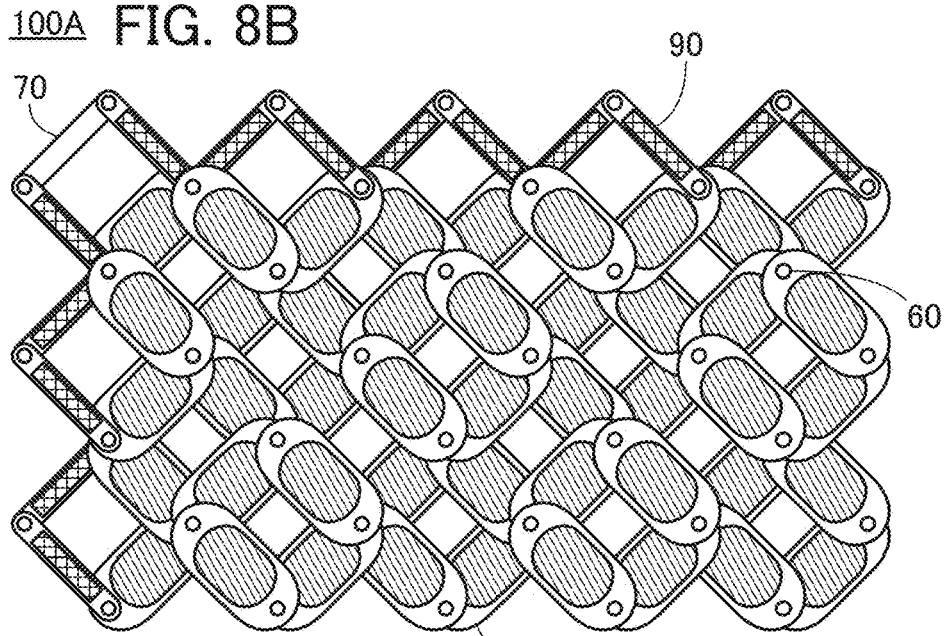
FIG. 8C1
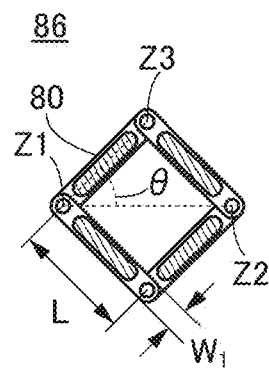
FIG. 8D1
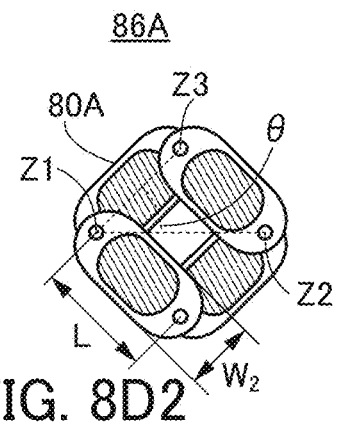
FIG. 8E
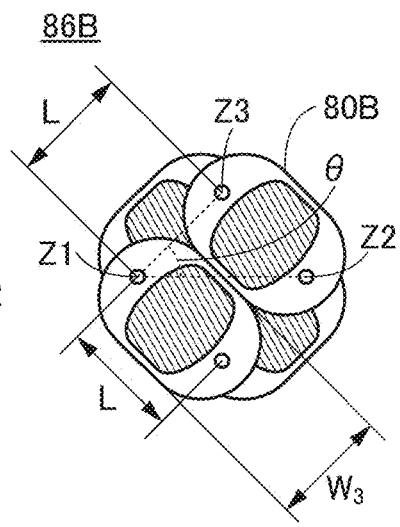
FIG. 8C2
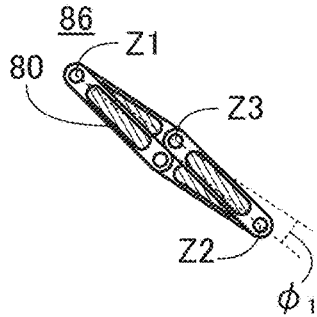
FIG. 8D2
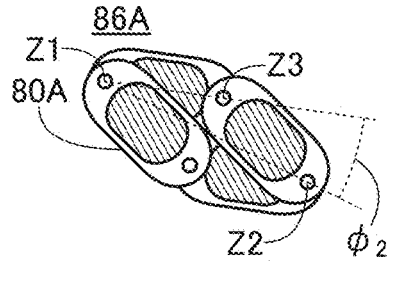

FIG. 10A1
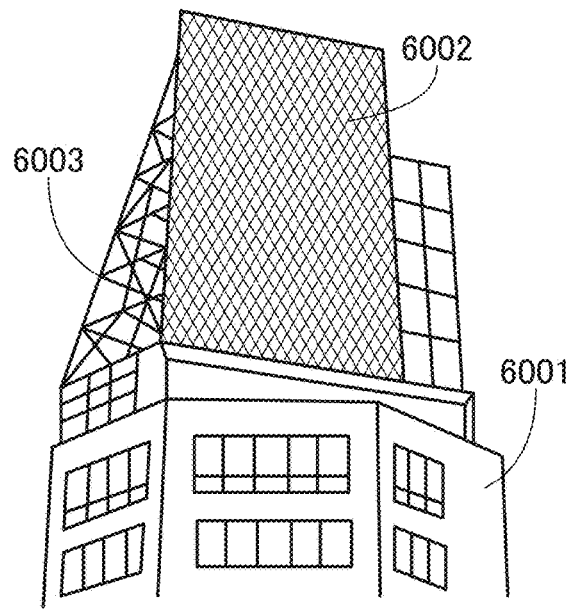
FIG. 10A2
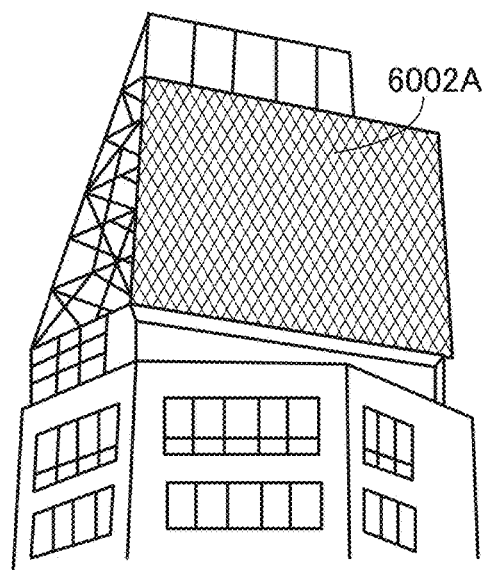
FIG. 10B1
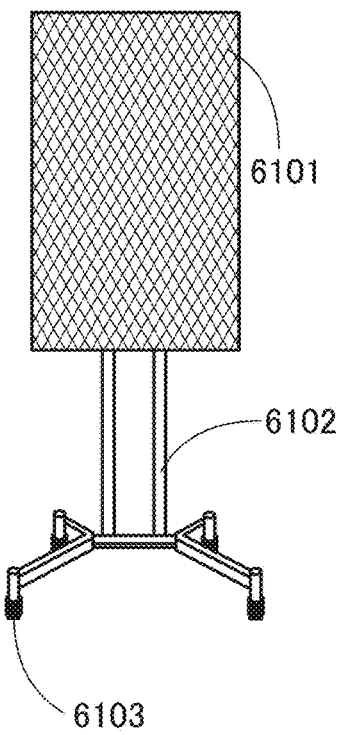
FIG. 10B2
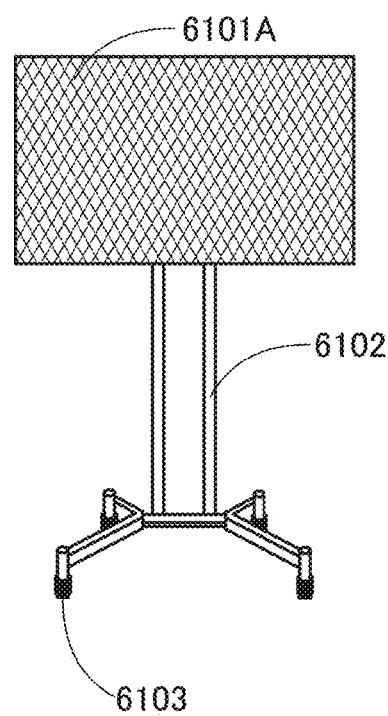

FIG. 12A
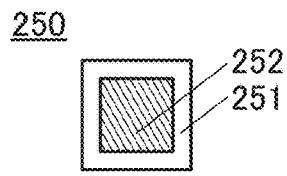
FIG. 12B1
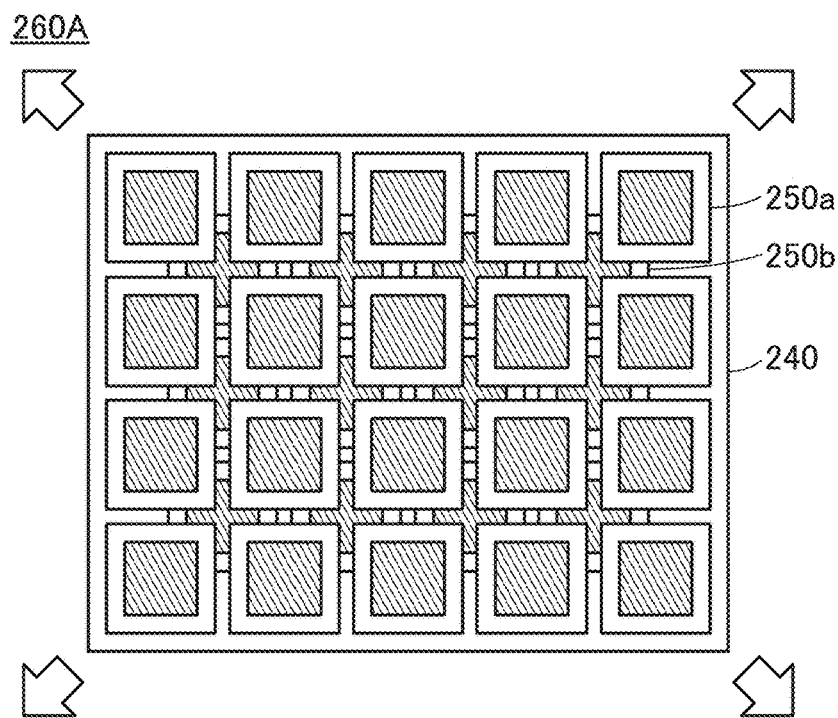
FIG. 12B2
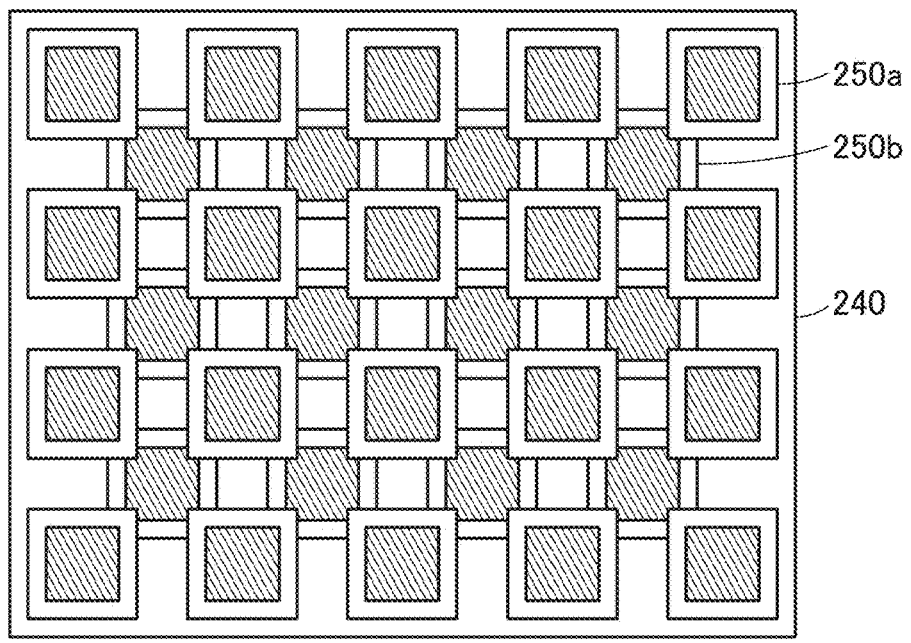

FIG. 13A1
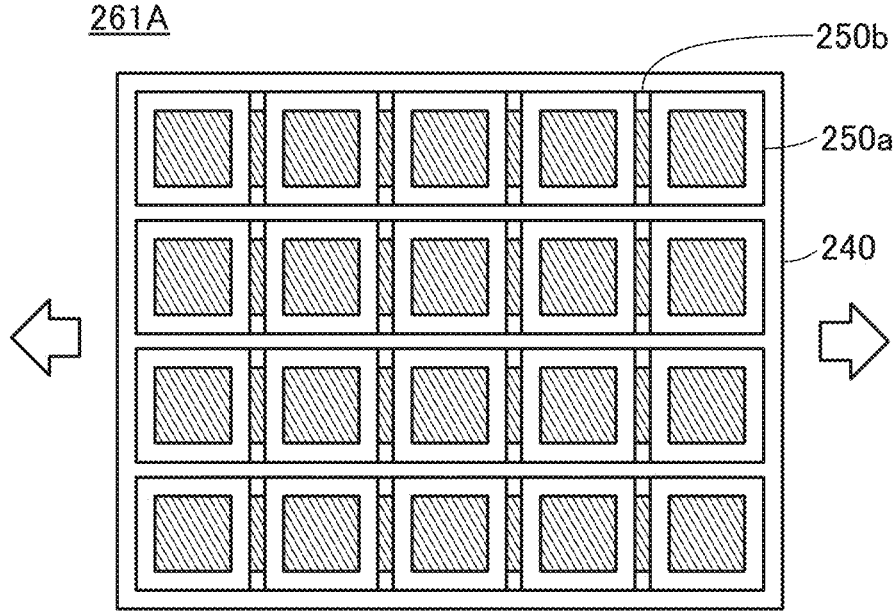
FIG. 13A2
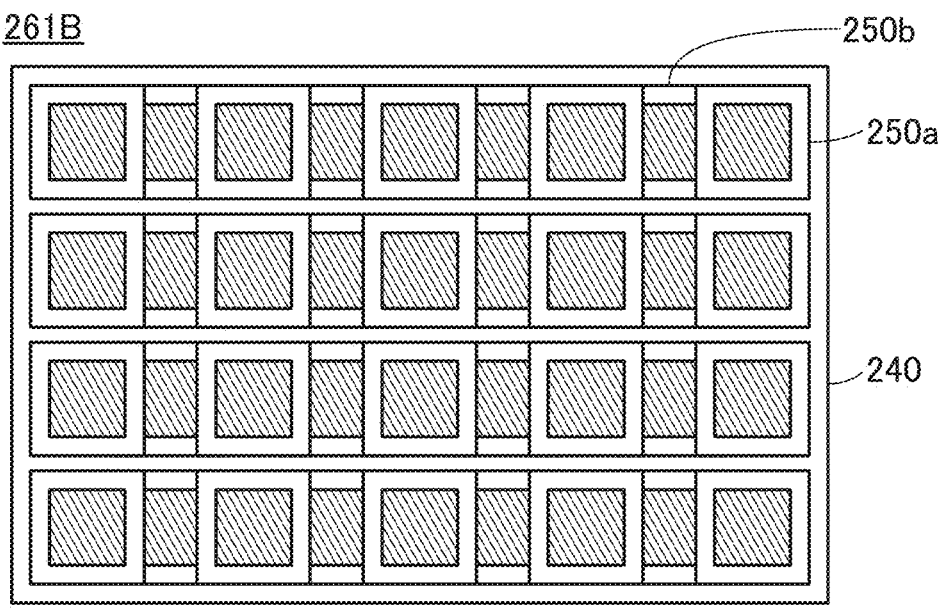

FIG. 14A
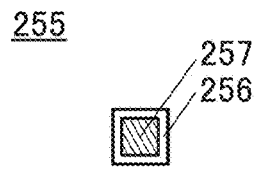
FIG. 14B1
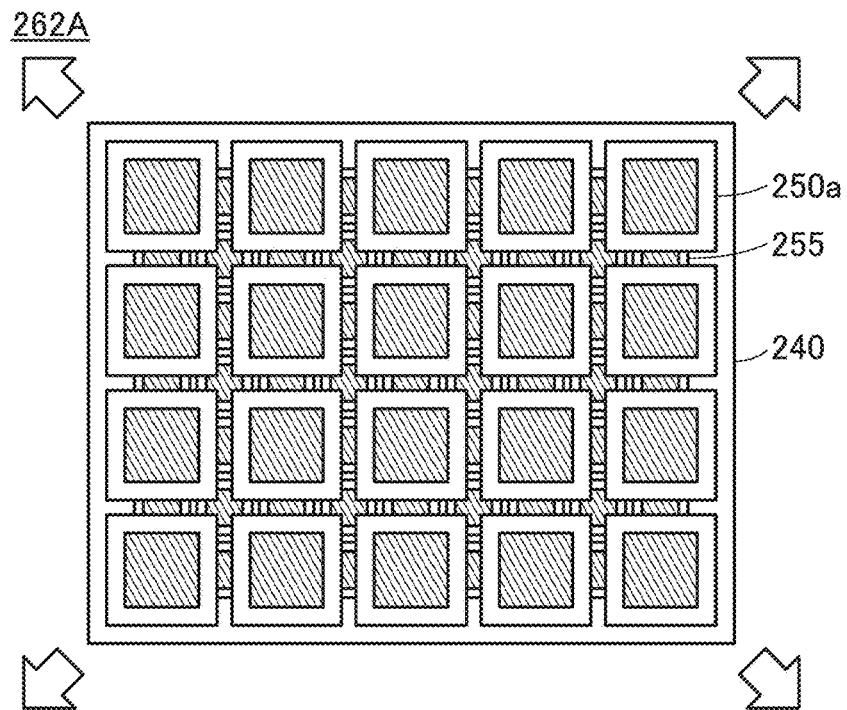
FIG. 14B2
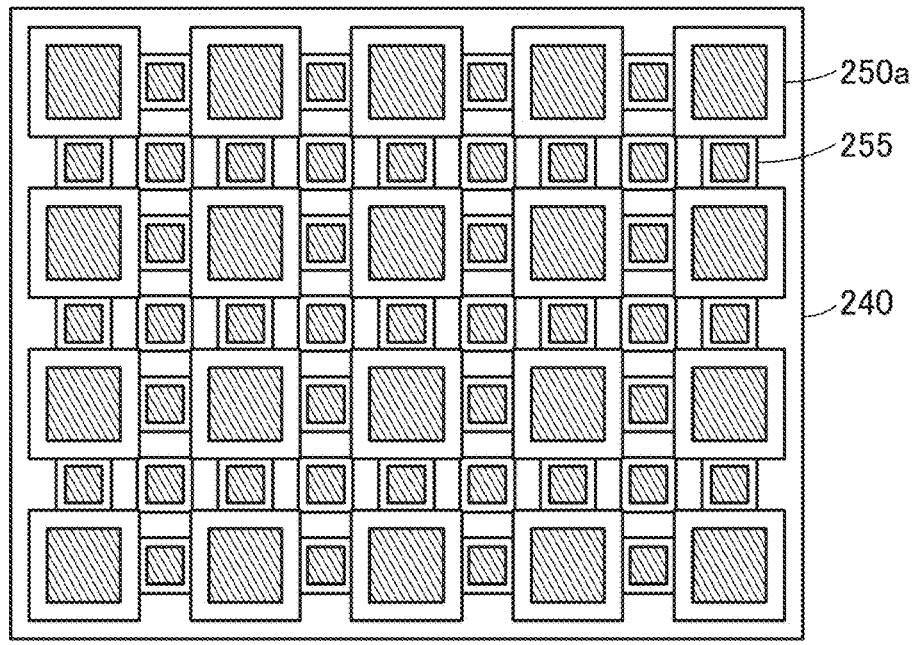

FIG. 15A
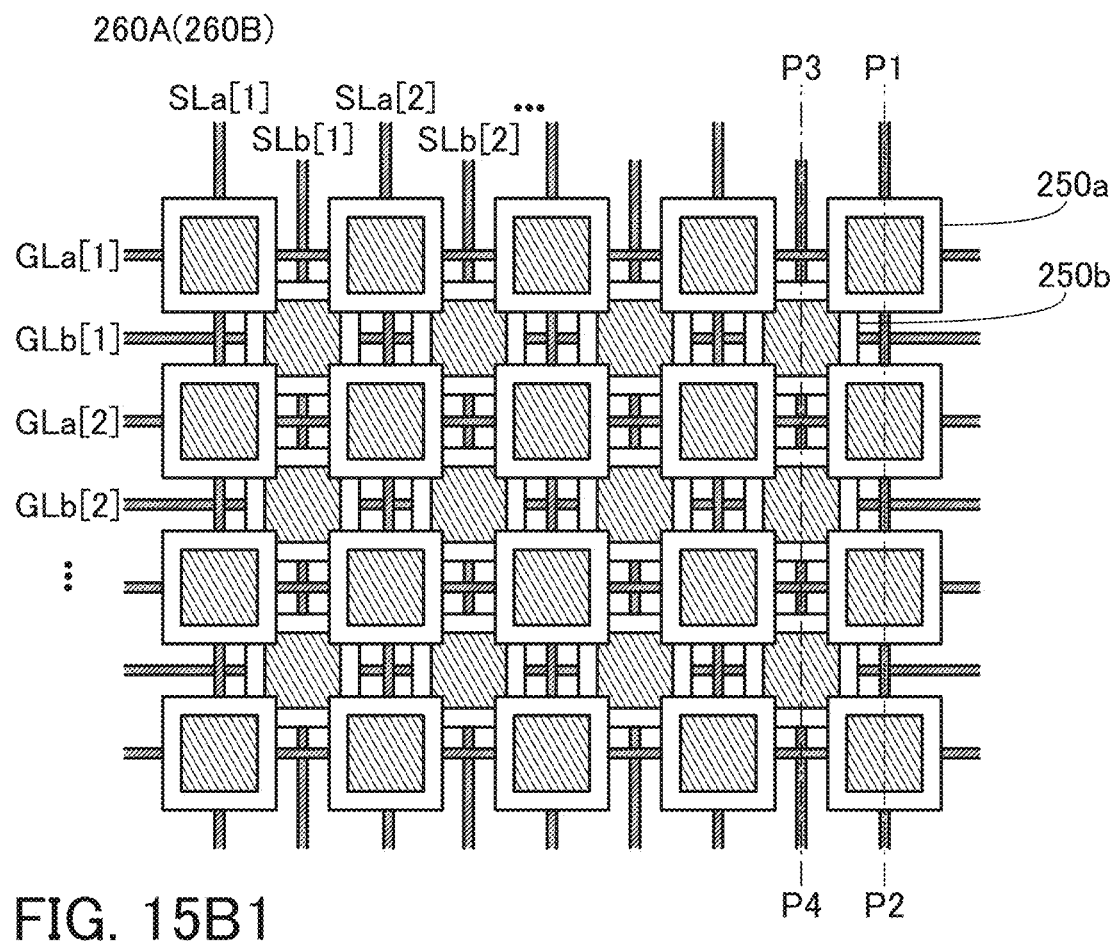
FIG. 15B1
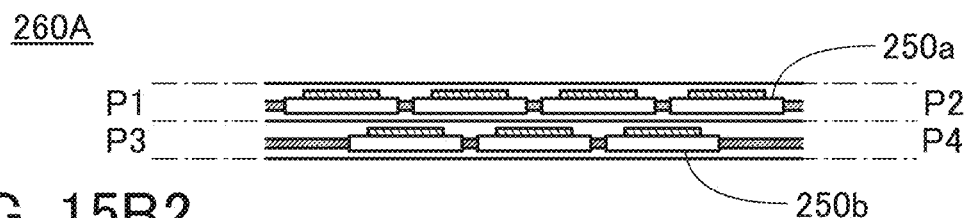
FIG. 15B2
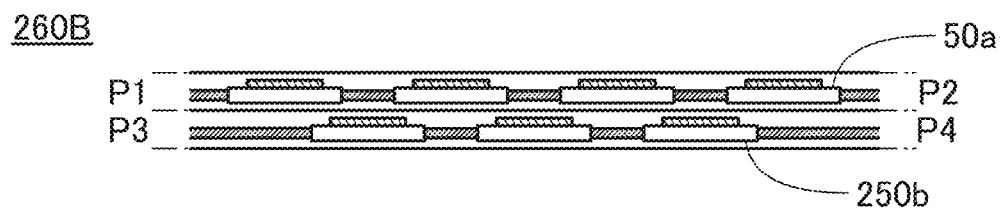

FIG. 16A
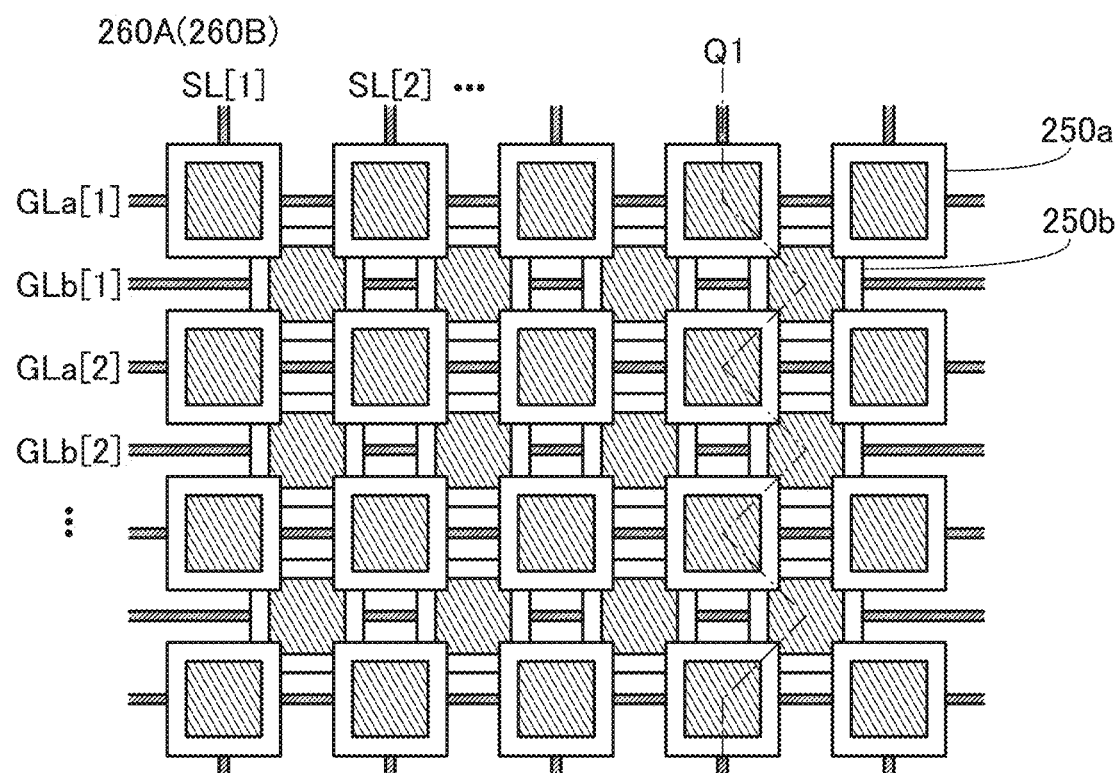
FIG. 16B1
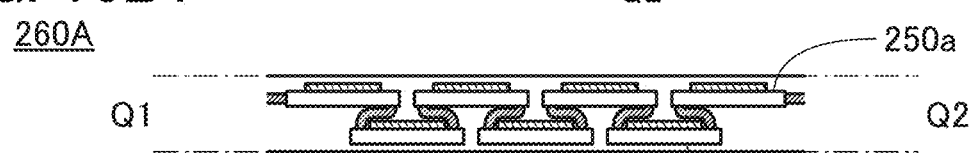
FIG. 16B2
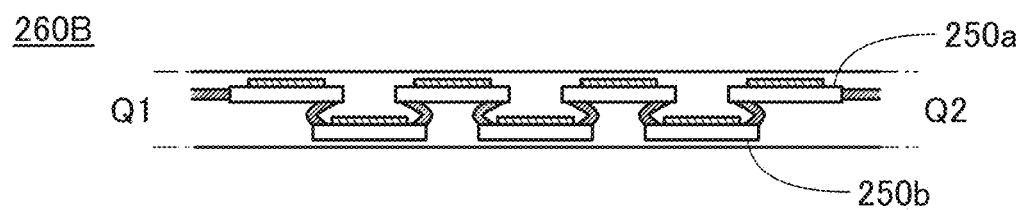

FIG. 18A
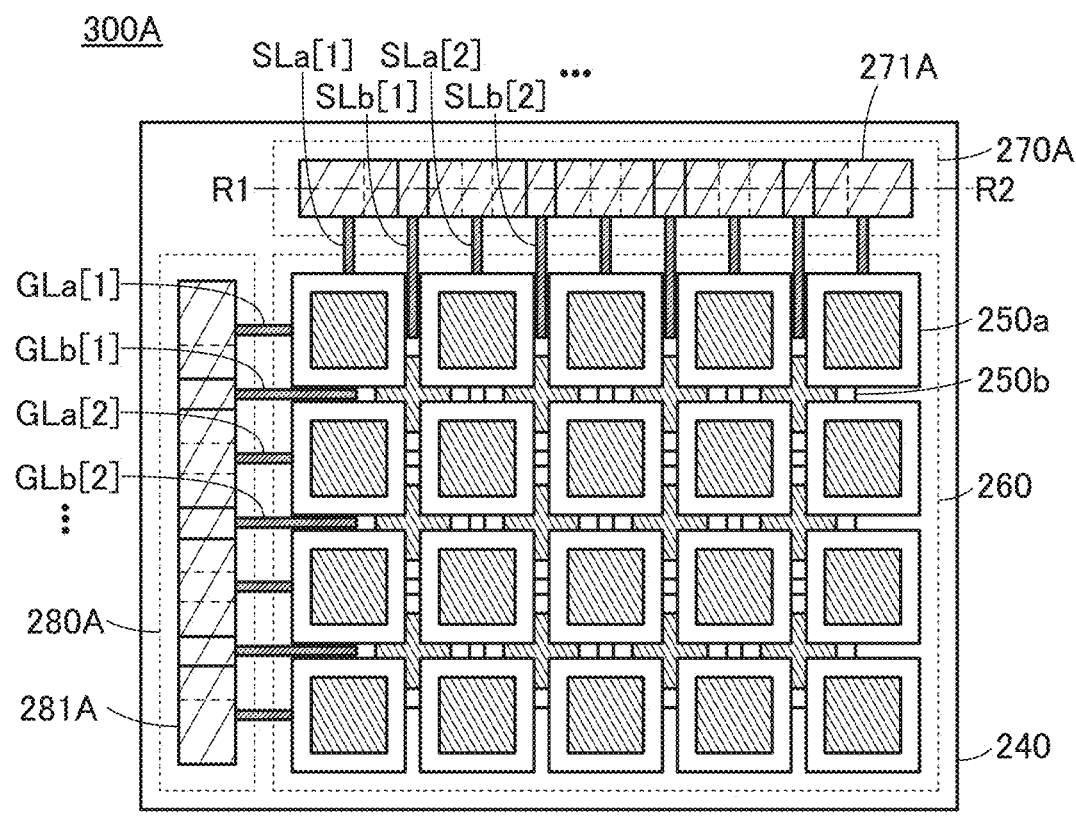
FIG. 18B1
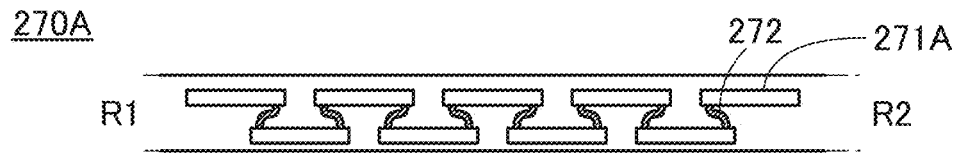
FIG. 18B2
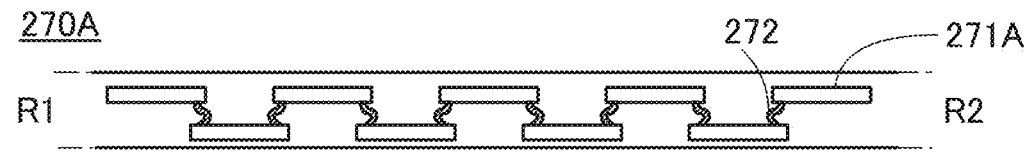

DISPLAY DEVICE AND ELECTRONIC DEVICE

TECHNICAL FIELD

The present invention relates to a display device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a system, a method for driving any of them, a method for manufacturing any of them, and a method for testing any of them.

BACKGROUND ART

In recent years, research and development have been extensively conducted on light-emitting elements utilizing electroluminescence (EL) used as display elements in a display region of a display device. As a basic structure of these light-emitting elements, a layer containing a light-emitting substance is provided between a pair of electrodes. Voltage is applied to the light-emitting element to obtain light emission from the light-emitting substance.

The light-emitting element is a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the light-emitting elements can have flexibility; therefore, the use of a flexible substrate for the display device has been considered.

As a method for manufacturing a display device using a flexible substrate, a technique has been developed in which an oxide layer and a metal layer are formed between a substrate and a semiconductor element, the substrate is separated by utilizing weak adhesion of an interface between the oxide layer and the metal layer, and then the semiconductor element is transferred to another substrate (e.g., a flexible substrate) (Patent Document 1).

In some cases, over a light-emitting element that has been formed over a flexible substrate, another flexible substrate is provided in order to protect a surface of the light-emitting element or prevent entry of moisture or impurities from the outside.

The display device including a flexible substrate can be flexible. Thus, the substrate is preferably formed using a material with low elasticity, high degree of extensibility in stretching, high restorability after the stretch, and the like. Patent Document 2 discloses a structure body for electronics including a resin composition with high tensile stress relaxivity and excellent restorability after the stretch.

REFERENCES

Patent Document

[Patent Document 1] Japanese Published Patent Application No. 2003-174153

[Patent Document 2] Japanese Published Patent Application No. 2016-102669.

DISCLOSURE OF INVENTION

In the case of a display device including a light-emitting element over a flexible substrate, the display device can be stretched in some cases depending on the material of the substrate. When the display device is stretched, the display device can be made to have a size different from a standard size in some cases.

However, there is a limit on the degree of elasticity of the flexible substrate; thus, excessive stretch might cause damage to the substrate. Even when the substrate is not damaged, a light-emitting element, a circuit element, a wiring, and the like provided over the substrate might be damaged.

Stretching the display device including the flexible substrate might lead to a decrease in the intensity of light emitted from each unit area of the display device. This is because the number of pixels per unit area (also referred to as resolution in some cases) of the stretched display device decreases. Thus, when the stretched display device is used, the quality of an image displayed on the display device is reduced in some cases.

An object of one embodiment of the present invention is to provide a novel display device that can be changed in shape. Another object of one embodiment of the present invention is to provide a novel display device having high display quality even with a change in its shape. Another object of one embodiment of the present invention is to provide an electronic device including the above-described display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a display device whose aspect ratio can be changed. The display device includes a display region including a first unit and a second unit. The first unit and the second unit each include a light-emitting portion and a connection region. The connection region of the first unit is electrically connected to the connection region of the second unit. The display region has a function of changing an angle between the first unit and the second unit.

(2) Another embodiment of the present invention is the display device according to (1), including a driver region. The driver region includes a third unit. The third unit includes a driver circuit portion. The driver circuit portion has a function of driving the light-emitting portion of the first unit and the light-emitting portion of the second unit. The third unit of the driver region is parallel to one of the first unit and the second unit.

(3) Another embodiment of the present invention is the display device according to (1) or (2) in which a length in a first direction of the first unit is longer than a length in a second direction of the first unit.

(4) Another embodiment of the present invention is a display device whose aspect ratio can be changed. The display device includes a display region and a driver region. The display region includes a plurality of first units. The driver region includes a plurality of second units. The plurality of first units each include a connection region, and the plurality of second units each include a connection region. Some connection regions of the plurality of first units are electrically connected to some connection regions of the plurality of second units. The plurality of first units of the display region are parallel to each other. The plurality of second units of the driver region are parallel to each other. An angle between one first unit and one second unit which is connected to the first unit can be changed.

(5) Another embodiment of the present invention is the display device according to (4) in which the plurality of first units each include a light-emitting portion. At least one of the plurality of first units includes a driver circuit portion. The plurality of second units each include a driver circuit portion. At least one of the plurality of second units includes a light-emitting portion.

(6) Another embodiment of the present invention is a display device whose aspect ratio can be changed. The display device includes a display region. The display region includes a first unit and a second unit. The first unit and the second unit each include a light-emitting portion. The second unit overlaps with a first region of the first unit. The display region has a function of changing an area of the first region.

(7) Another embodiment of the present invention is the display device according to (6), including a driver region. The driver region includes a third unit and a fourth unit. The third unit has a function of driving the light-emitting portion of the first unit. The fourth unit has a function of driving the light-emitting portion of the second unit. The fourth unit overlaps with a first region of the third unit. The driver region has a function of changing an area of the first region of the third unit.

(8) Another embodiment of the present invention is the display device according to (7), including a first insulator and a second insulator. The first unit and the third unit are each covered with the first insulator. The second unit and the fourth unit are each covered with the second insulator. The second insulator is positioned over the first insulator. The first insulator and the second insulator have elasticity.

(9) Another embodiment of the present invention is the display device according to (6), including a third unit and a first insulator. The third unit has a function of driving the light-emitting portions of the first unit and the second unit. The first unit, the second unit, and the third unit are each covered with the first insulator. The first insulator has elasticity.

(10) Another embodiment of the present invention is the display device according to any one of (1) to (3) and (5) to (9), in which the light-emitting portions each include a light-emitting element.

(11) Another embodiment of the present invention is an electronic device including the display device according to any one of (1) to (10).

According to one embodiment of the present invention, a novel display device that can be changed in shape can be provided. According to another embodiment of the present invention, a novel display device having high display quality even with a change in its shape can be provided. According to another embodiment of the present invention, an electronic device including the above-described display device can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

In the accompanying drawings:

FIGS. 1A, 1B, 1C, 1D1, and 1D2 illustrate examples of display devices;

FIGS. 8A, 8B, 8C1, 8C2, 8D1, 8D2, and 8E illustrate examples of display devices;

FIGS. 10A1, 10A2, 10B1, and 10B2 illustrate examples of electronic devices;

FIGS. 12A, 12B1, and 12B2 are schematic views illustrating examples of display regions;

FIGS. 13A1 and 13A2 are each a schematic view illustrating an example of a display region;

FIGS. 14A, 14B1, and 14B2 are schematic views illustrating examples of display regions;

FIGS. 15, 5B1, and 15B2 are a schematic view and cross-sectional views illustrating examples of display regions;

FIGS. 16A, 16B1, and 16B2 are a schematic view and cross-sectional views illustrating examples of display regions;

FIGS. 18A, 18B1, and 18B2 are a schematic view and cross-sectional views illustrating examples of display devices;

Figure 1A:
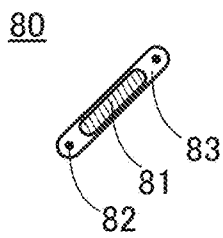

BEST MODE FOR CARRYING OUT THE INVENTION (Notes on the Description in this Specification and the Like)

First, notes on the description of structures in the following embodiments and example are described.

<Notes on One Embodiment of the Present Invention Described in Embodiments and Example>

One embodiment of the present invention can be constituted by appropriately combining the structure described in an embodiment with any of the structures described in the other embodiments and Example. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment and example, a content described in the embodiment and example is a content described with reference to a variety of diagrams or a content described with text in the specification.

Note that by combining a diagram (or part thereof) described in one embodiment or one example with another part of the diagram, a different diagram (or part thereof) described in the embodiment or example, and/or a diagram (or part thereof) described in another embodiment, other embodiments, or an example, much more diagrams can be formed.

<Notes on Ordinal Numbers>

In this specification and the like, ordinal numbers such as first, second, and third are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

<Notes on the Description for Drawings>

Embodiments and Example are described with reference to drawings. However, the embodiments and the example can be implemented with various modes. It is readily appreciated by those skilled in the art that modes and details can be changed in various ways without departing from the spirit and scope of the present invention. Thus, the present invention should not be interpreted as being limited to the description of the embodiments and example. Note that in the structures of the invention in the embodiments and example, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

In this specification and the like, in the case where a transistor has two or more gates (this structure is referred to as a multi-gate structure in some cases), these gates are referred to as a first gate and a second gate in some cases. Note that a "bottom gate" is a terminal that is formed before a channel formation region in manufacture of a transistor, and a "top gate" is a terminal that is formed after a channel formation region in manufacture of a transistor.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term such as "signal line" or "power supply line" in some cases. The term such as "signal line" or "power supply line" can be changed into the term "wiring" in some cases. The term such as "power supply line" can be changed into the term such as "signal line" in some cases. The term such as "signal line" can be changed into the term such as "power supply line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

Definitions of the terms that will be mentioned in the following embodiments and example are described below.

«Impurity in Semiconductor»

An impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example.

When the semiconductor is an oxide semiconductor, oxygen vacancies may be formed by entry of impurities such as hydrogen, for example. Furthermore, when the semiconductor is a silicon layer, examples of an impurity that changes the characteristics of the semiconductor include oxygen, Group 1 elements except hydrogen, Group 2 elements, Group 13 elements, and Group 15 elements.

«Transistor»

In this specification, a transistor is an element having at least three terminals of a gate, a drain, and a source. The transistor has a channel formation region between the drain (a drain terminal, a drain region, or a drain electrode) and the source (a source terminal, a source region, or a source electrode). Voltage is applied between the gate and the source, whereby current can flow between the source and the drain.

Furthermore, functions of a source and a drain might be switched when a transistor of opposite polarity is employed or a direction of current flow is changed in circuit operation, for example. Therefore, the terms "source" and "drain" can be switched in this specification and the like.

«Switch»

In this specification and the like, a switch is conducting (on state) or not conducting (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

«Connection»

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is also possible.

Here, X, Y, and the like each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected when a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

«Parallel and Perpendicular»

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a display device disclosed in one embodiment of the present invention is described.

Structure Example

Figure 1B:
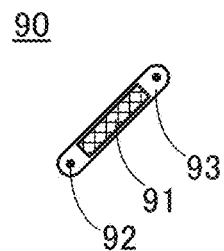
Figure 1C:
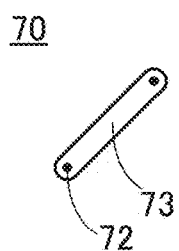

FIGS. 1A, 1B, and 1C illustrate a display unit, a driver circuit unit, and a support unit, respectively, that are included in the display device of one embodiment of the present invention. A display unit 80 illustrated in FIG. 1A includes a light-emitting portion 81, a connection region 82, and a support 83. A driver circuit unit 90 illustrated in FIG. 1B includes a driver circuit portion 91, a connection region 92, and a support 93. A support unit 70 illustrated in FIG. 1C includes a connection region 72 and a support 73.

The light-emitting portion 81 of the display unit 80 includes a light-emitting element and a pixel circuit. Examples of the light-emitting element include a transmissive liquid crystal element, an organic EL element, an inorganic EL element, and a nitride semiconductor light-emitting diode. Instead of the light-emitting element, a reflective liquid crystal element, an electrophoretic element, or the like can be used. The pixel circuit is a circuit for making the light-emitting element emit light. A terminal electrically connected to the circuit is included in the connection region 82.

Note that the light-emitting portion 81 may be a pixel including a plurality of light-emitting elements. For example, the plurality of light-emitting elements may emit light of three colors of red (R), green (G), and blue (B), or four colors of red (R), green (G), blue (B), and white (W). Alternatively, the plurality of light-emitting elements may emit light of some of red (R), green (G), blue (B), white (W), cyan (C), yellow (Y), magenta (M), and the like in combination as necessary. The light-emitting portion 81 of the display unit 80 is not necessarily the pixel including the plurality of light-emitting elements, and may be a subpixel including a light-emitting element emitting light of any one of the above colors, for example.

The driver circuit portion 91 of the driver circuit unit 90 has a function of driving the pixel circuit included in the display unit 80 to make the light-emitting element emit light. For the driver circuit portion 91, a source driver circuit, a gate driver circuit, or the like can be used. A terminal electrically connected to the driver circuit portion 91 is included in the connection region 92.

The connection regions 72, 82, and 92 are provided so that each unit can be electrically connected to other units. Note that a method for connecting the units to each other is described later.

FIG. 1D1 illustrates the display device of one embodiment of the present invention. A display device 100 is functionally divided into a display region 101, a driver region 102A, and a driver region 102B.

The display region 101 includes a plurality of display units 80. The driver region 102A includes a plurality of driver circuit units 90. The driver region 102B includes a plurality of driver circuit units 90 that are different from those in the driver region 102A. The display device 100 also includes the support unit 70. In FIGS. 1D1 and 1D2, the support unit 70 is not included in the display region 101, the driver region 102A, nor the driver region 102B.

The units are connected to each other with a shaft 60 passing through the connection regions of the units. Thus, the units include openings for the shaft 60 in the connection regions. For example, in a region 105a, one shaft 60 passes through the connection regions 82 of four display units 80, whereby the four display units 80 are connected to one another. For another example, in a region 105b, one shaft 60 passes through the connection regions 82 of two display units 80 and the connection regions 92 of two driver circuit units 90, whereby the two display units 80 and the two driver circuit units 90 are connected to one another. Note that the shaft 60 is a structure body for electrically connecting the units to each other; the details of the shaft 60 are described later.

As described above, for the driver circuit portion 91 included in the driver circuit unit 90, a source driver circuit, a gate driver circuit, or the like can be used. Thus, the plurality of driver circuit units 90 included in the driver region 102A can constitute one of the source driver circuit and the gate driver circuit by being electrically connected to each other with the shaft 60. In addition, the plurality of driver circuit units 90 included in the driver region 102B can constitute the other of the source driver circuit and the gate driver circuit by being electrically connected to each other with the shaft 60.

The support unit 70 has a function of maintaining the structure of the display device 100. In FIG. 1D1, one of the connection regions 72 of the support unit 70 is connected to the connection region 92 of the driver circuit unit 90 in the driver region 102A with the shaft 60, and the other of the connection regions 72 of the support unit 70 is connected to the connection region 92 of the driver circuit unit 90 in the driver region 102B with the shaft 60. Note that the support unit 70 may be provided with a wiring, a circuit, an element, or the like. In that case, the connection region 72 of the support unit 70 is electrically connected to the connection region 92 of the driver circuit unit 90 with the shaft 60. In the case where the display device 100 does not need the support unit 70, the support unit 70 may be omitted from the components of the display device 100.

Note that the display unit, the driver circuit unit, and the support unit are each rotatable on the shaft 60 in the connection region. For example, although an angle θ between the dotted line X1-X2 and the dotted line X1-X3 is 45° in the display device 100 in FIG. 1D1, the units may be rotated until the angle θ becomes 30° to change the shape of the display device 100 as illustrated in FIG. 1D2. In that case, the display device 100 in FIG. 1D1 is stretched by approximately 1.2 times in the x direction and approximately 0.71 times in the y direction to have the shape in FIG. 1D2. That is, by changing the angle θ, the aspect ratio of the display device 100 can be changed. In the case where the display device 100 is stretched as much as possible, the display device 100 is configured so that the units are movable in the range of the angle θ of approximately 10° to 80°. Depending on the shape of the display unit 80, the range of the angle θ becomes narrower than or wider than the above-described range of 10° to 80°.

Note that because of the structure of the display device 100, some of the plurality of driver circuit units 90 included in the driver region 102A and the driver region 102B are parallel to some of the display units 80 included in the display region 101.

As described above, the display device 100 in FIG. 1D1 that is formed using the plurality of display units 80, the plurality of driver circuit units 90, and the support unit 70 can be a stretchable display device.

<Configuration Method>

Next, a method for connecting the units to each other to form the display device 100 in FIG. 1D1 is described.

Figure 2A:
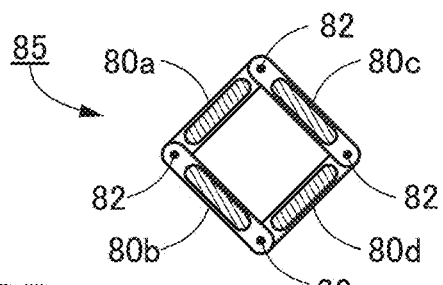
FIGS. 2A to 2C illustrate an example of constituting the display device in FIGS. 1D1 and 1D2.
Figure 2B:
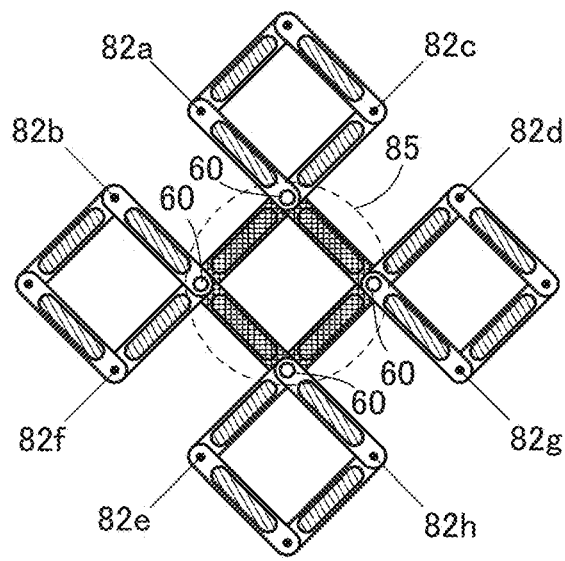
Figure 2C:
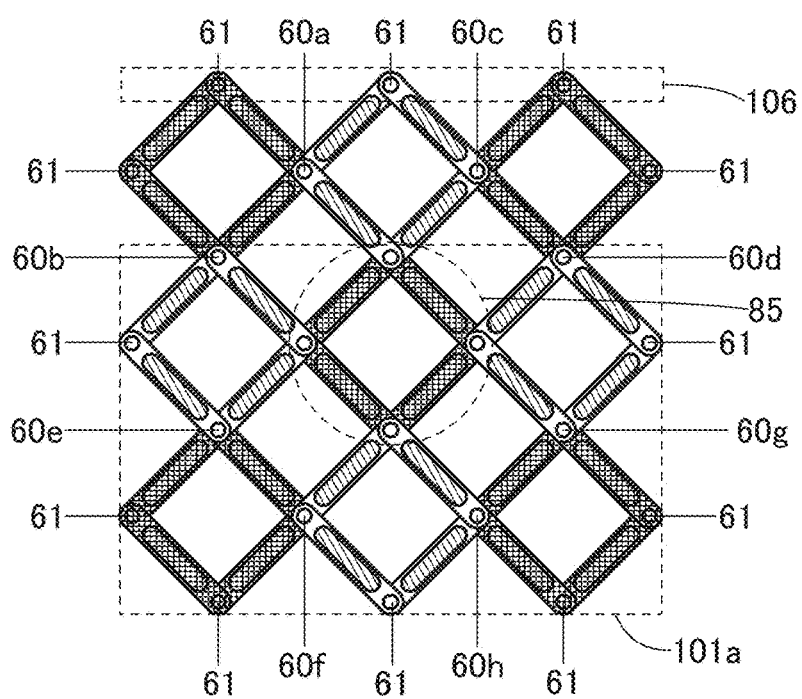

FIGS. 2A to 2C illustrate an example of the method for connecting the units to each other. Only the display unit 80 is described in this example; however, depending on circumstances or conditions or as needed, the display unit may be replaced with the driver circuit unit or the support unit.

[Step 1]

FIG. 2A illustrates a display unit group 85 combining four display units 80 (display units 80a, 80b, 80c, and 80d). The display unit 80a includes a region where one of the two connection regions 82 of the display unit 80a overlaps with one of the two connection regions 82 of the display unit 80b, and a region where the other of the two connection regions 82 of the display unit 80a overlaps with one of the two connection regions 82 of the display unit 80c. The display unit 80d includes a region where one of the two connection regions 82 of the display unit 80d overlaps with the other of the two connection regions 82 of the display unit 80b, and a region where the other of the two connection regions 82 of the display unit 80d overlaps with the other of the two connection regions 82 of the display unit 80c. Note that in the display unit group 85 in FIGS. 2A to 2C, the display unit 80a and the display unit 80d are provided on the lower side, and the display unit 80b and the display unit 80c are provided on the upper side.

[Step 2]

Next, four display unit groups 85 are provided so that the connection regions 82 of the four display unit groups 85 overlap with the connection regions 82 of the display unit group 85 in FIG. 2A (see FIG. 2B). Then, the shafts 60 are provided in the overlapping connection regions 82 to connect four display units to each other. In order to avoid complexity of description, the display unit group 85 in FIG. 2A is indicated by a different hatching pattern from the other display unit groups 85 in FIG. 2B.

[Step 3]

After that, another four display unit groups 85 are provided under connection regions 82a, 82b, 82c, 82d, 82e, 82f, 82g, and 82h in FIG. 2B and electrically connected to the connection regions with the shafts 60. Specifically, one of the four display unit groups 85 is provided under the connection regions 82a and 82b and electrically connected thereto with shafts 60a and 60b; one of the remaining three display unit groups 85 is provided under the connection regions 82c and 82d and electrically connected thereto with shafts 60c and 60d; one of the remaining two display unit groups 85 is provided under the connection regions 82e and 82f and electrically connected thereto with shafts 60e and 60f; and the remaining display unit group 85 is provided under the connection regions 82g and 82h and electrically connected thereto with shafts 60g and 60h (see FIG. 2C). Note that in order to avoid complexity of description, in FIG. 2C, the display unit group 85 in FIG. 2A and the display unit groups 85 newly electrically connected to the connection regions in Step 3 are indicated by different hatching patterns from the other display unit groups 85. That is, in FIG. 2C, the hatching patterns of the display unit groups 85 on the upper side are not changed, whereas the hatching patterns of the display unit groups 85 on the lower side are changed.

As described above, the display device can be configured by connecting the adjacent display unit groups 85 to each other so that one of them is positioned on the upper side and the other is positioned on the lower side.

Note that in the case where no display unit groups 85 are provided adjacent to the display unit groups 85 (e.g., when no display unit groups 85 are newly provided in a region 106 in FIG. 2C), the display units are electrically connected to each other with shafts 61 passing through the connection regions 82 in the region 106. For another example, when no display unit groups 85 are provided adjacent to the display unit groups 85 in a region other than the region 106, the display units are electrically connected to each other with the shafts 61 passing through the connection regions in the region.

Next, a cross section of the display device formed by the above-described method is described.

Figure 3A:
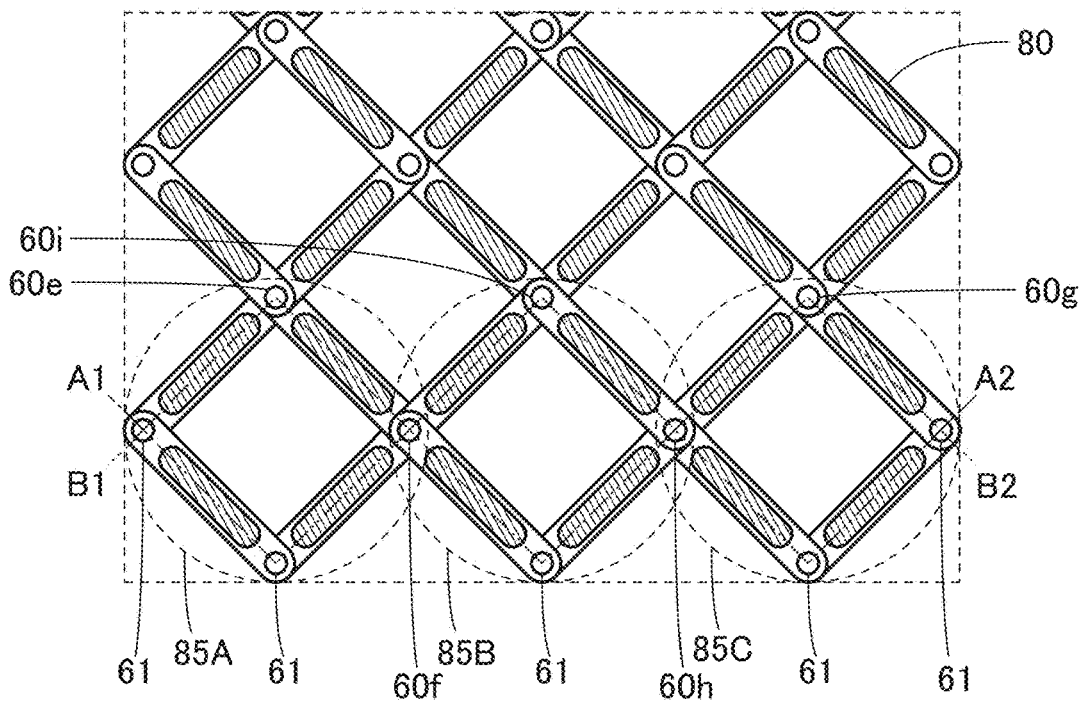
FIGS. 3A to 3C are a top view and cross-sectional views of part of a display device.
Figure 3B:
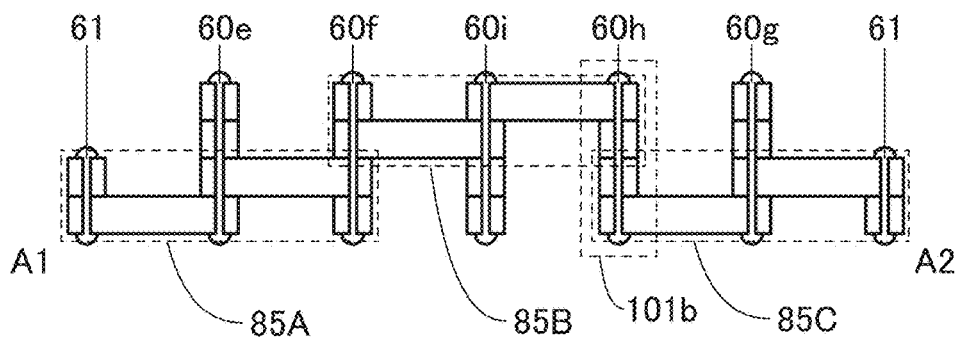
Figure 3C:
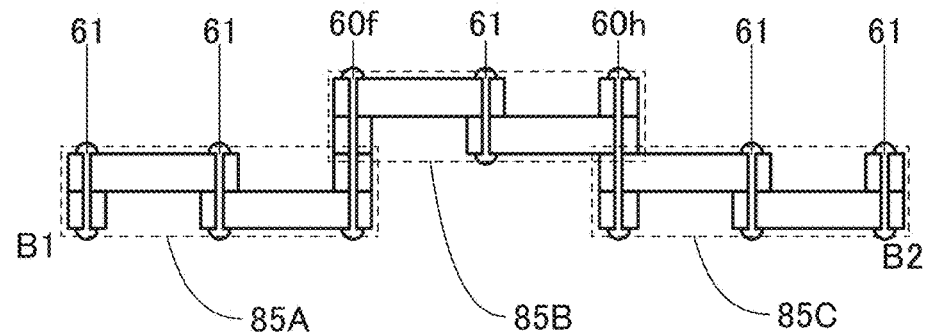

FIG. 3A illustrates a region 101a in FIG. 2C. FIG. 3B is a cross-sectional view taken along the dashed-dotted line A1-A2 in FIG. 3A, and FIG. 3C is a cross-sectional view taken along the dashed-two dotted line B1-B2 in FIG. 3A. The shafts 60e to 60h, a shaft 60i, and the shafts 61 that have a function of connecting the display units 80 to each other are also illustrated in FIGS. 3B and 3C.

In the region 101a, display unit groups 85A, 85B, and 85C are electrically connected to each other so that the display unit group 85B is positioned on the upper side and the display unit groups 85A and 85C are positioned on the lower side. As illustrated in FIGS. 3B and 3C, the display unit group 85B is positioned above the display unit groups 85A and 85C.

Next, the shafts 60e to 60i (collectively referred to as the shaft 60) and a method for electrically connecting the shaft 60 to the display units 80 are described. Here, a region 101b and the shaft 60h in FIG. 3B are described in detail, for example. In the following detailed description, the shaft 60h can be replaced by the shaft 60e, 60f, 60g, or 60i, for example. For the shafts 61, refer to the following description of the shaft 60h.

Figure 4A:
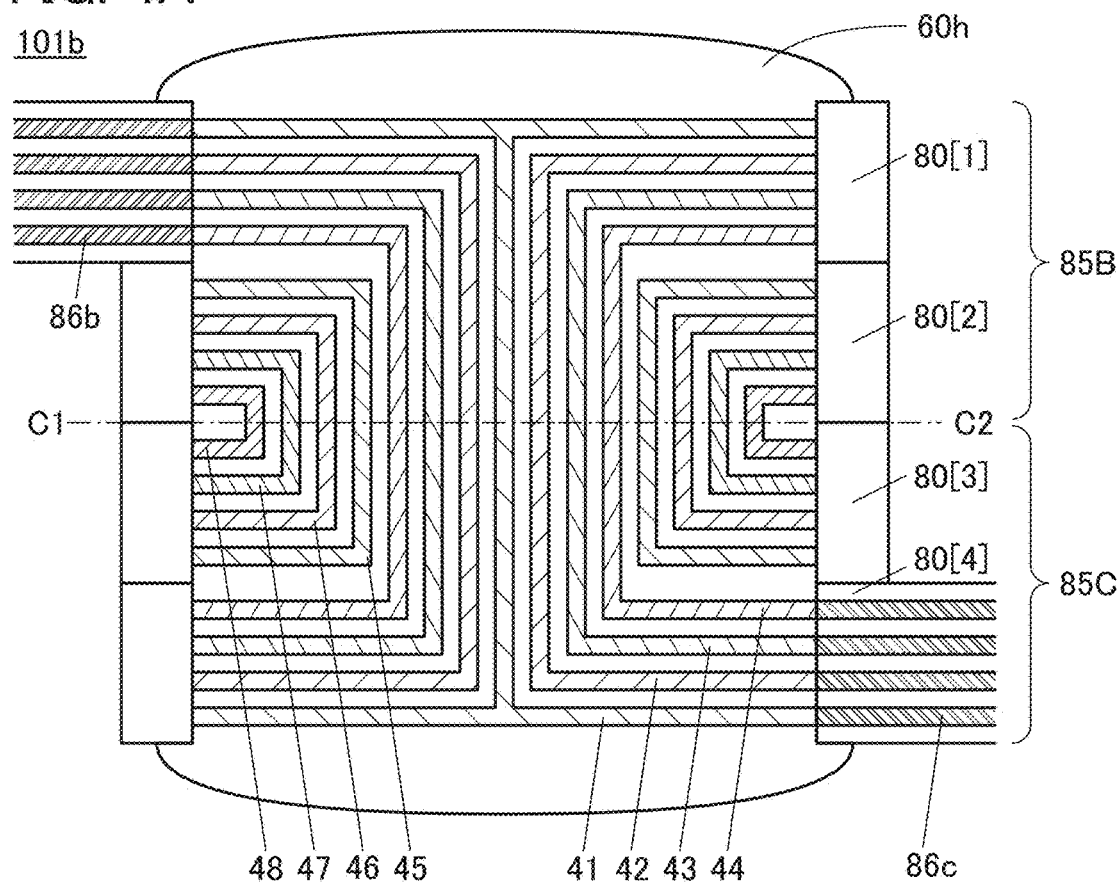
FIGS. 4A and 4B are cross-sectional views illustrating an example of a shaft.
Figure 4B:
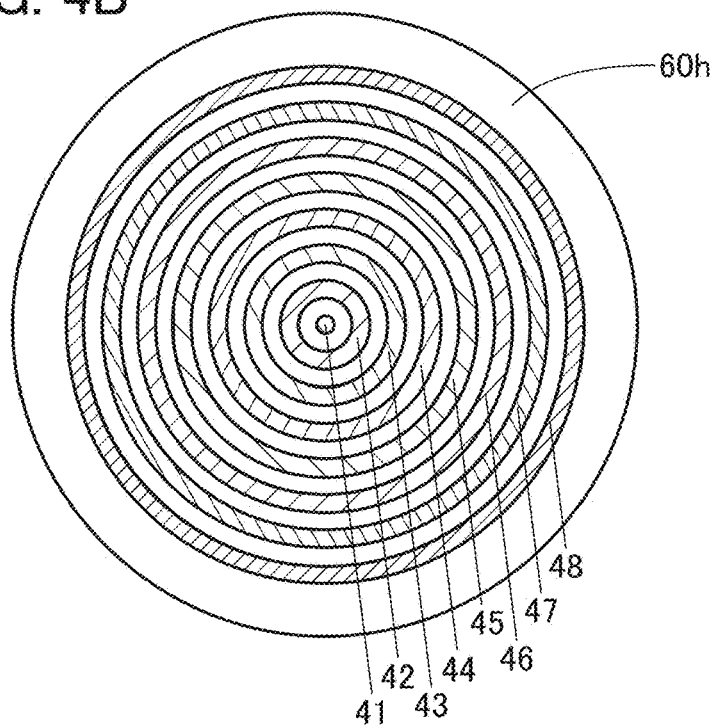

FIG. 4A illustrates the details of the region 101b. FIG. 4B is a cross-sectional view of the shaft 60h taken along the dashed-dotted line C1-C2 in FIG. 4A.

The display unit group 85B includes a display unit 80[1] and a display unit 80[2]. The display unit group 85C includes a display unit 80[3] and a display unit 80[4]. In FIG. 4A, the display unit 80[1] includes wirings 86b, and the display unit 80[4] includes wirings 86c. The wirings 86b are electrically connected to respective conductors 41 to 44. The wirings 86c are electrically connected to the respective conductors 41 to 44.

The shaft 60h includes the conductors 41 to 44 and conductors 45 to 48.

In the cross-sectional view in FIG. 4B, the conductor 41 is positioned in the center of the shaft 60h. The conductors 42 to 48 are positioned concentrically around the conductor 41 (the center of the shaft 60h).

Figure 5A:
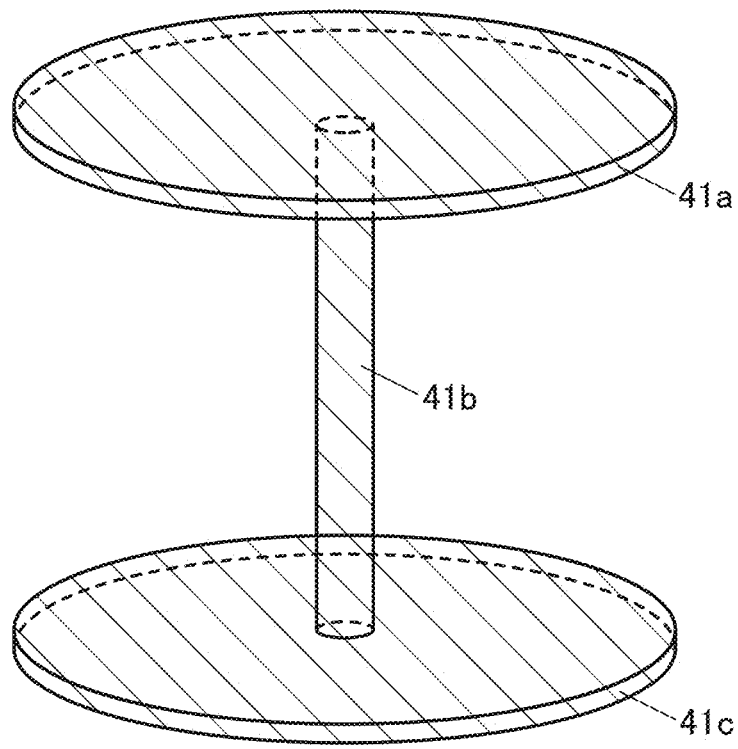
FIGS. 5A and 5B are each a perspective view illustrating an example of a conductor included in a shaft.

The conductor 41 has a structure illustrated in a perspective view in FIG. 5A. The conductor 41 includes a disk 41a, a column 41b, and a disk 41c. The column 41b is provided on the center portions of the disks 41a and 41c. One of the wirings 86b is electrically connected to the conductor 41 by contact with a side surface of the disk 41a. One of the wirings 86c is electrically connected to the conductor 41 by contact with a side surface of the disk 41c.

Figure 5B:
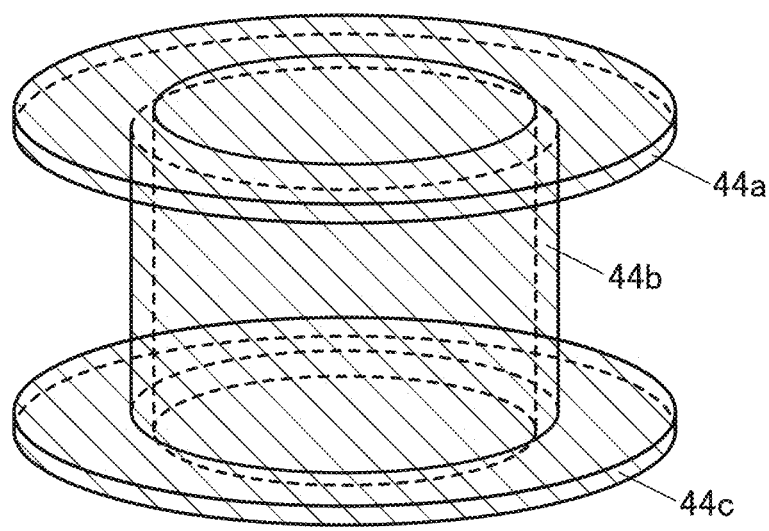

The conductor 44 has a structure illustrated in a perspective view in FIG. 5B. The conductor 44 includes a disk 44a having a circular hole, a hollow cylinder 44b, and a disk 44c having a circular hole. The circular hole of the disk 44a, the circular hole of the disk 44c, and the hollow of the cylinder 44b have the same size. The disk 44c is provided on the bottom base of the cylinder 44b so that the circular hole of the disk 44c is aligned with the hollow of the cylinder 44b. The disk 44a is provided on the upper base of the cylinder 44b so that the circular hole of the disk 44a is aligned with the hollow of the cylinder 44b. One of the wirings 86b is electrically connected to the conductor 44 by contact with a side surface of the disk 44a. One of the wirings 86c is electrically connected to the conductor 44 by contact with a side surface of the disk 44c.

For the structures of the conductors 42, 43, and 45 to 48, refer to the description of the conductor 44.

In FIG. 4A, the conductor 42 has a function of electrically connecting one of the wirings 86b to one of the wirings 86c. The conductor 43 has a function of electrically connecting another one of the wirings 86b to another one of the wirings 86c. Although not illustrated, the conductors 45 to 48 have functions of electrically connecting wirings included in the display unit 80[2] to wirings included in the display unit 80[3].

When the conductors included in the shaft 60 have the structures illustrated in FIGS. 4A and 4B and FIGS. 5A and 5B, the units can be electrically connected to each other with the shaft 60.

Figure 6:
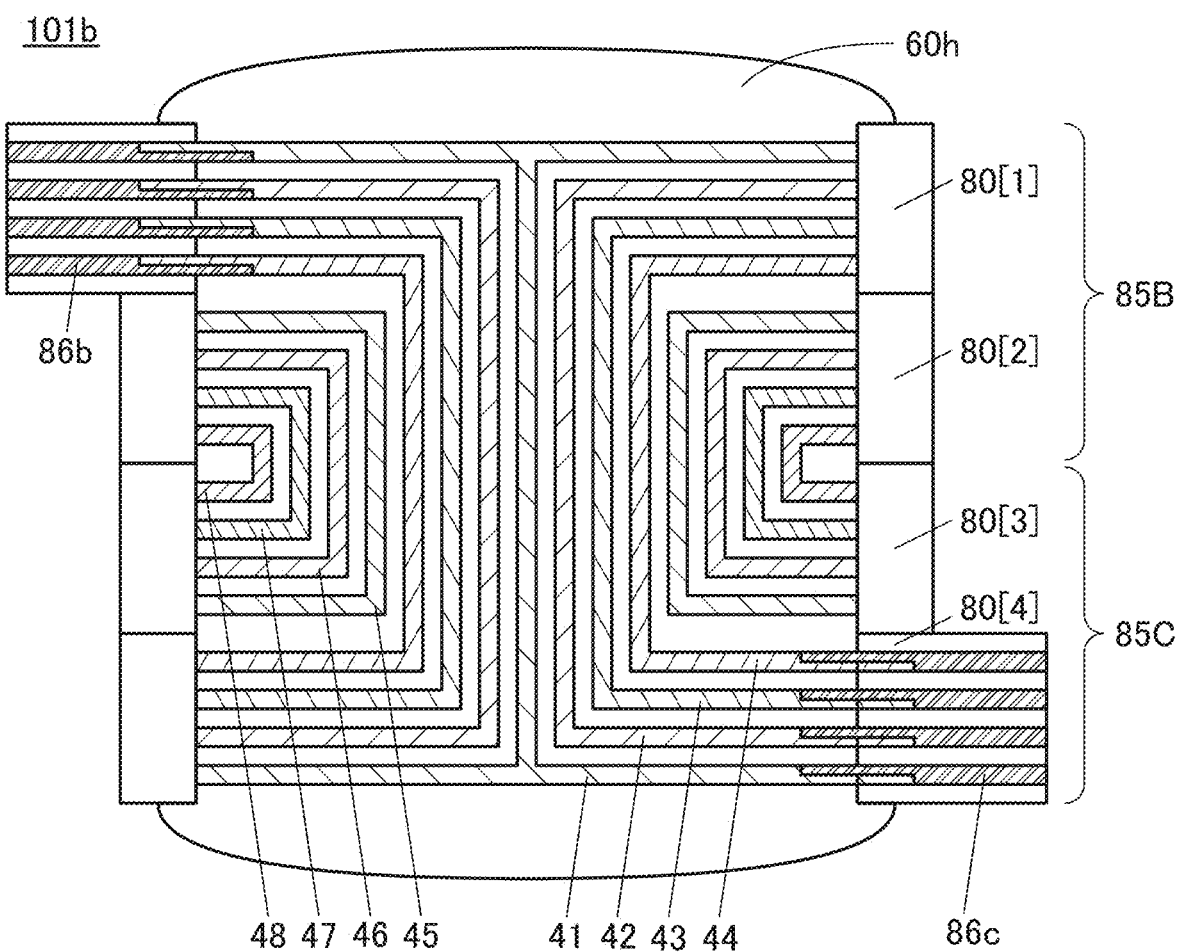
FIG. 6 is a cross-sectional view illustrating an example of a shaft.

FIGS. 4A and 4B illustrate one example of the structure of the shaft 60h, and one embodiment of the present invention is not limited to this example. For example, the shaft 60h may have a structure in FIG. 6 instead of the structure in FIGS. 4A and 4B. In the structure illustrated in FIG. 6, the wirings 86b are in contact with the respective conductors 41 to 44, and the wirings 86c are in contact with the respective conductors 41 to 44. Similarly, the wirings included in the display unit 80[2] are in contact with the respective conductors 45 to 48, and the wirings included in the display unit 80[3] are in contact with the respective conductors 45 to 48 (the contacts between the wirings and the conductors 45 to 48 are not illustrated in FIG. 6). Note that the conductors are positioned on the wirings at the upper side of the shaft 60h and the wirings are positioned on the conductors at the lower side of the shaft 60h. This structure can reduce the contact resistance between the wirings included in the display units and the conductors included in the shaft 60h.

Figure 7A:
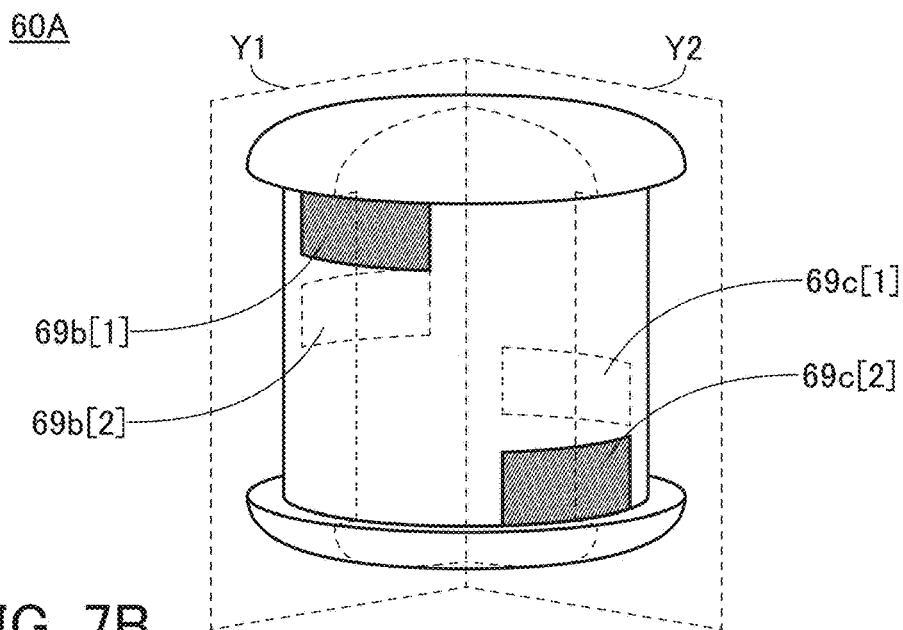
FIGS. 7A and 7B are a perspective view and a cross-sectional view illustrating an example of a shaft.
Figure 7B:
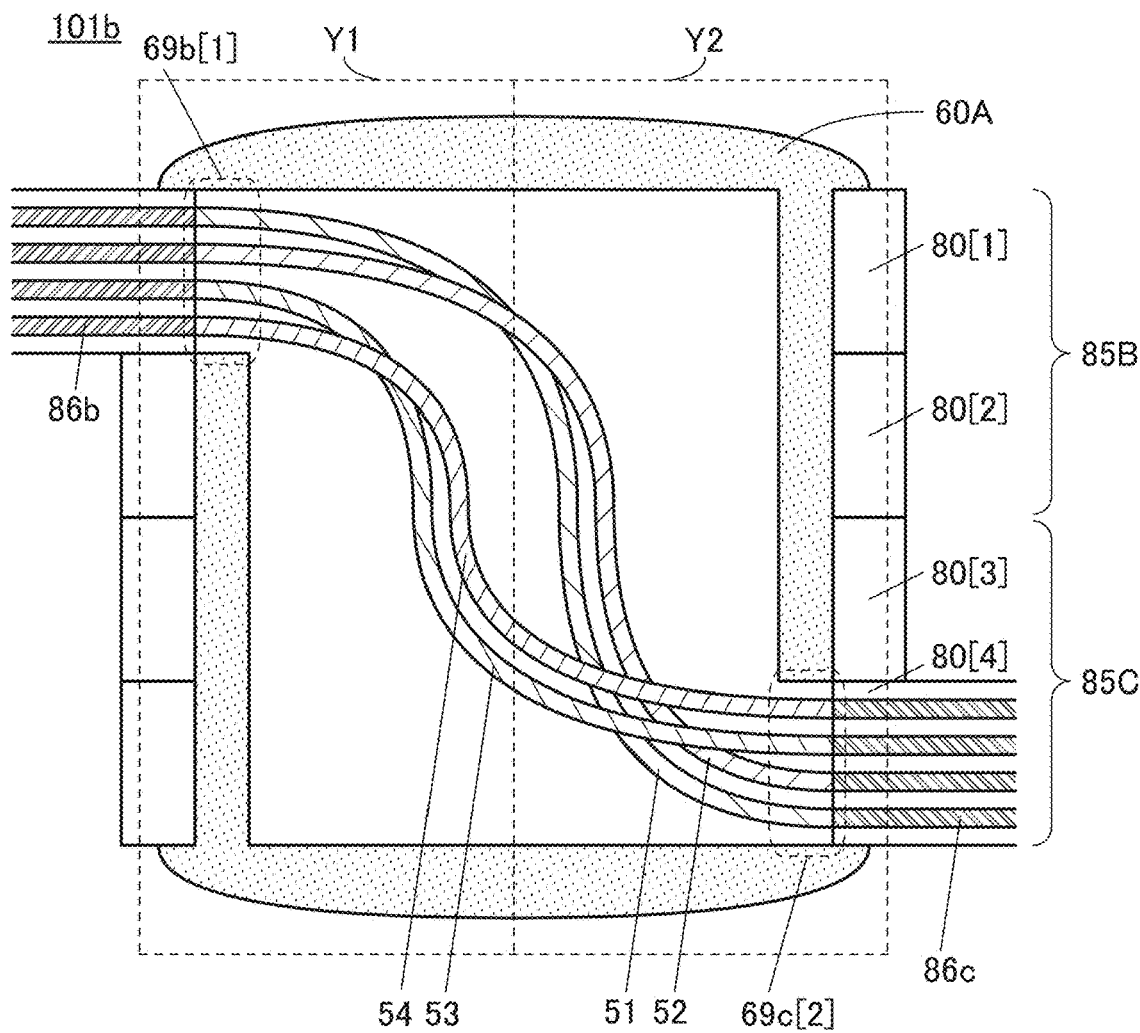

Alternatively, the shaft 60h may include, for example, codes formed of a ductile and malleable conductor covered with an insulator such as rubber, instead of the conductors 41 to 48. The shaft having such a structure is illustrated in FIGS. 7A and 7B as a shaft 60A. FIG. 7A is a perspective view of the shaft 60A including the codes in place of the conductors 41 to 48. FIG. 7B is a cross-sectional view of the shaft 60A taken along the planes Y1-Y2 in FIG. 7A.

In FIG. 7A, the shaft 60A includes openings 69b[1], 69b[2], 69c[1], and 69c[2] for connecting the codes to the wirings (e.g., the wirings 86b and 86c) included in the display units. Note that the movable range of the display units depends on the lengths of the openings in the circumferential direction; the longer the lengths of the openings in the circumferential direction are, the wider the movable range of the display units is.

FIG. 7B illustrates a structure example of the region 101b including the shaft 60A in FIG. 7A. The shaft 60A includes codes 51 to 54. The codes 51 to 54 are used in place of the conductors 41 to 44 in FIGS. 4A and 4B and FIG. 6. That is, the codes 51 to 54 have functions of electrically connecting the wirings 86b to the wirings 86c through the openings 69b[1] and 69c[2]. The codes 51 to 54 have ductility and malleability to be highly resistant to bending and thus can withstand the movement of the units connected to each other.

The above-described connection method makes it possible to obtain the display device 100 in FIG. 1D1.

Modification Example

One embodiment of the present invention is not limited to the display device 100 in FIG. 1D1. Depending on the circumstances or conditions or as needed, the components of the display device 100 can be changed as appropriate.

For example, instead of the display unit 80 in FIG. 1A, a display unit 80A in FIG. 8A whose light-emitting portion is larger than the light-emitting portion 81 of the display unit 80 may be used. The display unit 80A includes a light-emitting portion 81A, the connection region 82, and a support 83A. The light-emitting portion 81A of the display unit 80A has a larger light-emitting area than the light-emitting portion 81 of the display unit 80. With an increase in the light-emitting area of the light-emitting portion 81A, the area of the support 83A is increased in the display unit 80A.

FIG. 8B illustrates a display device 100A including the display unit 80A in place of the display unit 80 of the display device 100 illustrated in FIG. 1D1. The use of the display unit 80A enables the display device 100A to have a larger light-emitting area. Thus, the display device 100A can have a smaller non-display region (a region other than the light-emitting portion 81) than the display device 100, resulting in an increase in the emission luminance of the display device 100A.

Here, the case where the size of the support 83A of the display unit 80A is increased as much as possible is described. FIG. 8C1, FIG. 8D1, and FIG. 8E illustrate a display unit group 86 combining four display units 80, a display unit group 86A combining four display units 80A, and a display unit group 86B combining four display units 80B, respectively. In the display unit group 86B, the display units 80B have such large supports that the opposite display units 80B are in contact with each other.

In this specification and the like, as an index of the size of the display unit, the distance between the center of the shaft in one of the connection regions and the center of the shaft in the other of the connection regions in the display unit is defined as a length in a first direction. In addition, the width of the display unit in the direction perpendicular to the first direction of the display unit is defined as a length in a second direction.

The distance between the two connection regions of each of the display unit 80 in FIG. 8C1, the display unit 80A in FIG. 8D1, and the display unit 80B in FIG. 8E (hereinafter, referred to as the length in the first direction) is referred to as L. The lengths in the second direction of the display unit 80 in FIG. 8C1, the display unit 80A in FIG. 8D1, and the display unit 80B in FIG. 8E are referred to as $W_1$, $W_2$, and $W_3$, respectively. Note that $W_2$ is longer than $W_1$, and $W_3$ is longer than $W_2$. The size of the support of the display unit 80B is as large as possible; thus, $W_3$ is the maximum value in the display unit group 86B composed of the display units 80B.

The opposite display units 80B are in contact with each other in the display unit group 86B in FIG. 8E; thus, the length L in the first direction of the display unit 80B is the same as the length $W_3$ in the second direction of the display unit 80B.

In the display unit 80 in FIG. 8C1, the center of the shaft in one of the connection regions is referred to as Z1, and the center of the shaft in the other of the connection regions is referred to as Z3. In the display unit group 86 in FIG. 8C1, the center of the shaft in the connection region that is diagonally opposite to Z1 is referred to as Z2. Similarly, in the display unit 80A in FIG. 8D1, the center of the shaft in one of the connection regions is referred to as Z1, and the center of the shaft in the other of the connection regions is referred to as Z3. In the display unit group 86A in FIG. 8D1, the center of the shaft in the connection region that is diagonally opposite to Z1 is referred to as Z2. Similarly, in the display unit 80B in FIG. 8E, the center of the shaft in one of the connection regions is referred to as Z1, and the center of the shaft in the other of the connection regions is referred to as Z3. In the display unit group 86B in FIG. 8E, the center of the shaft in the connection region that is diagonally opposite to Z1 is referred to as Z2. In each of FIGS. 8C1, 8D1, and 8E, an angle between the dotted line Z1-Z2 and the dotted line Z1-Z3 is referred to as e.

The display unit group 86 in FIG. 8C1 is changed in shape such that θ has the minimum value, so that the display unit group 86 has a shape in FIG. 8C2. An angle between the dotted line Z1-Z3 and the dotted line Z1-Z2 at this time is referred to as $\phi_1$. The display unit group 86A in FIG. 8D1 is changed in shape such that θ has the minimum value, so that the display unit group 86A has a shape in FIG. 8D2. An angle between the dotted line Z1-Z3 and the dotted line Z1-Z2 at this time is referred to as $\phi_2$. Note that the angle $\phi_1$ is smaller than the angle $\phi_2$.

Note that in FIGS. 8C2 and 8D2, the dotted line Z1-Z3 and the dotted line Z1-Z2 are extended to clearly show the angle $\phi_1$ and the angle $\phi_2$.

When the second direction length $W_1$ of the display unit 80 in the display unit group 86 is increased, the shape of the display unit group 86 becomes close to that of the display unit group 86A. That is, the increased second direction length of the display unit increases the minimum value in the range of the angle θ. For the same reason, the increased second direction length of the display unit reduces the maximum value in the range of the angle θ. In other words, the increased second direction length of the display unit narrows the range of the angle θ in the display unit group including the display unit.

The display unit group 86B in FIG. 8E cannot be changed in shape by reducing the angle θ because the opposite display units 80B are in contact with each other.

Accordingly, in the case where the display device 100A is formed using the display unit whose light-emitting portion and support are larger than the light-emitting portion 81 and the support 83 of the display unit 80, the length in the second direction of the display unit needs to be shorter than the length in the first direction of the display unit.

Figure 9A:
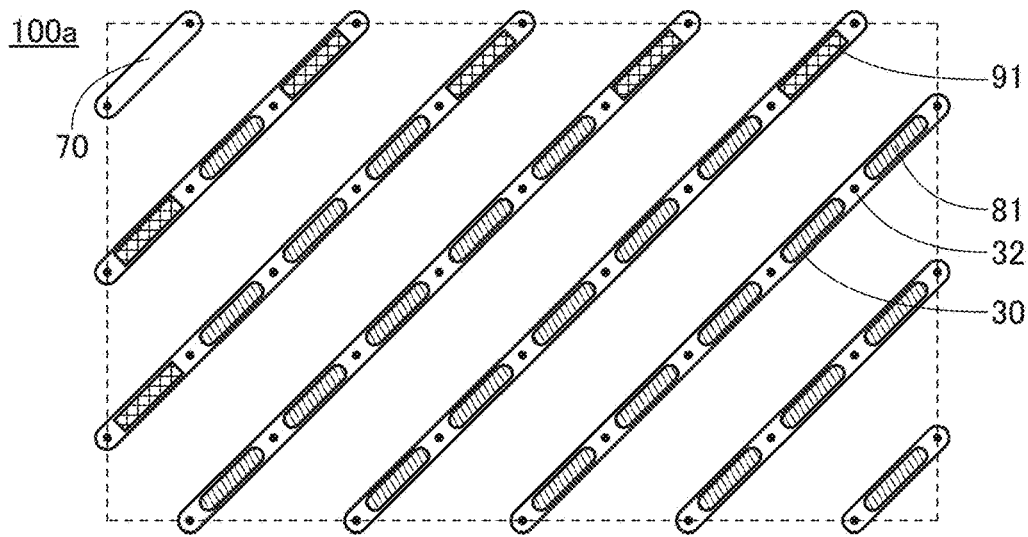
FIGS. 9A to 9C illustrate an example of a display device and an example of constituting the display device.
Figure 9B:
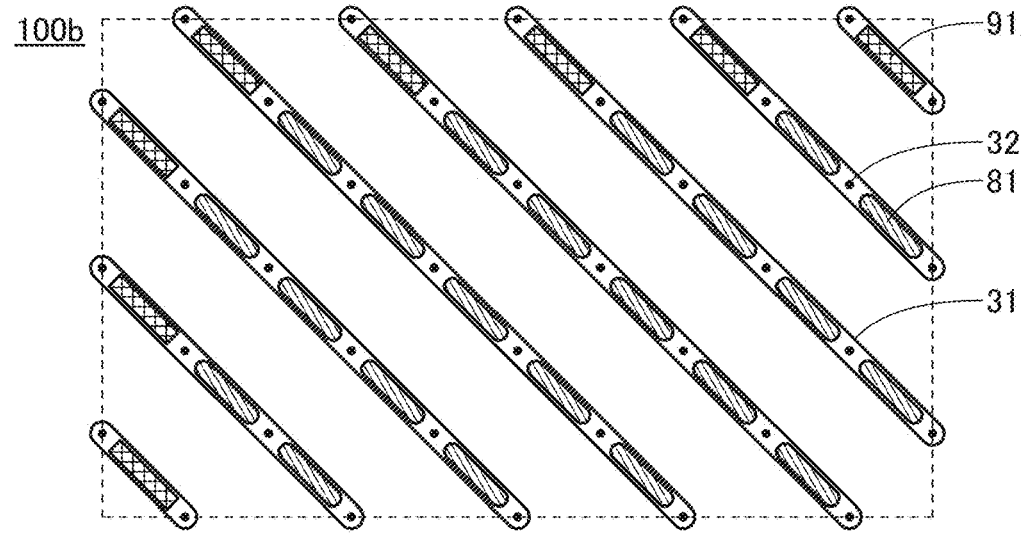

A plurality of units in FIGS. 9A and 9B may be used instead of the units in FIGS. 1A to 1C, for example.

A region 100a in FIG. 9A includes one support unit 70 and a plurality of units 30. Note that not all the units 30 have the same length and some of the units 30 have different lengths from the others, and the support unit 70 and each of the plurality of units 30 are parallel to each other. Each of the units 30 includes the light-emitting portion 81 and a connection region 32. Some of the units 30 include one or two driver circuit portions 91, and the others do not include the driver circuit portion 91.

A region 100b in FIG. 9B includes a plurality of units 31. Note that not all the units 31 have the same length and some of the units 31 have different lengths from the others, and the plurality of units 31 are parallel to each other. Each of the units 31 includes the driver circuit portion 91 and the connection region 32. Some of the units 31 include the light-emitting portion 81, and the others do not include the light-emitting portion 81.

Figure 9C:
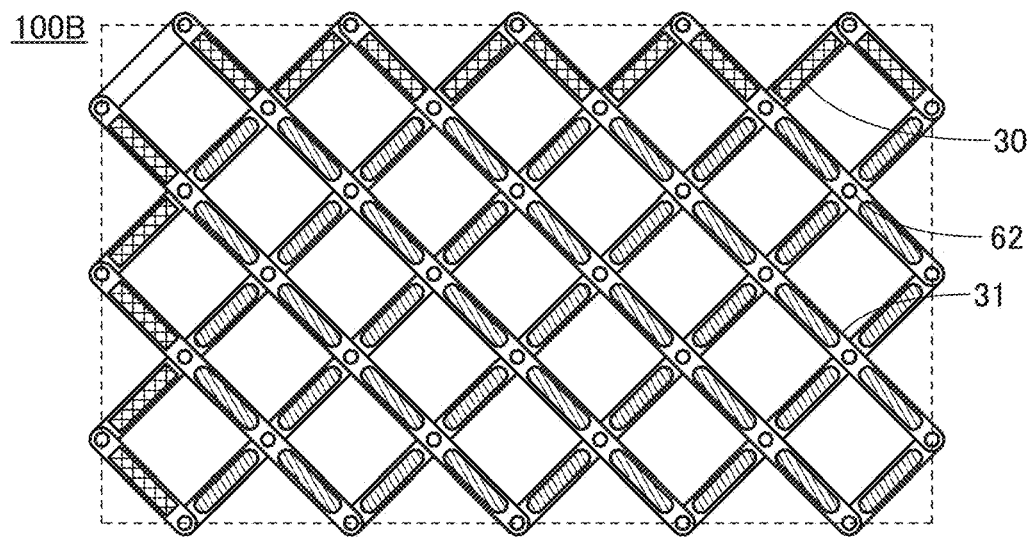

A display device 100B in FIG. 9C can be obtained in such a manner that the connection regions 32 of the units 31 in FIG. 9B are provided to overlap with the connection regions 32 of the support unit 70 and the units 30 in FIG. 9A, and the connection regions 32 are connected to each other with shafts 62. Such a structure enables the display device 100B to change its shape so as to be the display device 100 in FIG. 1D2 (this change is not illustrated), as in the display device 100 in FIG. 1D1. Although the display device 100 in FIG. 1D1 includes four units overlapping with one another as in FIGS. 3B and 3C, the display device 100B includes two units overlapping with each other and thus can be stored in a thin housing or the like.

In the above description, the support unit 70 is described as a component of the display device 100B; however, the display device 100B does not necessarily include the support unit 70.

Note that this embodiment can be combined with other embodiments and/or an example in this specification as appropriate.

Embodiment 2

In this embodiment, examples of electronic devices each including the display device 100 in Embodiment 1 are described.

Application Example 1

FIGS. 10A1 and 10A2 each illustrate a signboard 6002 provided on the roof of a building 6001. The signboard 6002 is supported by steel frames 6003 provided on the roof of the building 6001.

Here, the case where the signboard 6002 includes the display device 100 in Embodiment 1 is described. The signboard 6002 in FIG. 10A1 that includes the display device 100 can change its shape so as to be a signboard 6002A in FIG. 10A2. Accordingly, the aspect ratio of the signboard can be freely changed depending on the contents displayed on the signboard.

Application Example 2

FIGS. 10B1 and 10B2 each illustrate an example of a small-sized digital signage that can be easily transferred. A digital signage 6100 in FIG. 10B1 includes a display portion 6101, a structure body 6102, and casters 6103. The structure body 6102 has a structure supporting the display portion 6101 and a structure provided with the casters 6103. The digital signage 6100 can be transferred by rolling the casters 6103.

Here, the case where the display portion 6101 includes the display device 100 in Embodiment 1 is described. The display portion 6101 in FIG. 10B1 that includes the display device 100 can change its shape so as to be a display portion 6101A in FIG. 10B2. Accordingly, the aspect ratio of the display portion can be freely changed depending on the contents displayed on the display portion.

Application Example 3

Figure 11A:
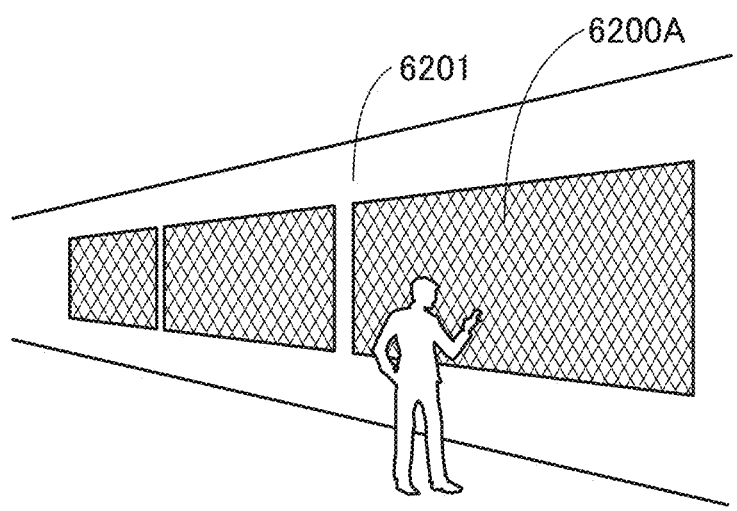
FIGS. 11A and 11B illustrate examples of electronic devices.
Figure 11B:
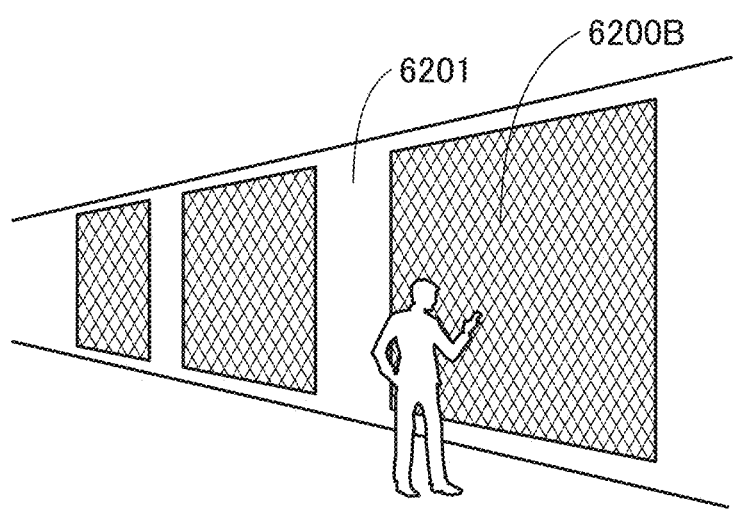

FIGS. 11A and 11B each illustrate an example of a digital signage that can be attached to a wall. FIG. 11A illustrates a digital signage 6200A attached to a wall 6201.

Here, the case where the digital signage 6200A includes the display device 100 in Embodiment 1 is described. The digital signage 6200A in FIG. 11A that includes the display device 100 can change its shape so as to be a digital signage 6200B in FIG. 11B. Accordingly, the aspect ratio of the digital signage can be freely changed depending on the contents displayed on the digital signage.

Note that this embodiment can be combined with other embodiments and/or an example in this specification as appropriate.

Embodiment 3

In this embodiment, a display device of one embodiment of the present invention that is different from the display device 100 in Embodiment 1 is described.

Structure Example

FIG. 12A illustrates a structure example of a display unit included in the display device of one embodiment of the present invention. A display unit 250 includes a circuit 251, and the circuit 251 includes a light-emitting portion 252.

The circuit 251 is a circuit for making the light-emitting portion 252 emit light. A selection signal, a data signal, or the like input to the circuit 251 through a wiring (not illustrated in FIG. 12A) enables the light-emitting portion 252 to emit light.

For the light-emitting portion 252, a transmissive liquid crystal element, an organic EL element, an inorganic EL element, a nitride semiconductor light-emitting diode, or the like can be used. Instead of the light-emitting portion 252, a reflective liquid crystal element, an electrophoretic element, or the like can be used.

The light-emitting portion 252 may include a plurality of kinds of light-emitting elements. For example, the plurality of light-emitting elements may emit light of three colors of red (R), green (G), and blue (B), or four colors of red (R), green (G), blue (B), and white (W). Alternatively, the plurality of light-emitting elements may emit light of some of red (R), green (G), blue (B), white (W), cyan (C), yellow (Y), magenta (M), and the like in combination as necessary. The light-emitting portion 252 of the display unit 250 does not necessarily include the plurality of kinds of light-emitting elements, and may include one kind of light-emitting element. For example, the light-emitting portion may emit light of any one of the above colors.

The display unit 250 in FIGS. 12A, 12B1, and 12B2 may be replaced with a pixel. In the case where the pixel is used instead of the display unit 250 in this embodiment, the display unit 250, the circuit 251, and the light-emitting portion 252 may be replaced with a pixel, a pixel circuit, and a light-emitting element, respectively.

Note that although the display unit 250 in FIGS. 12A, 12B1, and 12B2 has a square shape, one embodiment of the present invention is not limited thereto. For example, the display unit 250 may have a circular shape, an elliptical shape, a shape with a curve, a polygonal shape, or the like. In addition, the light-emitting portion 252 does not necessarily have a square shape, but may have a circular shape, an elliptical shape, a shape with a curve, a polygonal shape, or the like.

FIG. 12B1 illustrates a structure example of a display region in the display device of one embodiment of the present invention. A display region 260A has a stacked structure of two layers each including a plurality of display units 250. In FIG. 12B1, the plurality of display units 250 in an upper layer of the two layers are referred to as display units 250a, and the plurality of display units 250 in a lower layer of the two layers are referred to as display units 250b. To avoid complexity of description, wirings connected to the display units 250a and the display units 250b are not illustrated in FIG. 12B1.

Note that the display region 260A includes an elastic and light-transmitting insulator 240. In this specification and the like, an elastic material refers to a material that can expand and contract and has high restorability. In addition, a light-transmitting material refers to a material with high transmittance. The insulator 240 has a two-layer structure of the upper layer and the lower layer. The upper layer of the insulator 240 covers all the display units 250a and the lower layer of the insulator 240 covers all the display units 250b. In the insulator 240, the upper layer and the lower layer may be formed using the same material or different materials. In addition, in the insulator 240, the upper layer and/or the lower layer may be formed using a combination of a plurality of materials. Alternatively, the insulator 240 may be formed using one elastic and light-transmitting material.

The area of the display region 260A can be increased by stretching the elastic and light-transmitting insulator 240. For example, the stretch of the insulator 240 in directions of arrows enables the display region 260A in FIG. 12B1 to change its shape so as to be a display region 260B in FIG. 12B2.

The insulator 240 can be formed using, for example, vinyl chloride, a polyurethane resin, silicone, or rubber.

The display region 260A in FIG. 12B1 is stretched in the directions of the arrows, whereby gaps between the adjacent display units 250a in the upper layer of the display region 260A are increased. Note that in the case where the display region 260A including only the display units 250a as pixels is stretched so as to be the display region 260B, the gaps between the adjacent display units 250a are increased, leading to a reduction in resolution of the display region 260B.

Thus, the plurality of display units 250b are provided in the lower layer in addition to the display units 250a in the upper layer in the display region 260A, as illustrated in FIG. 12B1. With such a structure, when the display region 260A is stretched to be the display region 260B, the light-emitting portions 252 of the display units 250b appear on the display surface side of the display region 260B. That is, the light-emitting regions of the display units 250b in the lower layer are increased by stretching the display region 260A to be the display region 260B, which prevents a reduction in display quality of the display region 260B. Note that the upper layer and the lower layer of the insulator 240 are preferably formed using materials with different degrees of elasticity. The degrees of elasticity of the materials included in the upper layer and the lower layer are optimized, so that the light-emitting portions 252 of the display units 250b can overlap with the gaps between the adjacent display units 250a when the display region 260A is stretched to be the display region 260B.

As illustrated in FIG. 12B1, each of the display units 250b in the lower layer of the display region 260A is preferably provided to overlap with parts of the four display units 250a in the upper layer of the display region 260A. The display region 260A having such a structure enables each of the display units 250b to be positioned in the largest gap between the adjacent display units 250a in the upper layer when the display region 260A is stretched to be the display region 260B.

Note that the positions of the display units 250b in the lower layer of the display region 260A are not limited to those in the display region 260A in FIG. 12B1. For example, in the case where the display region is stretched in predetermined directions, the structure of a display region 261A in FIG. 13A1 can be employed. The display region 261A has a structure in which each of the display units 250b is provided in the lower layer of the display region 261A to overlap with parts of the two display units 250a in the upper layer. The insulator 240 in such a structure is stretched in the directions of the arrows, whereby the display region 261A in FIG. 13A1 can be a display region 261B in FIG. 13A2.

Alternatively, for example, a display unit 255 in FIG. 14A may be used as each of the pixels provided in the lower layer of the display region. The display unit 255 is smaller than the display unit 250 (display units 250a and 250b), and includes a circuit 256 including a light-emitting portion 257. FIG. 14B1 illustrates a display region including the display units 255 in the lower layer. A display region 262A has a structure in which a plurality of display units 255 in the lower layer overlap with parts of the display units 250a in the upper layer. Specifically, the display region 262A has the structure in which some of the display units 255 in the lower layer overlap with two adjacent display units 250a in the upper layer, and the others in the lower layer overlap with the four display units 250a arranged in adjacent two rows and two columns in the upper layer. The insulator 240 in such a structure is stretched in the directions of the arrows, whereby the display region 262A in FIG. 14B1 can be a display region 262B in FIG. 14B2. Note that owing to the use of the display units 255, the display region 262A can include more pixels in the lower layer than the display region 260A. Thus, the light-emitting area of the display region 262B obtained by stretching the display region 262A can be larger than that of the display region 260B obtained by stretching the display region 260A. Accordingly, a decrease in resolution is less caused in the display region 262A than in the display region 260A by the stretch.

Next, an example of the electrical connection between the plurality of display units 250 included in the display region 260A (260B) and lead wirings is described.

FIG. 15A illustrates an example of the electrical connection between the display units 250 (display units 250a and 250b) and the wirings in the display region 260A (260B). Note that the wirings in the display region 260B are illustrated in FIG. 15A to clearly show the electrical connection between the display units 250 (display units 250a and 250b) and the wirings.

The display region 260A (260B) includes a plurality of signal lines and a plurality of gate lines. Note that in FIG. 15A, a signal line SLa[1], a signal line SLa[2], a signal line SLb[1], a signal line SLb[2], a gate line GLa[1], a gate line GLa[2], a gate line GLb[1], and a gate line GLb[2] are illustrated, and reference numerals of the other wirings are omitted. In this specification, the signal lines SLa[1] and SLa[2] are collectively referred to as a signal line SLa, the signal lines SLb[1] and SLb[2] are collectively referred to as a signal line SLb, the gate lines GLa[1] and GLa[2] are collectively referred to as a gate line GLa, and the gate lines GLb[1] and GLb[2] are collectively referred to as a gate line GLb. Each of the signal line SLa, the signal line SLb, the gate line GLa, and the gate line GLb in FIG. 15A may include a plurality of wirings. For example, each of the signal line SLa[1] and the gate line GLa[1] is not composed of one wiring but may be composed of a plurality of wirings.

In some cases, the wirings referred to as the signal lines can be replaced with the wirings referred to as the gate lines as appropriate.

The signal line SLa and the gate line GLa are electrically connected to the plurality of display units 250a included in the upper layer of the display region 260A (260B). The signal line SLb and the gate line GLb are electrically connected to the plurality of display units 250b included in the lower layer of the display region 260A (260B).

FIG. 15B1 is a cross-sectional view of the display region 260A in FIG. 15A, and FIG. 15B2 is a cross-sectional view of the display region 260B in FIG. 15A. FIG. 15B1 shows cross sections taken along the dashed-dotted lines P1-P2 and P3-P4 in the display region 260A in FIG. 15A. FIG. 15B2 shows cross sections taken along the dashed-dotted lines P1-P2 and P3-P4 in the display region 260B obtained by stretching the display region 260A in FIG. 15A. Note that the cross section taken along the dashed-dotted line P1-P2 shows only the upper layer of the display region 260A (260B), and the cross section taken along the dashed-dotted line P3-P4 shows only the lower layer of the display region 260A (260B).

That is, the signal line SLa is electrically connected to the display units 250a and thus is included in the upper layer, and the signal line SLb is electrically connected to the display units 250b and thus is included in the lower layer. In addition, the signal lines SLa and SLb are formed using an elastic conductive material, which enables the display region 260A in FIG. 15B1 to be stretched to be the display region 260B in FIG. 15B2. When the display region 260A in FIG. 15B1 is stretched to be the display region 260B in FIG. 15B2, the gaps between the adjacent display units 250a are increased, resulting in an increase in the light-emitting areas of the light-emitting elements of the display units 250b overlapping with parts of the gaps between the adjacent display units 250a.

Similarly, the gate lines GLa and GLb are formed using an elastic conductive material, which enables the display region 260A to be stretched to be the display region 260B.

A wiring routing way in the display region 260A (260B) is not limited to the way described using the display region 260A (260B) in FIGS. 15A, 15B1, and 15B2. For example, one of a plurality of signal lines SLa in the upper layer and one of a plurality of signal lines SLb in the lower layer may be combined into one wiring. FIG. 16A illustrates an example of a display region in such a case. In the display region 260A (260B) in FIG. 16A, the signal lines SLa[1] and SLb[1] are combined into one signal line SL[1], and the signal lines SLa[2] and SLb[2] are combined into one signal line SL[2]. Note that also in the signal lines not shown with reference numerals in FIG. 16A, one of the signal lines SLa in the upper layer and one of the signal lines SLb in the lower layer are combined into one wiring. In this specification, the signal lines included in the display region 260A (260B) in FIGS. 16A, 16B1, and 16B2 are collectively referred to as a signal line SL. Note that a combined wiring in this paragraph means a wiring formed using one wiring or a wiring formed using a plurality of wirings.

FIG. 16B1 is a cross-sectional view of the display region 260A in FIG. 16A, and FIG. 16B2 is a cross-sectional view of the display region 260B in FIG. 16A. FIG. 16B1 is the cross-sectional view taken along the dashed-dotted line Q1-Q2 in the display region 260A in FIG. 16A. FIG. 16B2 is the cross-sectional view taken along the dashed-dotted line Q1-Q2 in the display region 260B obtained by stretching the display region 260A in FIG. 16A.

In FIG. 16A, the signal line SL electrically connects the display units 250a in the upper layer to the display units 250b in the lower layer as illustrated in FIGS. 16B1 and 16B2.

The signal line SL is formed using an elastic conductive material, which enables the display region 260A in FIG. 16B1 to be stretched to be the display region 260B in FIG. 16B2. When the display region 260A in FIG. 16B1 is stretched to be the display region 260B in FIG. 16B2, the gaps between the adjacent display units 250a are increased, resulting in an increase in the light-emitting areas of the light-emitting elements of the display units 250b overlapping with parts of the gaps between the adjacent display units 250a.

Similarly, the gate lines GLa and GLb are formed using an elastic conductive material, which enables the display region 260A to be stretched to be the display region 260B. The gate lines GLa and GLb can be combined into one wiring (not illustrated) as in the signal line SL.

Next, an example of a driver circuit for driving the display region 260A (260B) is described.

Figure 17A:
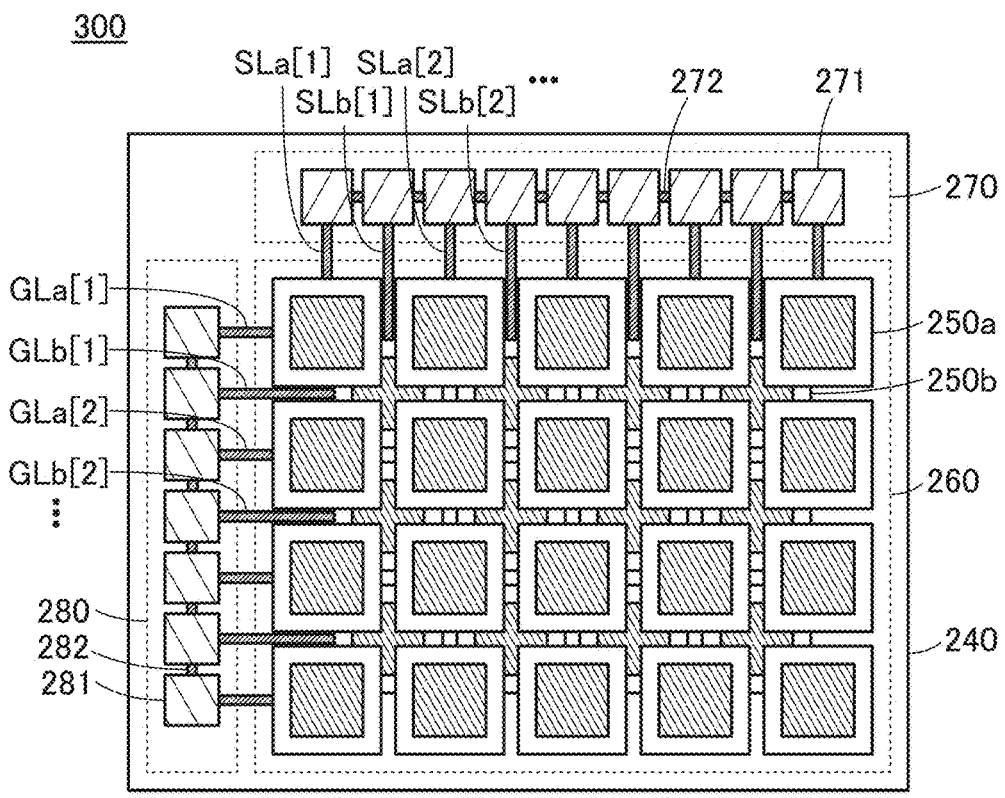
FIGS. 17A and 17B are schematic views illustrating examples of a display device.

FIG. 17A illustrates a display device 300 including a display region 260. The display device 300 includes a driver region 270 and a driver region 280 in addition to the display region 260. Here, the driver region 270 functions as a source driver for driving the display region 260, and the driver region 280 functions as a gate driver for driving the display region 260.

For another example, the display device 300 may have a structure in which the driver region 270 functions as a gate driver for driving the display region 260 and the driver region 280 functions as a source driver for driving the display region 260.

The driver region 270 includes a plurality of driver circuit units 271. Some of the plurality of driver circuit units 271 are electrically connected to the display units 250a through the signal line SLa, and the others are electrically connected to the display units 250b through the signal line SLb. The plurality of driver circuit units 271 have a function of supplying a signal for an image to be displayed on the display region 260 to the display region 260 through the signal lines SLa and SLb.

The plurality of driver circuit units 271 are aligned in a line, and the adjacent driver circuit units 271 are electrically connected to each other with a wiring 272. Note that the number of wirings 272 may be one, or two or more.

The driver region 280 includes a plurality of driver circuit units 281. Some of the plurality of driver circuit units 281 are electrically connected to the display units 250a through the gate line GLa, and the others are electrically connected to the display units 250b through the gate line GLb. The plurality of driver circuit units 281 have a function of supplying a selection signal to pixels included in the display region 260 through the gate lines GLa and GLb.

The plurality of driver circuit units 281 are aligned in a line, and the adjacent driver circuit units 281 are electrically connected to each other with a wiring 282. Note that the number of wirings 282 may be one, or two or more.

Figure 17B:
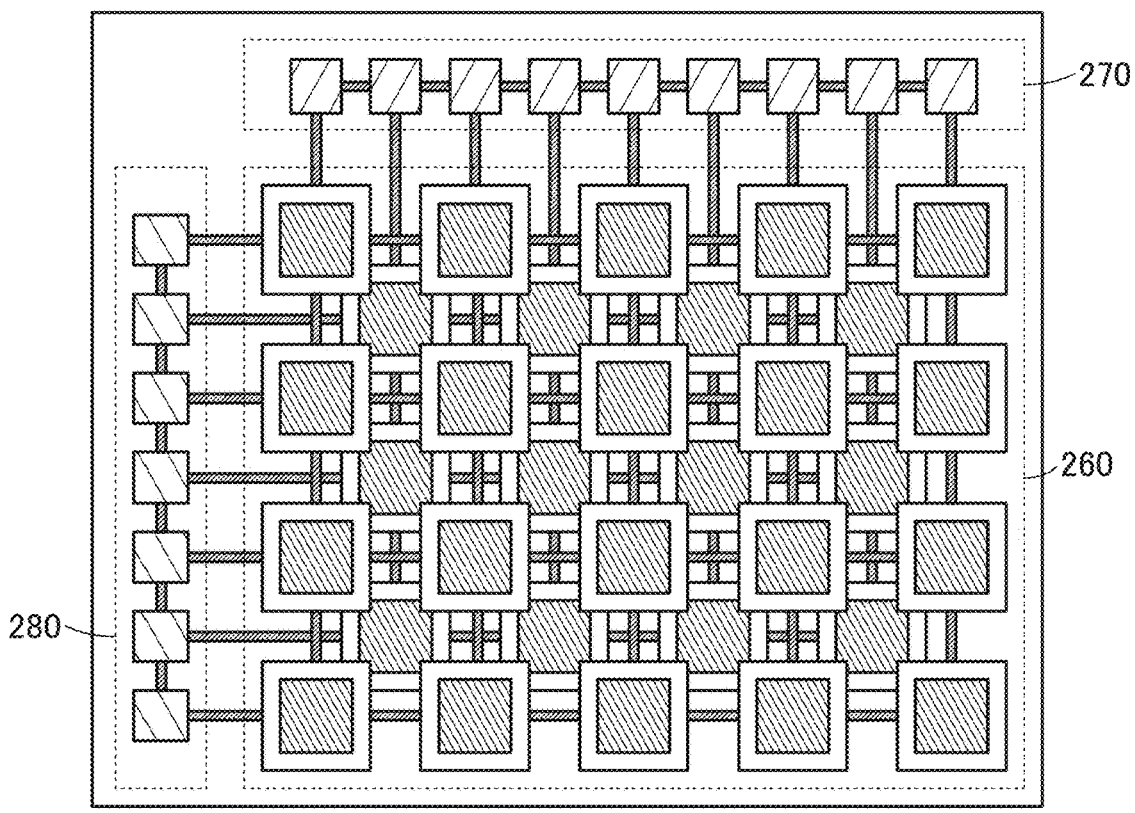

The wirings 272 and 282 are formed using an elastic conductive material as in the signal lines SLa and SLb and the gate lines GLa and GLb. Accordingly, the elastic wirings 272 and 282 increase the gaps between the adjacent driver circuit units 271 and the gaps between the adjacent driver circuit units 281. Thus, the display device 300 in FIG. 17A can have the shape in FIG. 17B when stretched.

Although the driver region 270 includes the plurality of driver circuit units 271 in FIG. 17A, one embodiment of the present invention is not limited thereto. For example, the driver region 270 may include one driver circuit unit 271 (not illustrated). Similarly, although the driver region 280 includes the plurality of driver circuit units 281 in FIG. 17A, the driver region 280 may include one driver circuit unit 281 (not illustrated).

In the case where the circuit area of the driver circuit unit 271 and/or the driver circuit unit 281 becomes large, the driver region 270 and/or the driver region 280 may have a two-layer structure as in the display region 260. Specifically, in the driver region having the two-layer structure, the adjacent driver circuit units may partly overlap with each other.

A driver region 270A and a driver region 280A in a display device 300A in FIG. 18A each have a two-layer structure. The driver region 270A includes a plurality of driver circuit units 271A, and the driver region 280A includes a plurality of driver circuit units 281A. The driver circuit units 271A in the upper layer of the driver region 270A are electrically connected to the display units 250a through the signal line SLa, and the driver circuit units 271A in the lower layer of the driver region 270A are electrically connected to the display units 250b through the signal line SLb. Similarly, the driver circuit units 281A in the upper layer of the driver region 280A are electrically connected to the display units 250a through the gate line GLa, and the driver circuit units 281A in the lower layer of the driver region 280A are electrically connected to the display units 250b through the gate line GLb.

FIG. 18B1 is a cross-sectional view taken along the dashed-dotted line R1-R2 in FIG. 18A. As described above, in the driver region 270A, the adjacent driver circuit units 271A partly overlap with each other. In addition, the adjacent driver circuit units 271A are electrically connected to each other with the elastic wiring 272.

Note that when the display device 300A is stretched, the cross section taken along the dashed-dotted line R1-R2 in FIG. 18B1 changes to that in FIG. 18B2. With the driver region 270A having the two-layer structure and the elastic wiring 272 illustrated in FIG. 18B1, the display device 300A can be stretched even when the circuit area of the driver circuit unit 271 is large.

For the description of stretching the driver region 280A, refer to the description of stretching the driver region 270A.

The structure examples described in this embodiment can be combined with each other as appropriate.

<Manufacturing Method Example>

Next, an example of a method for manufacturing the display region 260A is described with reference to FIGS. 19A to 19C, FIGS. 20A and 20B, FIGS. 21A and 21B, FIG. 22, and FIG. 23.

Figure 19A:
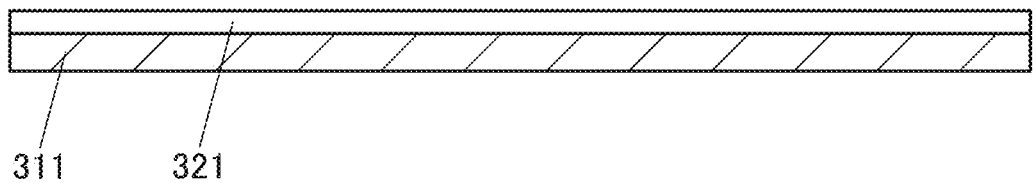
FIGS. 19A to 19C are cross-sectional views illustrating an example of a method for manufacturing a display device.

First, an insulator 321 is formed over a substrate 311 (see FIG. 19A).

The substrate 311 can be formed using any of a variety of materials such as glass, quartz, a resin, a metal, an alloy, and a semiconductor. When the substrate 311 is formed using a flexible material, any of the above-described materials that is thin enough to be flexible may be used, for example.

The insulator 321 can be used as a barrier layer that prevents diffusion of impurities contained in the substrate 311 into a transistor and a display element formed later. For example, the insulator 321 preferably prevents moisture and the like contained in the substrate 311 from diffusing into the transistor and the display element in a heating step performed in the manufacturing process of the display region 260A. Thus, the insulator 321 preferably has a high barrier property.

For the insulator 321, an inorganic insulating film such as a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the substrate 311 and a silicon oxide film be formed over the silicon nitride film.

The inorganic insulating film is preferably formed at high temperatures because the film can have higher density and a higher barrier property as the deposition temperature becomes higher. The deposition temperature of the insulator 321 is preferably lower than or equal to the upper temperature limit of the substrate 311.

Figure 19B:
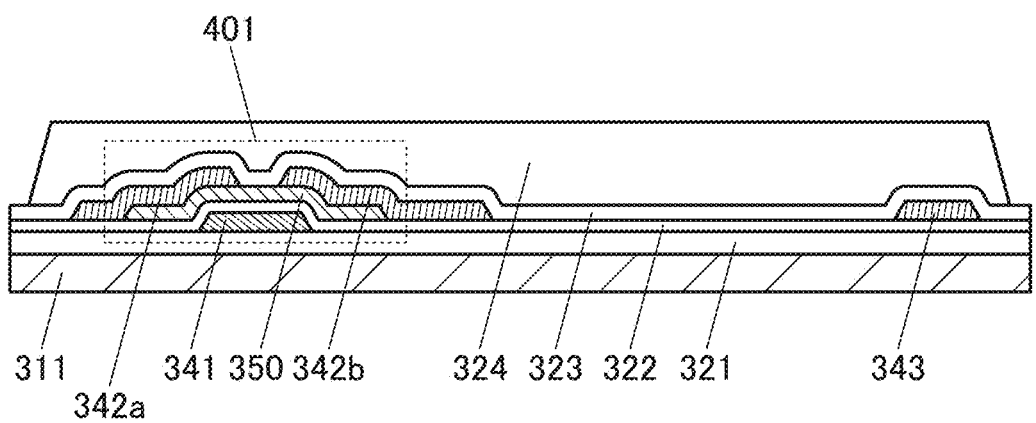

After the insulator 321 is formed over the substrate 311, a circuit, a wiring, and the like are formed over the insulator 321 (see FIG. 19B). In FIG. 19B, a transistor 401 is formed over the substrate 311.

There is no particular limitation on the structure of the transistor in the display region 260A. For example, a planar transistor, a staggered transistor, or an inverted staggered transistor may be used. A top-gate transistor or a bottom-gate transistor may also be used. Gate electrodes may be provided above and below a channel.

Described here is the case where a bottom-gate transistor including a metal oxide 350 is formed as the transistor 401. The metal oxide 350 can function as a semiconductor layer of the transistor 401. Note that the metal oxide described here can function as an oxide semiconductor.

In this embodiment, an oxide semiconductor is used as a semiconductor of the transistor. The oxide semiconductor is a semiconductor material having a wider band gap and a lower carrier density than silicon; thus, the off-state current of a transistor including the oxide semiconductor in a channel formation region can be reduced.

The transistor 401 is preferably formed at a temperature lower than the temperature of the heat treatment.

Here, a specific example of a method for forming the transistor 401 is described.

First, a conductor 341 is formed over the insulator 321. The conductor 341 can be formed in the following manner: a conductive film is formed, a resist mask is formed, the conductive film is etched, and the resist mask is removed.

The substrate temperature during the formation of the conductive film is preferably higher than or equal to room temperature and lower than or equal to 350° C., further preferably higher than or equal to room temperature and lower than or equal to 300° C.

The conductors included in the display region 260A can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as an oxide semiconductor or polycrystalline silicon whose resistance is lowered by adding an impurity element, for example, or silicide such as nickel silicide may be used. A film including graphene may be used as well. The film including graphene can be formed, for example, by reducing a film including graphene oxide. A semiconductor such as an oxide semiconductor containing an impurity element may be used. Alternatively, the conductors may be formed using a conductive paste of silver, carbon, copper, or the like or a conductive polymer such as a polythiophene. A conductive paste is preferable because it is inexpensive. A conductive polymer is preferable because it is easily applied.

Then, an insulator 322 is formed over the conductor 341 and the insulator 321. For the material that can be used for the insulator 322, refer to the description of the inorganic insulating film that can be used for the insulator 321.

The insulator 322 is formed at a temperature lower than or equal to the upper temperature limit of the substrate 311. The insulator 322 is preferably formed at a temperature lower than the temperature of the heat treatment.

Next, the metal oxide 350 is formed over the insulator 322 to overlap with part of the conductor 341. The metal oxide 350 can be formed in the following manner: a metal oxide film is formed, a resist mask is formed, the metal oxide film is etched, and the resist mask is removed.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using one or both of an inert gas and an oxygen gas. Note that there is no particular limitation on the flow ratio of oxygen (the partial pressure of oxygen) in the step of forming the metal oxide film. In the case where a transistor having high field-effect mobility is obtained, the flow ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. The use of such a metal oxide having a wide energy gap leads to a reduction in off-state current of a transistor.

The metal oxide film can be formed by a sputtering method. Alternatively, a PLD method, a PECVD method, a thermal CVD method, an ALD method, a vacuum evaporation method, or the like may be used.

Then, a conductor 342a and a conductor 342b are formed over the insulator 322 and the metal oxide 350. Note that part of the conductor 342a and/or part of the conductor 342b may be included in a region overlapping with the metal oxide 350. The conductors 342a and 342b can be formed in the following manner: a conductive film is formed, a resist mask is formed, the conductive film is etched, and the resist mask is removed.

Note that during the processing for forming the conductor 342a and the conductor 342b, the metal oxide 350 might be partly etched to be thin in a region not covered by the resist mask.

The substrate temperature during the formation of the conductive film is preferably higher than or equal to room temperature and lower than or equal to 350° C., further preferably higher than or equal to room temperature and lower than or equal to 300° C.

In the above manner, the transistor 401 can be fabricated. In the transistor 401, part of the conductor 341 functions as a gate, part of the insulator 322 functions as a gate insulating layer, the conductor 342a functions as one of a source and a drain, and the conductor 342b functions as the other of the source and the drain.

A conductor 343 is formed over the insulator 322. The conductor 343 can be formed at the same time as the conductors 342a and 342b. In the case where the conductor 343 is formed using a material different from that of the conductors 342a and 342b, the conductor 343 may be formed independently of the conductors 342a and 342b. The conductor 343 functions as a wiring electrically connecting a display unit, an element, a circuit, and the like to each other. Part of the conductor 343 also functions as a terminal that transmits and receives an electrical signal to and from the outside.

Next, an insulator 323 that covers the transistor 401 is formed. The insulator 323 can be formed in a manner similar to that of the insulator 321.

It is preferable to use an oxide insulating film formed in an oxygen-containing atmosphere, such as a silicon oxide film or a silicon oxynitride film, for the insulator 323. An insulating film with low oxygen diffusibility and oxygen permeability, such as a silicon nitride film, is preferably stacked over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide 350. As a result, oxygen vacancies in the metal oxide 350 can be filled and defects at the interface between the metal oxide 350 and the insulator 323 can be repaired, leading to a reduction in defect levels. Accordingly, an extremely highly reliable display device can be manufactured.

Then, an insulator 324 is formed over the insulator 323. The display element is formed on the insulator 324 in a later step; thus, the insulator 324 preferably functions as a planarization layer. For the insulator 324, refer to the description of the organic insulating film or the inorganic insulating film that can be used for the insulator 321.

The insulator 324 is formed at a temperature lower than or equal to the upper temperature limit of the substrate 311. The insulator 324 is preferably formed at a temperature lower than the temperature of the heat treatment.

Figure 19C:
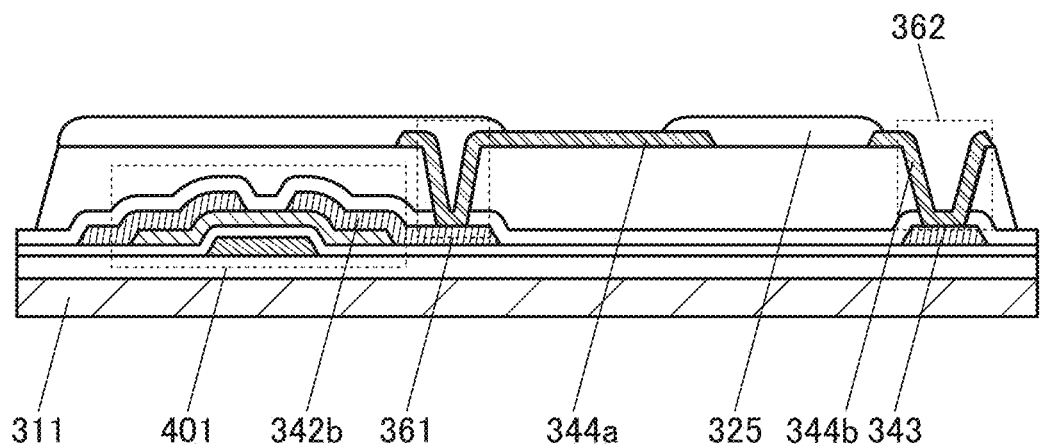

Next, an opening 361 reaching the conductor 342b and an opening 362 reaching the conductor 343 are formed in the insulators 323 and 324 (see FIG. 19C).

Then, a conductor 344a is formed over the insulator 324 and the conductor 342b through the opening 361. Part of the conductor 344a functions as a pixel electrode of a light-emitting element 370 described later. The conductor 344a can be formed in the following manner: a conductive film is formed, a resist mask is formed, the conductive film is etched, and the resist mask is removed.

Concurrently with the conductor 344a, a conductor 344b is formed over the conductor 343 through the opening 362. Note that the conductor 344b is not necessarily formed.

The substrate temperature during the formation of the conductive film is preferably higher than or equal to room temperature and lower than or equal to 350° C., further preferably higher than or equal to room temperature and lower than or equal to 300° C.

An insulator 325 that covers an end portion of the conductor 344a is formed. For the insulator 325, refer to the description of the inorganic insulating film that can be used for the insulator 321. Alternatively, the insulator 325 can be formed using an organic insulating film.

The insulator 325 is formed at a temperature lower than or equal to the upper temperature limit of the substrate 311. The insulator 325 is preferably formed at a temperature lower than the temperature of the heat treatment.

Figure 20A:
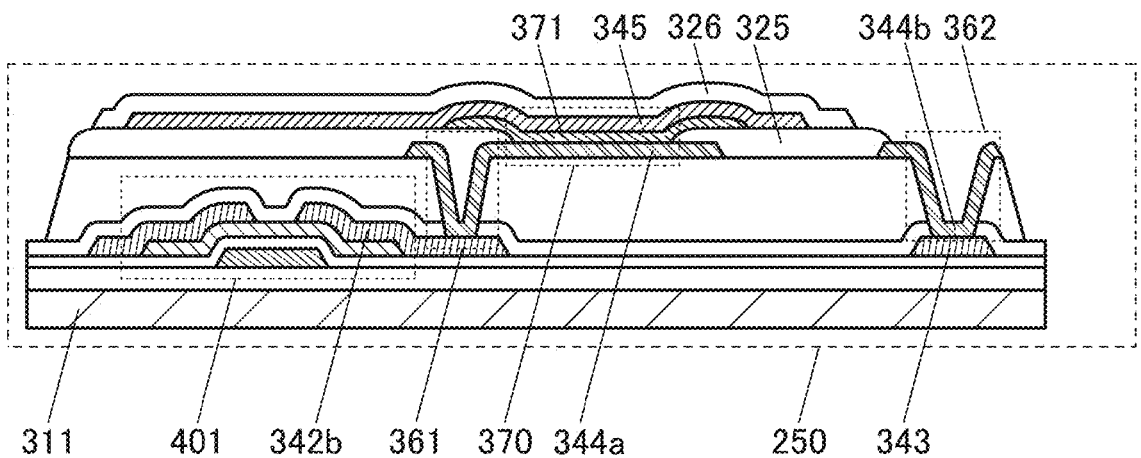
FIGS. 20A and 20B are cross-sectional views illustrating an example of a method for manufacturing a display device.

Next, the light-emitting element 370 is formed over the formation substrate in FIG. 19C (see FIG. 20A).

For formation of the light-emitting element 370, first, an EL layer 371 is formed over the conductor 344a and the insulator 325.

The EL layer 371 can be formed by an evaporation method, a coating method, a printing method, a discharge method, or the like. In the case where the EL layer 371 is formed for each individual pixel, an evaporation method using a shadow mask such as a metal mask, an ink-jet method, or the like can be used. In the case of sharing the EL layer 371 by some pixels, an evaporation method not using a metal mask can be used.

Either a low molecular compound or a high molecular compound can be used for the EL layer 371, and an inorganic compound may also be used.

Note that for the details of the EL layer 371, refer to the description of an EL layer 1103 in Embodiment 5.

Next, a conductor 345 is formed over the insulator 325 and the EL layer 371. Part of the conductor 345 functions as a common electrode of the light-emitting element 370.

The conductor 345 can be formed by an evaporation method, a sputtering method, or the like.

The conductor 345 is formed at a temperature that is lower than or equal to the upper temperature limit of the substrate 311 and lower than or equal to the upper temperature limit of the EL layer 371. The conductor 345 is preferably formed at a temperature lower than the temperature of the heat treatment.

As the conductor 345, a light-transmitting conductor is used. Examples of the light-transmitting conductor include metal oxides such as indium tin oxide (ITO), indium tin oxide containing silicon or silicon oxide, indium oxide-zinc oxide, indium oxide-tin oxide containing titanium, indium titanium oxide, and indium oxide containing tungsten oxide and zinc oxide. As the conductor 345, indium tin oxide is particularly preferable.

In the above manner, the light-emitting element 370 can be formed. In the light-emitting element 370, the conductor 344a part of which functions as a pixel electrode, the EL layer 371, and the conductor 345 part of which functions as a common electrode are stacked. Note that a top-emission light-emitting element is formed as the light-emitting element 370 here.

Next, an insulator 326 is formed to cover the conductor 345. The insulator 326 functions as a protective layer that prevents diffusion of impurities such as water into the light-emitting element 370. The light-emitting element 370 is sealed with the insulator 326. After the conductor 345 is formed, the insulator 326 is preferably formed without exposure to the air.

The insulator 326 is formed at a temperature that is lower than or equal to the upper temperature limit of the substrate 311 and lower than or equal to the upper temperature limit of the light-emitting element 370. The insulator 326 is preferably formed at a temperature lower than the temperature of the heat treatment.

The insulator 326 preferably includes an inorganic insulating film with a high barrier property that can be used for the insulator 321, for example. A stack including an inorganic insulating film and an organic insulating film can also be used.

The insulator 326 can be formed by an ALD method, a sputtering method, or the like. An ALD method and a sputtering method are preferable because a film can be formed at low temperatures. An ALD method is preferable because the coverage with the insulator 326 is improved.

A structure where the components up to the insulator 326 are formed over the substrate 311 corresponds to the display unit 250.

To describe an example of a method for manufacturing the display region 260A having a two-layer structure below, the display unit 250 in the lower layer is referred to as the display unit 250b, and the display units 250 in the upper layer are referred to as a display unit 250a[1] and a display unit 250a[2].

Figure 20B:
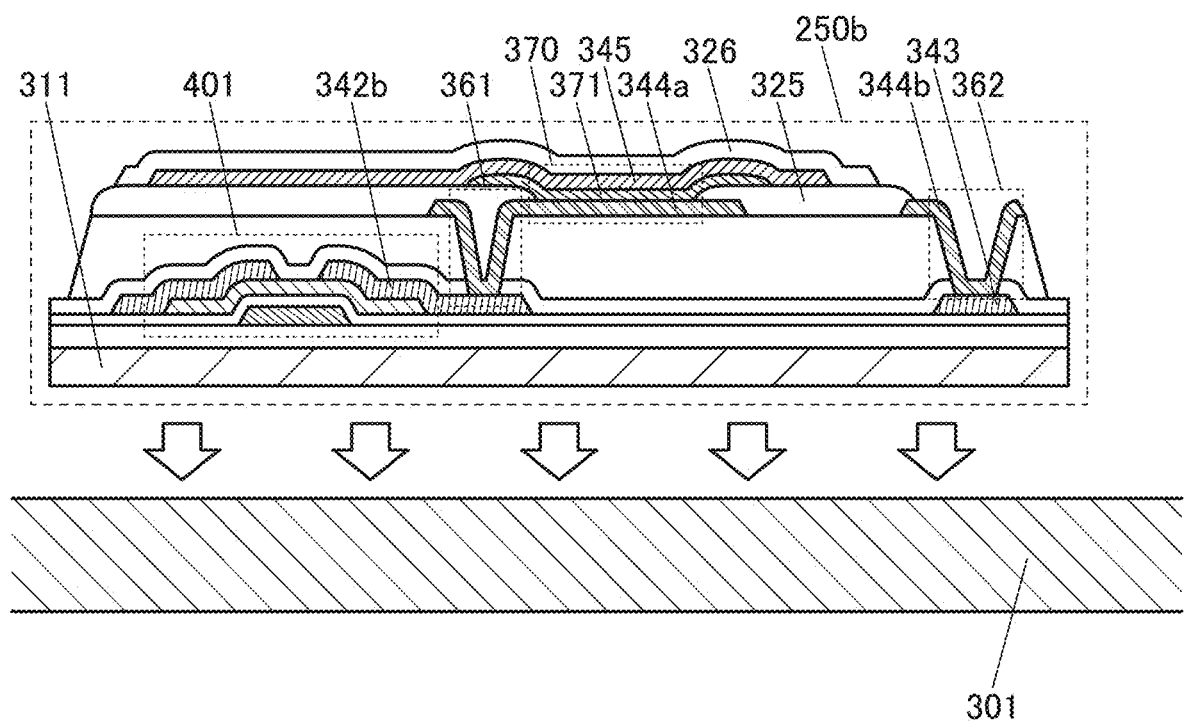

The display unit 250b is provided over a support substrate 301 (see FIG. 20B). The substrate 311 is bonded to the support substrate 301 preferably with an adhesive resin layer or the like. Note that the resin layer is not illustrated in FIG. 20B. The support substrate 301 is included in the insulator 240.

The support substrate 301 is formed using an elastic material. For example, the support substrate 301 can be formed using a thermosetting elastomer, a thermoplastic elastomer, or the like.

Figure 21A:
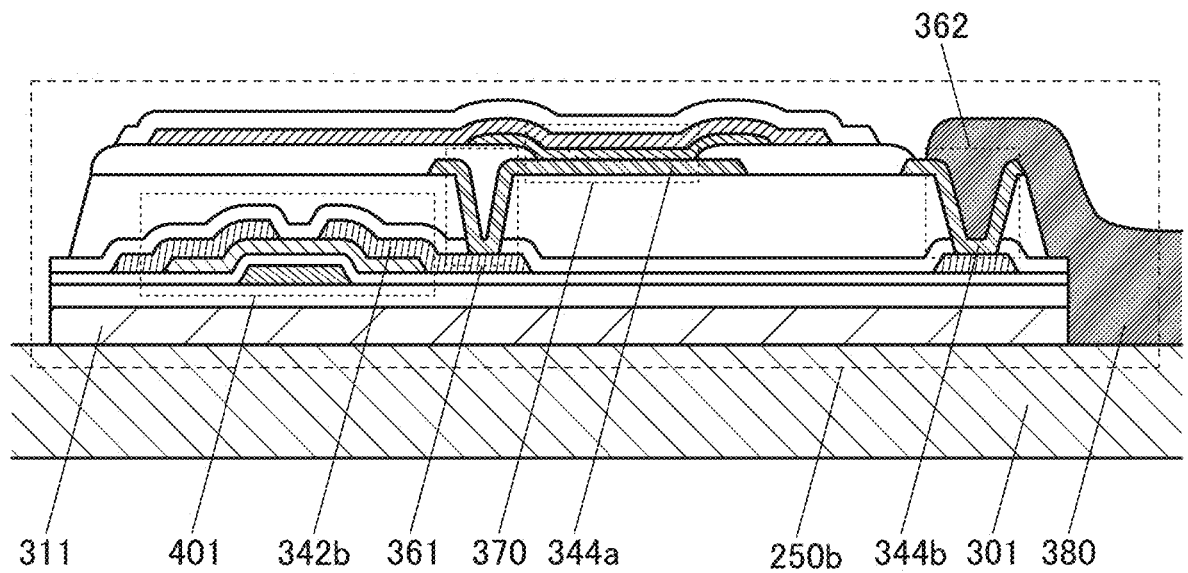
FIGS. 21A and 21B are cross-sectional views illustrating an example of a method for manufacturing a display device.

Next, a conductor 380 is formed over the conductor 344b and the support substrate 301 (see FIG. 21A). The conductor 380 corresponds to the signal line, the gate line, or the like described in the structure examples.

The conductor 380 preferably has elasticity. The conductor 380 can be formed using a conductive paste of silver, carbon, copper, or the like, a conductive polymer such as polythiophene, or the like.

Figure 21B:
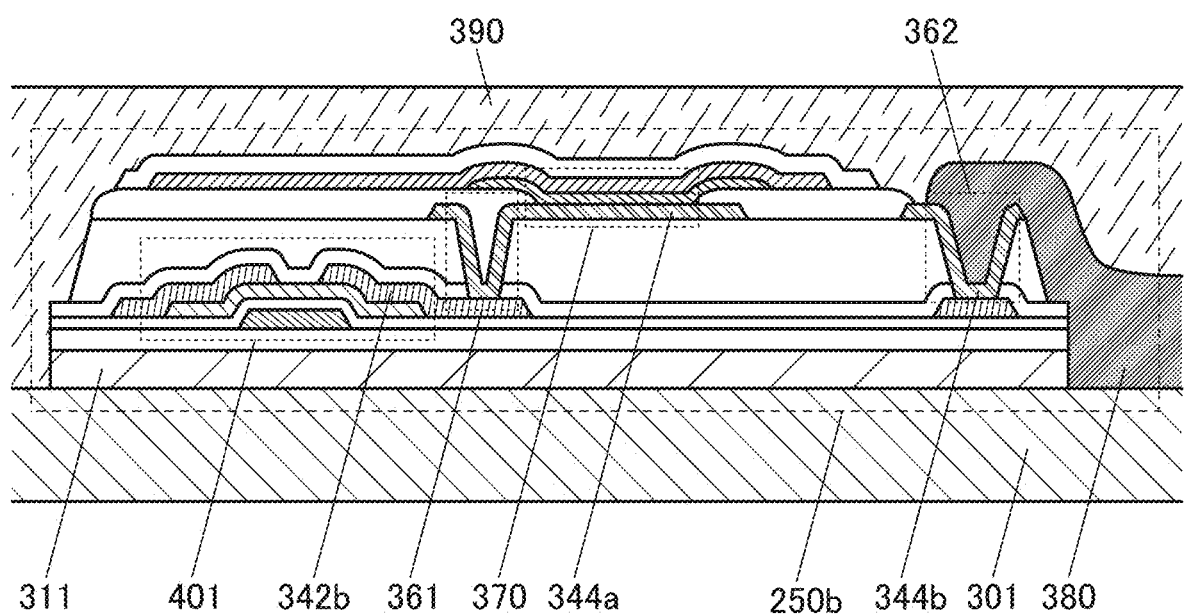

Then, a protective layer 390 is formed over the support substrate 301 and the display unit 250b over the substrate 311 (see FIG. 21B). Note that the protective layer 390 is included in the insulator 240.

As the protective layer 390, a light-transmitting and elastic insulator is used. For example, the protective layer 390 can be formed using vinyl chloride, a polyurethane resin, or the like. In addition to a light-transmitting property and elasticity, the protective layer 390 preferably has adhesiveness for bonding the support substrate 301 to the display unit 250b.

Figure 22:
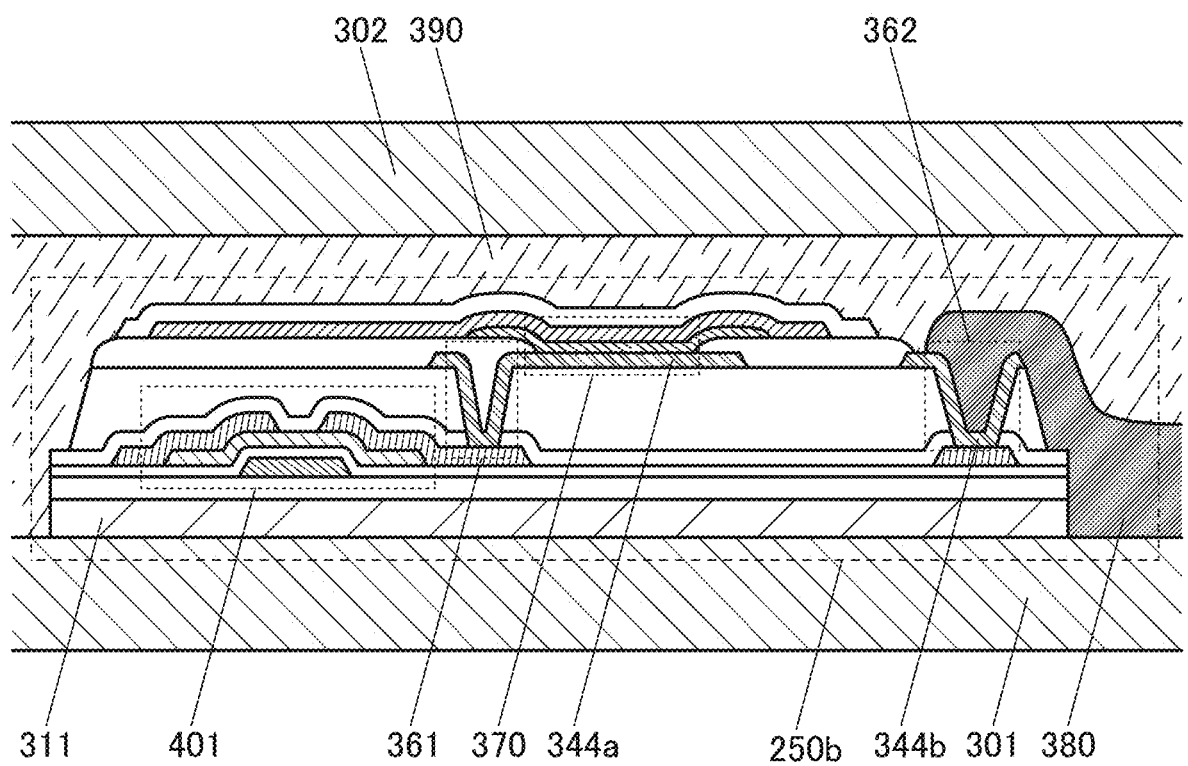
FIG. 22 is a cross-sectional view illustrating an example of a method for manufacturing a display device.

Next, a substrate 302 is provided over the protective layer 390 (see FIG. 22). The substrate 302 is formed using a light-transmitting and elastic material. In addition, the degrees of elasticity of the substrate 302 and the support substrate 301 are preferably different from each other. Note that the substrate 302 is included in the insulator 240.

Figure 23:
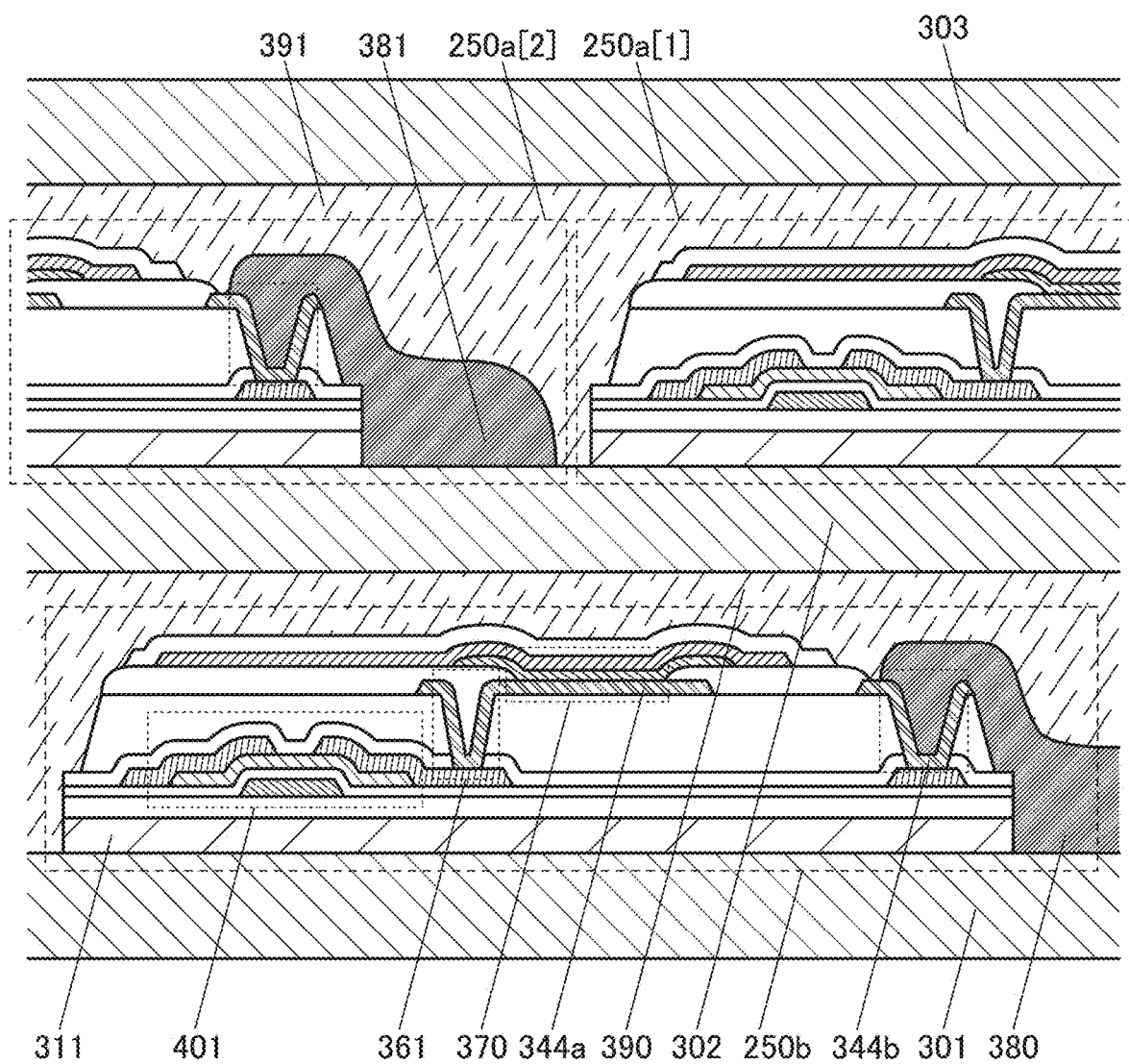
FIG. 23 is a cross-sectional view illustrating an example of a method for manufacturing a display device.

Then, the display units 250a[1] and 250a[2], which can be formed in a manner similar to that of the display unit 250b, are formed over the substrate 302 (see FIG. 23). The display units 250a[1] and 250a[2] each include a transistor, a light-emitting element, and a wiring as in the display unit 250b.

The display units 250a[1] and 250a[2] are preferably formed over the substrate 302 so that part of the light-emitting element 370 of the display unit 250b overlaps with part of the gap between the display units 250a[1] and 250a[2].

After the formation of the display units 250a[1] and 250a[2], a conductor 381 is formed as a wiring in a manner similar to that of the conductor 380 electrically connected to the display unit 250b. For materials that can be used for the conductor 381, refer to the description of the materials that can be used for the conductor 380.

After the formation of the conductor 381, a protective layer 391 is formed over the display units 250a[1] and 250a[2], the conductor 381, and the substrate 302 in a manner similar to that of the protective layer 390 formed over the display unit 250b. Note that the materials that can be used for the protective layer 391 preferably have the degree of elasticity different from that of elasticity of the materials that can be used for the protective layer 390. The protective layer 391 is included in the insulator 240.

After the formation of the protective layer 391, a substrate 303 is provided over the protective layer 391 in a manner similar to that of the substrate 302 provided over the protective layer 390. The substrate 303 is formed using a light-transmitting and elastic material. In addition, the degrees of elasticity of the substrate 303, the support substrate 301, and the substrate 302 are preferably different from each other. Note that the substrate 303 is included in the insulator 240. In the example of a method for manufacturing the display region 260A, the substrate 303 is not necessarily provided.

Through the above steps, the display region 260A can be manufactured.

The display regions 261A and 262A can be manufactured in a manner similar to that of the display region 260A by referring to the above-described manufacturing method example.

Although the display unit 250 is formed over the support substrate 301 in this manufacturing method example, a method for manufacturing the display device of one embodiment of the present invention is not limited thereto.

For example, before the transistor 401, the light-emitting element 370, and the like are formed, the substrate 311 may be provided over the support substrate 301. In this case, the deposition temperature of the insulators, conductors, metal oxides, and the like included in the display unit 250 and the temperature of the heat treatment performed on the transistor 401 and the like are preferably lower than the upper temperature limits of the support substrate 301 and the substrate 311. For another example, instead of the substrate 311 provided over the support substrate 301, an insulator formed by a sputtering method, a pulsed laser deposition (PLD) method, a plasma-enhanced chemical vapor deposition (PECVD) method, a thermal CVD method, an atomic layer deposition (ALD) method, a vacuum evaporation method, or the like may be used. In that case, the insulator may be formed using a material different from that of the insulator 321 and stacked with the insulator 321; alternatively, the insulators may be formed using the same material as the insulator 321 and successively formed.

Figure 24A:
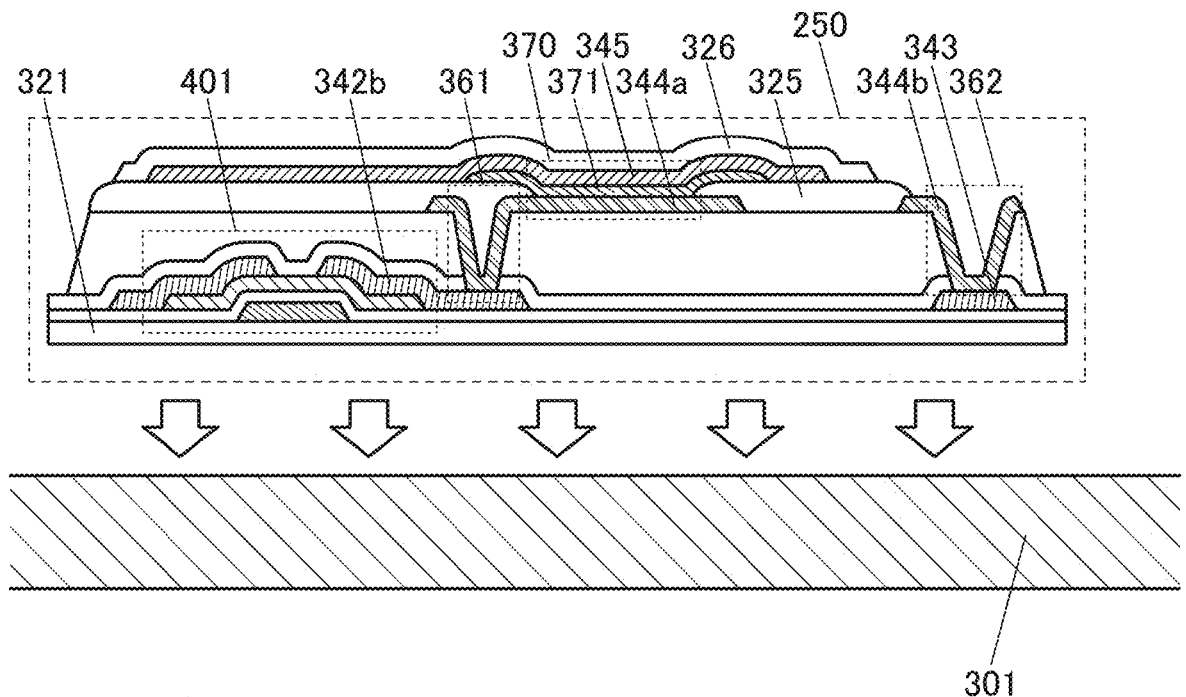
FIGS. 24A and 24B are cross-sectional views illustrating an example of a method for manufacturing a display device.

For example, one embodiment of the present invention may employ a manufacturing method in which the display unit 250 is formed over a polyimide film or the like that is provided over the substrate 311 in advance by application of polyimide or the like as an organic film, and the display unit 250 is separated from the polyimide film and transferred to the support substrate 301. After the display unit 250 is transferred to the support substrate 301, the conductor 380 and the protective layer 390 may be formed. Instead of the organic film such as a polyimide film, an inorganic film such as a tungsten film can be used, in some cases. FIG. 24A illustrates a step of providing the display unit 250, which is separated from the organic film or the inorganic film, over the support substrate 301. In some cases, the residue of the organic film or the inorganic film are attached to the insulator 321 on the bottom surface of the display unit 250 separated from the organic film or the inorganic film.

Figure 24B:
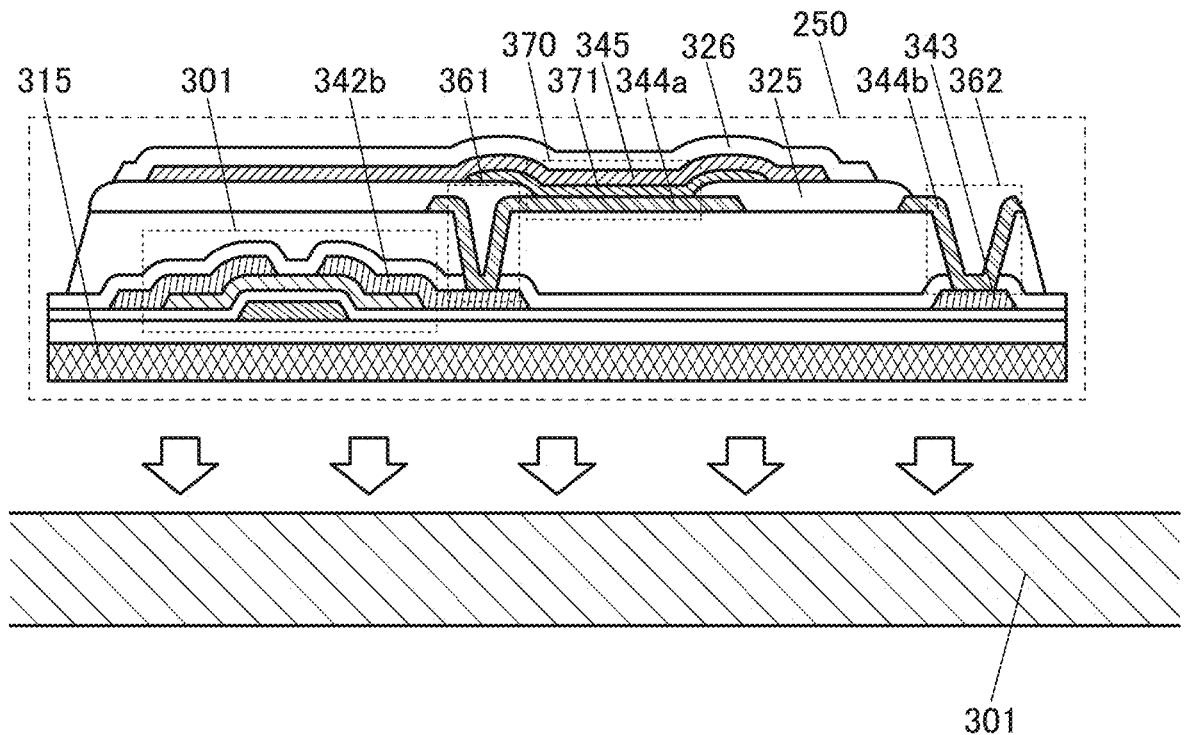

After the display unit 250 is separated by the above-described method, the display unit 250 may be transferred to a flexible substrate 315 and then the substrate 315 may be bonded to the support substrate 301 (see FIG. 24B). In that case, the circuit 251 is positioned on the substrate 315; thus, the substrate 315 is preferably formed using a material with low elasticity, which prevents the circuit 251 from being damaged (e.g., a crack) by the stretch of the substrate 315.

With this method, the display unit 250 is formed over the substrate provided with the polyimide film or the like; thus, the heat treatment for forming the display unit 250 does not need to be performed on the support substrate 301 and the substrate 315 to which the display unit 250 is transferred. That is, the temperatures of the heat treatment performed on the insulators, conductors, and metal oxides included in the display unit 250 are not limited to the upper temperature limits of the support substrate 301 and the substrate 315 to which the display unit 250 is transferred. The support substrate 301 can be formed using a material with low heat resistance because the support substrate 301 is not affected by the heat treatment for forming the display unit 250.

The manufacturing method example described in this embodiment enables a display device whose display quality does not degrade even when the area of the display region is increased by the stretch.

Note that this embodiment can be combined with other embodiments and/or an example in this specification as appropriate.

Embodiment 4

In this embodiment, examples of electronic devices each including the display device 300 in Embodiment 3 are described.

Example 1

Figure 25A:
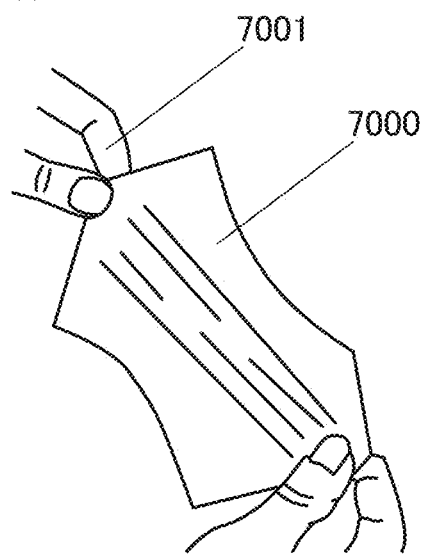
FIGS. 25A to 25D illustrate examples of electronic devices.

FIG. 25A illustrates an electronic device including the display device 300. An electronic device 7000 can be used as an information terminal or electronic paper, for example. The electronic device 7000 includes the display device 300 and thus can be stretched by pulling with fingers 7001, as illustrated in FIG. 25A. Owing to its elasticity, the electronic device 7000 can be attached to a structure body having a curved surface or the like. When the electronic device 7000 including the display device 300 as a light-emitting device is attached to a structure body having a curved surface or the like, the electronic device 7000 can be used as a lighting device.

Example 2

Figure 25B:
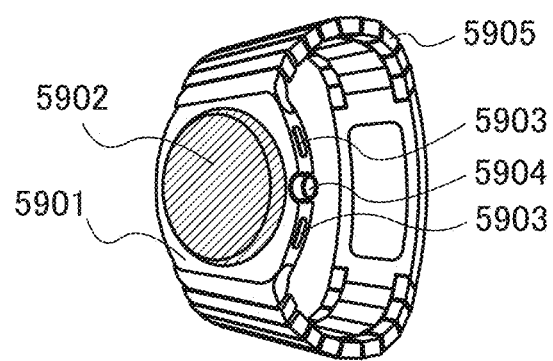

FIG. 25B illustrates a smart watch which is one of wearable terminals. The smart watch includes a housing 5901, a display portion 5902, operation buttons 5903, an operator 5904, a band 5905, and the like. The display device 300 can be used for the display portion 5902 of the smart watch. When the display portion 5902 has a convex surface, for example, the stretched display device 300 is attached to the convex surface, whereby the convex display portion 5902 can be obtained.

Example 3

Figure 25C:
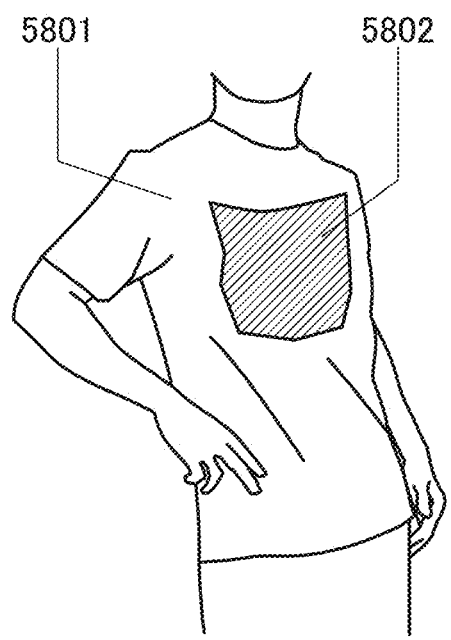

FIG. 25C illustrates clothing to which the display device 300 is attached. Clothing 5801 includes a display portion 5802 and the like. The display device 300 can be used for the display portion 5802. Since the display device 300 can be stretched, the display device 300 can be attached to the elastic clothing 5801. In addition, the display portion 5802 can be used as a lighting device.

FIG. 25C illustrates an example in which the display portion 5802 is attached to a chest portion of the clothing 5801; however, one embodiment of the present invention is not limited to this example. For example, the display portion 5802 may be attached to a sleeve portion, a belly portion, a back portion, and the like. Although the clothing 5801 in FIG. 25C is a shirt, the clothing 5801 can also be clothes such as a jacket, underwear, and pants, accessories such as shoes, a hat, and a wristband, and the like.

Example 4

Figure 25D:
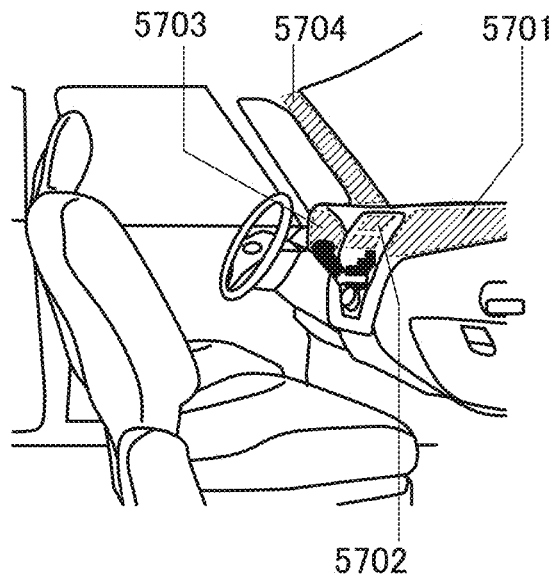

FIG. 25D illustrates a windshield and its vicinity inside a car, which is one of moving vehicles. The display device 300 can be used for display panels 5701, 5702, and 5703 attached to a dashboard, a display panel 5704 attached to a pillar, and the like illustrated in FIG. 25D.

The display panels 5701 to 5703 can display a variety of kinds of information such as navigation information, a speedometer, a tachometer, a mileage, a fuel meter, a gearshift indicator, and air-condition setting. The content, layout, or the like of the display on the display panels can be changed freely to suit the user's preferences, so that the design can be improved. The display panels 5701 to 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably. The display panel 5704 can also be used as a lighting device.

Example 5

Figure 26A:
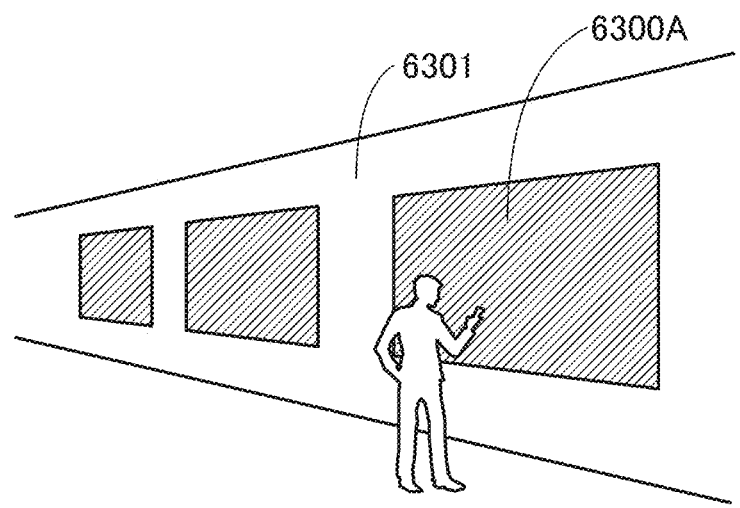
FIGS. 26A and 26B illustrate examples of electronic devices.
Figure 26B:
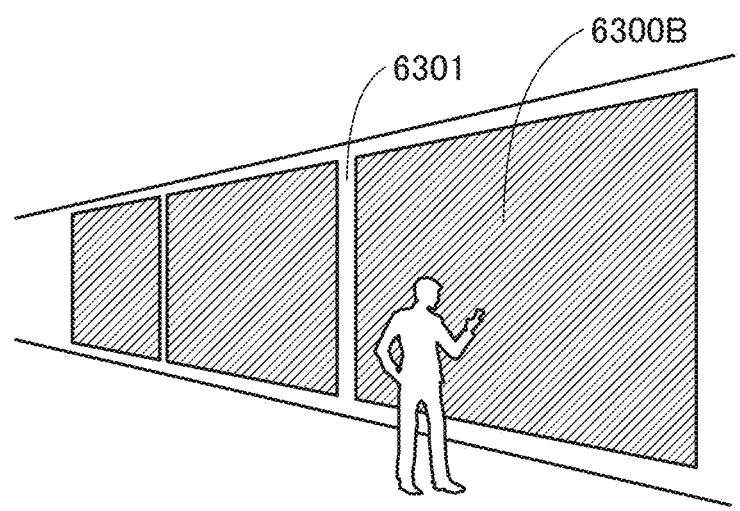

FIGS. 26A and 26B each illustrate an example of a digital signage that can be attached to a wall. FIG. 26A illustrates a digital signage 6300A attached to a wall 6301.

Here, the case where the digital signage 6300A includes the display device 300 in Embodiment 3 is described. The digital signage 6300A in FIG. 26A that includes the display device 300 can change its shape so as to be a digital signage 6300B in FIG. 26B by the stretch. The digital signage 6200A in FIGS. 11A and 11B in Embodiment 2 can be stretched in the vertical direction or the horizontal direction, and the aspect ratio of the digital signage 6300A (6300B) in FIGS. 26A and 26B can be freely changed depending on the contents displayed on the digital signage.

Note that this embodiment can be combined with other embodiments and/or an example in this specification as appropriate.

Embodiment 5

In this embodiment, light-emitting elements that can be used for the display units in Embodiment 1 are described with reference to FIGS. 27A to 27D.

<Basic Structure of Light-Emitting Element>

Figure 27A:
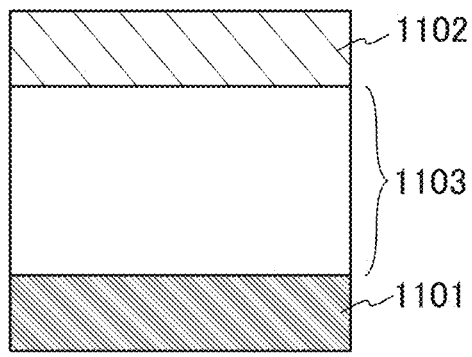
FIGS. 27A to 27D illustrate structures of light-emitting elements.

A basic structure of a light-emitting element will be described. FIG. 27A illustrates a light-emitting element including, between a pair of electrodes, an EL layer having a light-emitting layer. Specifically, the EL layer 1103 is provided between a first electrode 1101 and a second electrode 1102.

Figure 27B:
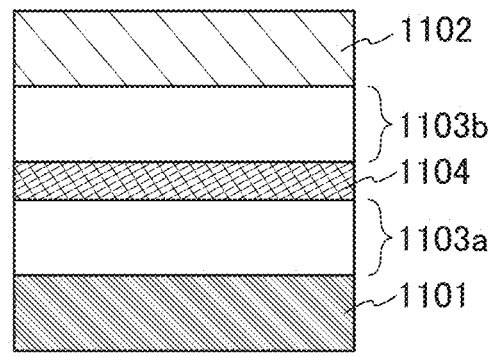

FIG. 27B illustrates a light-emitting element that has a stacked-layer structure (tandem structure) in which a plurality of EL layers (two EL layers 1103a and 1103b in FIG. 27B) are provided between a pair of electrodes and a charge-generation layer 1104 is provided between the EL layers. With the use of such a tandem light-emitting element, a light-emitting device which can be driven at low voltage with low power consumption can be obtained.

The charge-generation layer 1104 has a function of injecting electrons into one of the EL layers (1103a or 1103b) and injecting holes into the other of the EL layers (1103b or 1103a) when voltage is applied between the first electrode 1101 and the second electrode 1102. Thus, when voltage is applied in FIG. 27B such that the potential of the first electrode 1101 is higher than that of the second electrode 1102, the charge-generation layer 1104 injects electrons into the EL layer 1103a and injects holes into the EL layer 1103b.

Note that in terms of light extraction efficiency, the charge-generation layer 1104 preferably has a property of transmitting visible light (specifically, the charge-generation layer 1104 has a visible light transmittance of 40% or more). The charge-generation layer 1104 functions even when it has lower conductivity than the first electrode 1101 or the second electrode 1102.

Figure 27C:
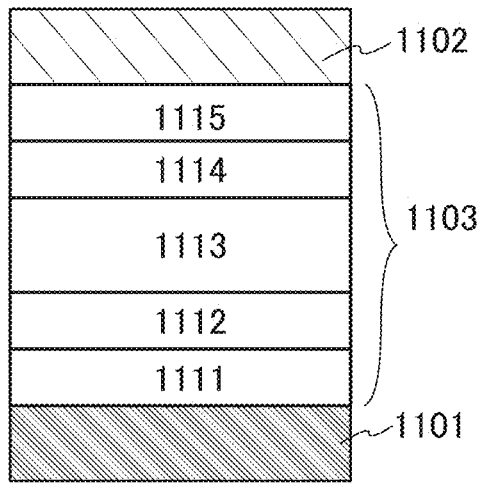

FIG. 27C illustrates a stacked-layer structure of the EL layer 1103 in the light-emitting element which can be used in the display device of one embodiment of the present invention. In this case, the first electrode 1101 is regarded as functioning as an anode. The EL layer 1103 has a structure in which a hole-injection layer 1111, a hole-transport layer 1112, a light-emitting layer 1113, an electron-transport layer 1114, and an electron-injection layer 1115 are stacked in this order over the first electrode 1101. Even in the case where a plurality of EL layers are provided as in the tandem structure illustrated in FIG. 27B, the layers in each EL layer are sequentially stacked from the anode side as described above. When the first electrode 1101 is a cathode and the second electrode 1102 is an anode, the stacking order is reversed.

The light-emitting layer 1113 included in the EL layers (1103, 1103a, and 1103b) contains an appropriate combination of a light-emitting substance and a plurality of substances, so that fluorescence or phosphorescence of a desired emission color can be obtained. The light-emitting layer 1113 may have a stacked-layer structure having different emission colors. In that case, the light-emitting substance and other substances are different between the stacked light-emitting layers. Alternatively, the plurality of EL layers (1103a and 1103b) in FIG. 27B may exhibit their respective emission colors. Also in that case, the light-emitting substance and other substances are different between the light-emitting layers.

In the light-emitting element of one embodiment of the present invention, for example, a micro optical resonator (microcavity) structure in which the first electrode 1101 is a reflective electrode and the second electrode 1102 is a transflective electrode can be employed in FIG. 27C, whereby light emission from the light-emitting layer 1113 in the EL layer 1103 can be resonated between the electrodes and light emission obtained through the second electrode 1102 can be intensified.

Note that when the first electrode 1101 of the light-emitting element is a reflective electrode having a structure in which a reflective conductive material and a light-transmitting conductive material (transparent conductive film) are stacked, optical adjustment can be performed by controlling the thickness of the transparent conductive film. Specifically, when the wavelength of light obtained from the light-emitting layer 1113 is $\lambda$, the distance between the first electrode 1101 and the second electrode 1102 is preferably adjusted to around $m\lambda/2$ (m is a natural number).

To amplify desired light (wavelength: $\lambda$) obtained from the light-emitting layer 1113, the optical path length from the first electrode 1101 to a region where the desired light is obtained in the light-emitting layer 1113 (light-emitting region) and the optical path length from the second electrode 1102 to the region where the desired light is obtained in the light-emitting layer 1113 (light-emitting region) are preferably adjusted to around $(2m'+1)\lambda/4$ (m' is a natural number). Here, the light-emitting region means a region where holes and electrons are recombined in the light-emitting layer 1113.

By such optical adjustment, the spectrum of specific monochromatic light obtained from the light-emitting layer 1113 can be narrowed and light emission with high color purity can be obtained.

In that case, the optical path length between the first electrode 1101 and the second electrode 1102 is, to be exact, the total thickness from a reflective region in the first electrode 1101 to a reflective region in the second electrode 1102. However, it is difficult to exactly determine the reflective regions in the first electrode 1101 and the second electrode 1102; thus, it is assumed that the above effect can be sufficiently obtained wherever the reflective regions may be set in the first electrode 1101 and the second electrode 1102. Furthermore, the optical path length between the first electrode 1101 and the light-emitting layer 1113 emitting the desired light is, to be exact, the optical path length between the reflective region in the first electrode 1101 and the light-emitting region in the light-emitting layer 1113 emitting the desired light. However, it is difficult to precisely determine the reflective region in the first electrode 1101 and the light-emitting region in the light-emitting layer emitting the desired light; thus, it is assumed that the above effect can be sufficiently obtained wherever the reflective region and the light-emitting region may be set in the first electrode 1101 and the light-emitting layer emitting the desired light.

The light-emitting element in FIG. 27C has a microcavity structure, so that light (monochromatic light) with different wavelengths can be extracted even if the same EL layer is used. Thus, separate coloring for obtaining a plurality of emission colors (e.g., R, G, and B) is not necessary. Therefore, high resolution can be easily achieved. Note that a combination with coloring layers (color filters) is also possible. Furthermore, emission intensity of light with a specific wavelength in the front direction can be increased, whereby power consumption can be reduced.

In the light-emitting element of one embodiment of the present invention, at least one of the first electrode 1101 and the second electrode 1102 is a light-transmitting electrode (e.g., a transparent electrode or a transflective electrode). In the case where the light-transmitting electrode is a transparent electrode, the transparent electrode has a visible light transmittance of higher than or equal to 40%. In the case where the light-transmitting electrode is a transflective electrode, the transflective electrode has a visible light reflectance of higher than or equal to 20% and lower than or equal to 80%, and preferably higher than or equal to 40% and lower than or equal to 70%. These electrodes preferably have a resistivity of $1\times10^{-2}$ $\Omega$cm or less.

Furthermore, when one of the first electrode 1101 and the second electrode 1102 is a reflective electrode in the light-emitting element of one embodiment of the present invention, the visible light reflectance of the reflective electrode is higher than or equal to 40% and lower than or equal to 100%, and preferably higher than or equal to 70% and lower than or equal to 100%. This electrode preferably has a resistivity of $1\times10^{-2}$ $\Omega$cm or less.

<Specific Structure and Fabrication Method of Light-Emitting Element>

Specific structures and specific fabrication methods of light-emitting elements of embodiments of the present invention will be described. Here, a light-emitting element having the tandem structure in FIG. 27B and a microcavity structure will be described with reference to FIG. 27D. In the light-emitting element in FIG. 27D, the first electrode 1101 is formed as a reflective electrode and the second electrode 1102 is formed as a transflective electrode. Thus, a single-layer structure or a stacked-layer structure can be formed using one or more kinds of desired electrode materials. Note that the second electrode 1102 is formed after formation of the EL layer 1103*b*, with the use of a material selected as described above. For fabrication of these electrodes, a sputtering method or a vacuum evaporation method can be used.

«First Electrode and Second Electrode»

As materials used for the first electrode 1101 and the second electrode 1102, any of the following materials can be used in an appropriate combination as long as the functions of the electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 27D:
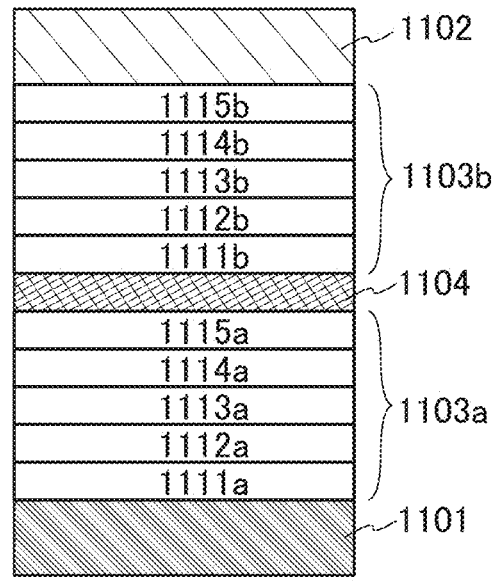

In the light-emitting element in FIG. 27D, when the first electrode 1101 is an anode, a hole-injection layer 1111*a* and a hole-transport layer 1112*a* of the EL layer 1103*a* are sequentially stacked over the first electrode 1101 by a vacuum evaporation method. After the EL layer 1103*a* and the charge-generation layer 1104 are formed, a hole-injection layer 1111*b* and a hole-transport layer 1112*b* of the EL layer 1103*b* are sequentially stacked over the charge-generation layer 1104 in a similar manner.

«Hole-Injection Layer and Hole-Transport Layer»

The hole-injection layers (1111*a* and 1111*b*) inject holes from the first electrode 1101 that is an anode to the EL layers (1103*a* and 1103*b*) and each contain a material with a high hole-injection property.

As examples of the material with a high hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (an electron-accepting material) can also be used. In that case, the acceptor material extracts electrons from the hole-transport material, so that holes are generated in the hole-injection layers (1111a and 1111b) and the holes are injected into the light-emitting layers (1113a and 1113b) through the hole-transport layers (1112a and 1112b). Note that each of the hole-injection layers (1111a and 1111b) may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layers (1112a and 1112b) transport the holes, which are injected from the first electrode 1101 by the hole-injection layers (1111a and 1111b), to the light-emitting layers (1113a and 1113b). Note that the hole-transport layers (1112a and 1112b) each contain a hole-transport material. It is particularly preferable that the HOMO level of the hole-transport material included in the hole-transport layers (112a and 1112b) be the same as or close to that of the hole-injection layers (1111a and 1111b).

Examples of the acceptor material used for the hole-injection layers (1111a and 1111b) include an oxide of a metal belonging to any of Groups 4 to 8 of the periodic table. Specifically, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layers (1111a and 1111b) and the hole-transport layers (1112a and 1112b) are preferably substances with a hole mobility of greater than or equal to $10^{-6}$ cm$^2$/Vs. Note that other substances may be used as long as the substances have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenyl-carbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-(3-[3-(9-phenyl-9H-fluoren-9-yl)phenyl]phenyl)dibenzofran (abbreviation: mmDBFFLBi-II).

A high molecular compound such as poly(N-vinylcarbazole) (abbreviation: PVK), poly(4-vinyltriphenylamine) (abbreviation: PVTPA), poly[N-(4-(N'-[4-(4-diphenylamino)phenyl]phenyl-N'-phenylamino)phenyl)methacrylamide] (abbreviation: PTPDMA), or poly[N,N'-bis(4-butylphenyl)-N,N'-bis(phenyl)benzidine](abbreviation: Poly-TPD) can also be used.

Note that the hole-transport material is not limited to the above examples and may be one of or a combination of various known materials when used for the hole-injection layers (1111a and 1111b) and the hole-transport layers (1112a and 1112b).

Next, in the light-emitting element in FIG. 27D, the light-emitting layer 1113a is formed over the hole-transport layer 1112a of the EL layer 1103a by a vacuum evaporation method. After the EL layer 1103a and the charge-generation layer 1104 are formed, the light-emitting layer 1113b is formed over the hole-transport layer 1112b of the EL layer 1103b by a vacuum evaporation method.

«Light-Emitting Layer»

The light-emitting layers (1113a and 1113b) each contain a light-emitting substance. Note that as the light-emitting substance, a substance whose emission color is blue, violet, bluish violet, green, yellowish green, yellow, orange, red, or the like is appropriately used. When the plurality of light-emitting layers (1113a and 1113b) are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed.

The light-emitting layers (1113a and 1113b) may each contain one or more kinds of organic compounds (a host material and an assist material) in addition to a light-emitting substance (guest material). As the one or more kinds of organic compounds, one or both of the hole-transport material and the electron-transport material described in this embodiment can be used.

There is no particular limitation on light-emitting substances that can be used for the light-emitting layers (1113a and 1113b), and a light-emitting substance that converts singlet excitation energy into light emission in the visible light range or a light-emitting substance that converts triplet excitation energy into light emission in the visible light range can be used. Examples of the light-emitting substance are given below.

As an example of the light-emitting substance that converts singlet excitation energy into light emission, a substance that emits fluorescence (fluorescent material) can be given. Examples of the substance that emits fluorescence include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPm), N,N'-diphenyl-N,N'-bis[4-(9-phenyl-9H-fluoren-9-yl)phenyl]pyrene-1,6-diamine (abbreviation: 1,6FLPAPm), N,N'-bis(dibenzofuran-2-yl)-N,N'-diphenylpyrene-1,6-diamine (abbreviation: 1,6FrAPm), N,N'-bis(dibenzothiophen-2-yl)-N,N'-diphenylpyrene-1,6-diamine (abbreviation: 1,6ThAPm), N,N'-(pyrene-1,6-diyl)bis[(N-phenylbenzo[b]naphtho[1,2-d]furan)-6-amine](abbreviation: 1,6BnfAPm), N,N'-(pyrene-1,6-diyl)bis[(N-phenylbenzo[b]naphtho[1,2-d]furan)-8-amine] (abbreviation: 1,6BnfAPm-02), and N,N'-(pyrene-1,6-diyl)bis[(6,N-diphenylbenzo[b]naphtho[1,2-d]furan)-8-amine] (abbreviation: 1,6BnfAPm-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N"-(2-tert-butylanthracene-9,10-diyldi-4,1-phenylene)bis[N,N',N'-triphenyl-1,4-phenylenedia mine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

As examples of a light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit the respective emission colors (emission peaks) and thus, any of them is appropriately selected according to need.

As examples of a phosphorescent material which emits blue or green light and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis(2-[3',5'-bis(trifluoromethyl)phenyl]pyridinato-N,C$^{2'}$)iridium(III) picolinate (abbreviation: [Ir(CF3ppy)$_2$(pic)]), and bis[2-(4',6'-difluorophenyl)pyridinato-N,C$^{2'}$]iridium(III) acetylacetonate (abbreviation: FIr(acac)); and the like can be given.

As examples of a phosphorescent material which emits green or yellow light and whose emission spectrum has a peak wavelength at greater than or equal to 495 nm and less than or equal to 590 nm, the following substances can be given.

For example, organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(t-Buppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis(4,6-dimethyl-2-[6-(2,6-dimethylphenyl)-4-pyrimidinyl-κN3]phenyl-κC)iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]) can be given.

As examples of a phosphorescent material which emits yellow or red light and whose emission spectrum has a peak wavelength at greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(dlnpm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl}-2-pyrazinyl-κN]phenyl-κC)(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]) can be given.

As the organic compounds (the host material and the assist material) used in the light-emitting layers (1113a and 1113b), one or more kinds of substances having a larger energy gap than the light-emitting substance (the guest material) are used.

When the light-emitting substance is a fluorescent material, it is preferable to use an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-(4-(9-phenyl-9H-fluoren-9-yl)biphenyl-4'-yl)anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) which is higher than that of the light-emitting substance is preferably selected. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-(4-[4-(10-phenyl-9-anthryl)phenyl]phenyl)-9H- carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl) anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of organic compounds are used for the light-emitting layers (1113a and 1113b), it is preferable to use compounds that form an exciplex in combination with each other. In that case, although any of various organic compounds can be used in an appropriate combination, in order to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-(4-[3-(N-phenyl-9H-carbazol-3-yl)-9H-carbazol-9-yl]phenyl)-4,6-diphenyl-1,3,5-triazine (abbreviation: PCCzPTzn), 2-[4-(10H-phenoxazin-10-yl) phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that when a TADF material is used, the TADF material can be combined with another organic compound.

Then, in the light-emitting element in FIG. 27D, an electron-transport layer 1114a is formed over the light-emitting layer 1113a of the EL layer 1103a by a vacuum evaporation method. After the EL layer 1103a and the charge-generation layer 1104 are formed, an electron-transport layer 1114b is formed over the light-emitting layer 1113b of the EL layer 1103b by a vacuum evaporation method.

«Electron-Transport Layer»

The electron-transport layers (1114a and 1114b) transport the electrons, which are injected from the second electrode 1102 by the electron-injection layers (1115a and 1115b), to the light-emitting layers (1113a and 1113b). Note that the electron-transport layers (114a and 1114b) each contain an electron-transport material. It is preferable that the electron-transport materials included in the electron-transport layers (1114a and 1114b) be substances with an electron mobility of higher than or equal to $1 \times 10^{-6}$ cm$^2$/Vs. Note that other substances may also be used as long as the substances have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, bis[2-(2-hydroxyphenyl)benzoxazolato]zinc(II) (abbreviation: $Zn(BOX)_2$), and bis[2-(2-hydroxyphenyl)benzothiazolato]zinc (abbreviation: $Zn(BTZ)_2$), heteroaromatic compounds such as 2-(4-biphenylyl)-5-(4-tert-butylphenyl)-1,3,4-oxadiazole (abbreviation: PBD), OXD-7, 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl) phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

Each of the electron-transport layers (1114a and 1114b) is not limited to a single layer, but may be a stack of two or more layers each containing any of the above substances.

Next, in the light-emitting element in FIG. 27D, the electron-injection layer 1115a is formed over the electron-transport layer 1114a of the EL layer 1103a by a vacuum evaporation method. Subsequently, the EL layer 1103a and the charge-generation layer 1104 are formed, the components up to the electron-transport layer 1114b of the EL layer 1103b are formed, and then the electron-injection layer 1115b is formed thereover by a vacuum evaporation method.

«Electron-Injection Layer»

The electron-injection layers (1115a and 1115b) each contain a substance having a high electron-injection property. The electron-injection layers (1115a and 1115b) can each be formed using an alkali metal, an alkaline earth metal, or a compound thereof, such as lithium fluoride (LiF), cesium fluoride (CsF), calcium fluoride ($CaF_2$), or lithium oxide ($LiO_x$). A rare earth metal compound like erbium fluoride ($ErF_3$) can also be used. Electrode may also be used for the electron-injection layers (1115a and 1115b). Examples of the electride include a substance in which electrons are added at high concentration to calcium oxide-aluminum oxide. Any of the substances for forming the electron-transport layers (1114a and 1114b), which are given above, can also be used.

A composite material in which an organic compound and an electron donor (donor) are mixed may also be used for the electron-injection layers (1115a and 1115b). Such a composite material is excellent in an electron-injection property and an electron-transport property because electrons are generated in the organic compound by the electron donor. The organic compound here is preferably a material excellent in transporting the generated electrons; specifically, for example, the electron-transport materials for forming the electron-transport layers (1114a and 1114b) (e.g., a metal complex or a heteroaromatic compound) can be used. As the electron donor, a substance showing an electron-donating property with respect to the organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and a lithium oxide, a calcium oxide, a barium oxide, and the like can be given. Alternatively, a Lewis base such as magnesium oxide can be used. Further alternatively, an organic compound such as tetrathiafulvalene (abbreviation: TTF) can be used.

In the case where light obtained from the light-emitting layer 1113b is amplified, for example, the optical path length between the second electrode 1102 and the light-emitting layer 1113b is preferably less than one fourth of the wavelength X of light emitted from the light-emitting layer 1113b. In that case, the optical path length can be adjusted by changing the thickness of the electron-transport layer 1114b or the electron-injection layer 1115b.

«Charge-Generation Layer»

The charge-generation layer 1104 has a function of injecting electrons into the EL layer 1103a and injecting holes into the EL layer 1103b when voltage is applied between the first electrode (anode) 1101 and the second electrode (cathode) 1102. The charge-generation layer 1104 may have either a structure in which an electron acceptor (acceptor) is added to a hole-transport material or a structure in which an electron donor (donor) is added to an electron-transport material. Alternatively, both of these structures may be stacked. Note that forming the charge-generation layer 1104 by using any of the above materials can suppress an increase in drive voltage caused by the stack of the EL layers.

In the case where the charge-generation layer 1104 has a structure in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: $F_4$-TCNQ), chloranil, and the like. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, rhenium oxide, or the like is used.

In the case where the charge-generation layer 1104 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

«Substrate»

The light-emitting element described in this embodiment can be formed over any of a variety of substrates. Note that the type of the substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For fabrication of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (1111a and 1111b), the hole-transport layers (1112a and 1112b), the light-emitting layers (1113a and 1113b), the electron-transport layers (1114a and 1114b), the electron-injection layers (1115a and 1115b)) included in the EL layers and the charge-generation layer 1104 of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layers (1111a and 1111b), the hole-transport layers (1112a and 1112b), the light-emitting layers (1113a and 1113b), the electron-transport layers (1114a and 1114b), and the electron-injection layers (1115a and 1115b)) that are included in the EL layers (1103a and 1103b) and the charge-generation layer 1104 in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

The structure described in this embodiment can be combined as appropriate with any of the structures described in the other embodiments or the example in this specification.

Embodiment 6

Figure 28A:
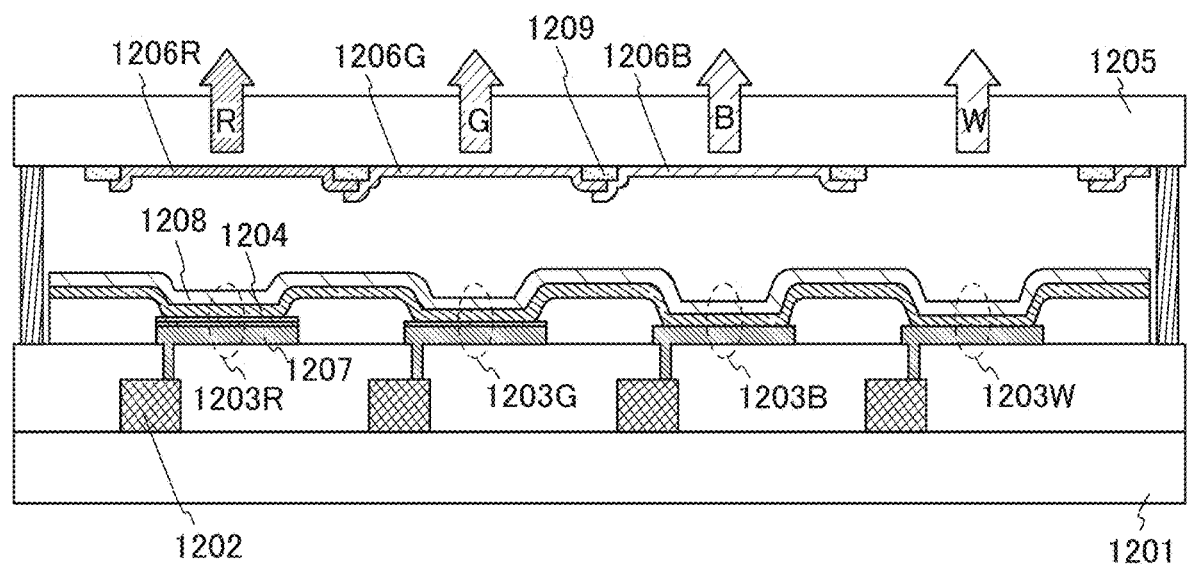
FIGS. 28A to 28C illustrate light-emitting devices.

In this embodiment, a light-emitting device of one embodiment of the present invention is described. Note that a light-emitting device illustrated in FIG. 28A is an active-matrix light-emitting device in which transistors (FETs) 1202 are electrically connected to light-emitting elements (1203R, 1203G, 1203B, and 1203W) over a first substrate 1201. The light-emitting elements (1203R, 1203G, 1203B, and 1203W) include a common EL layer 1204 and each have a microcavity structure in which the optical path length between electrodes is adjusted depending on the emission color of the light-emitting element. The light-emitting device is a top-emission light-emitting device in which light is emitted from the EL layer 1204 through color filters (1206R, 1206G, and 1206B) formed on a second substrate 1205.

The light-emitting device illustrated in FIG. 28A is fabricated such that a first electrode 1207 functions as a reflective electrode and a second electrode 1208 functions as a transflective electrode. Note that description in any of the other embodiments can be referred to as appropriate for electrode materials for the first electrode 1207 and the second electrode 1208.

Figure 28B:
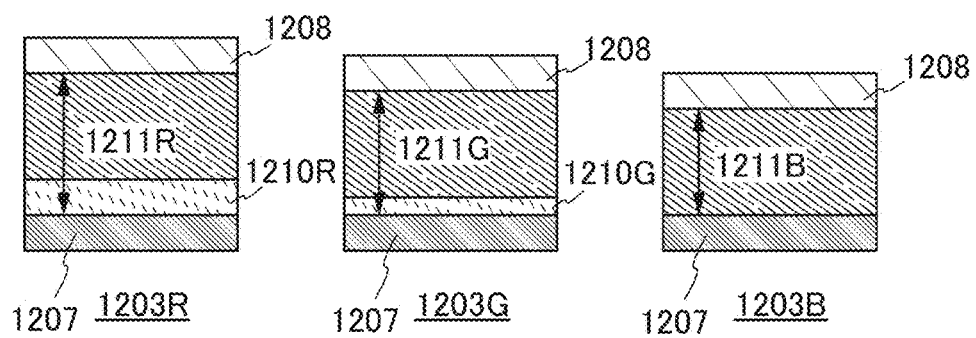

In the case where the light-emitting element 1203R functions as a red light-emitting element, the light-emitting element 1203G functions as a green light-emitting element, the light-emitting element 1203B functions as a blue light-emitting element, and the light-emitting element 1203W functions as a white light-emitting element in FIG. 28A, for example, a gap between the first electrode 1207 and the second electrode 1208 in the light-emitting element 1203R is adjusted to have an optical path length 1211R, a gap between the first electrode 1207 and the second electrode 1208 in the light-emitting element 1203G is adjusted to have an optical path length 1211G, and a gap between the first electrode 1207 and the second electrode 1208 in the light-emitting element 1203B is adjusted to have an optical path length 1211B as illustrated in FIG. 28B. Note that optical adjustment can be performed in such a manner that a conductive layer 1210R is stacked over the first electrode 1207 in the light-emitting element 1203R and a conductive layer 1210G is stacked over the first electrode 1207 in the light-emitting element 1203G as illustrated in FIG. 28B.

The second substrate 1205 is provided with the color filters (1206R, 1206G, and 1206B). Note that the color filters each transmit visible light in a specific wavelength range and blocks visible light in the other wavelength ranges. Thus, as illustrated in FIG. 28A, the color filter 1206R that transmits only light in the red wavelength range is provided in a position overlapping with the light-emitting element 1203R, whereby red light emission can be obtained from the light-emitting element 1203R. Furthermore, the color filter 1206G that transmits only light in the green wavelength range is provided in a position overlapping with the light-emitting element 1203G, whereby green light emission can be obtained from the light-emitting element 1203G. Moreover, the color filter 1206B that transmits only light in the blue wavelength range is provided in a position overlapping with the light-emitting element 1203B, whereby blue light emission can be obtained from the light-emitting element 1203B. Note that the light-emitting element 1203W can emit white light without a color filter. Note that a black layer (black matrix) 1209 may be provided at an end portion of each color filter. The color filters (1206R, 1206G, and 1206B) and the black layer 1209 may be covered with an overcoat layer formed using a transparent material.

Figure 28C:
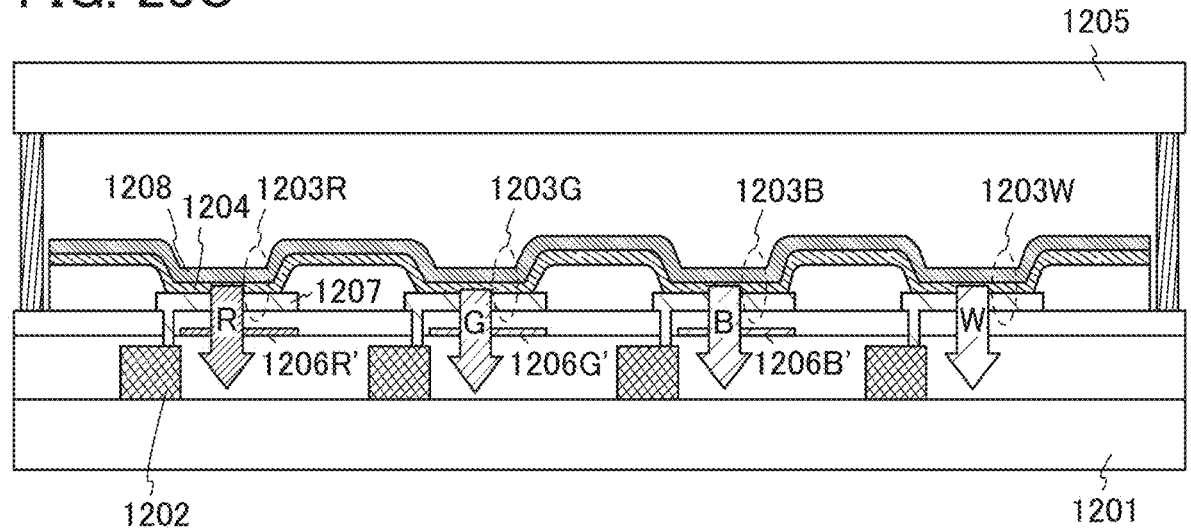

Although the light-emitting device in FIG. 28A has a structure in which light is extracted from the second substrate 1205 side (top emission structure), a structure in which light is extracted from the first substrate 1201 side where the FETs 1202 are formed (bottom emission structure) may be employed as illustrated in FIG. 28C. In the case of a bottom-emission light-emitting device, the first electrode 1207 is formed as a transflective electrode and the second electrode 1208 is formed as a reflective electrode. As the first substrate 1201, a substrate having at least a light-transmitting property is used. As illustrated in FIG. 28C, color filters (1206R', 1206G', and 1206B') are provided so as to be closer to the first substrate 1201 than the light-emitting elements (1203R, 1203G, and 1203B) are.

In FIG. 28A, the light-emitting elements are the red light-emitting element, the green light-emitting element, the blue light-emitting element, and the white light-emitting element; however, the light-emitting elements that can be used in the display device of one embodiment of the present invention are not limited to the above, and a yellow light-emitting element or an orange light-emitting element may be used. Note that description in any of the other embodiments can be referred to as appropriate for materials that are used for the EL layers (a light-emitting layer, a hole-injection layer, a hole-transport layer, an electron-transport layer, an electron-injection layer, a charge-generation layer, and the like) to fabricate each of the light-emitting elements. In that case, a color filter needs to be appropriately selected depending on the emission color of the light-emitting element.

With the above structure, a light-emitting device including light-emitting elements that exhibit a plurality of emission colors can be fabricated.

This embodiment can be implemented in an appropriate combination with any of the other embodiments and an example in this specification.

Example 1

In this example, a sample including a glass substrate over an elastic support substrate is described.

Figure 29:
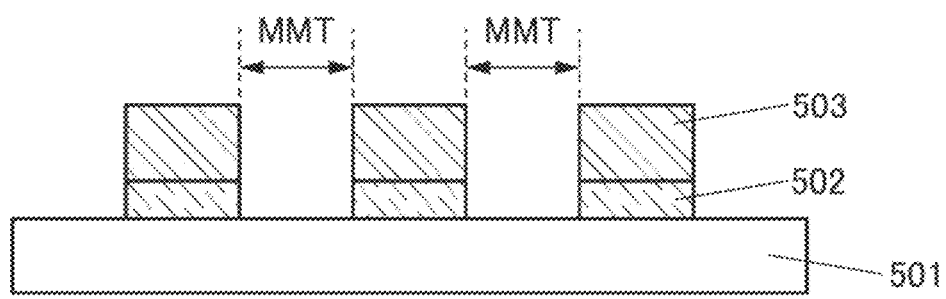
FIG. 29 is a cross-sectional view illustrating an example of a sample.

FIG. 29 schematically illustrates a sample in which substrates 503 are provided over a support substrate 501 at intervals MMT. Note that the support substrate 501 and each of the substrates 503 correspond to the support substrate 301 and the display unit 250b in the manufacturing method example in Embodiment 3 described with reference to FIG. 20B, respectively.

Adhesives 502 are positioned in regions where the substrates 503 overlap with the support substrate 501. The adhesives 502 are used for bonding the substrates 503 onto the support substrate 501.

Figure 30A:
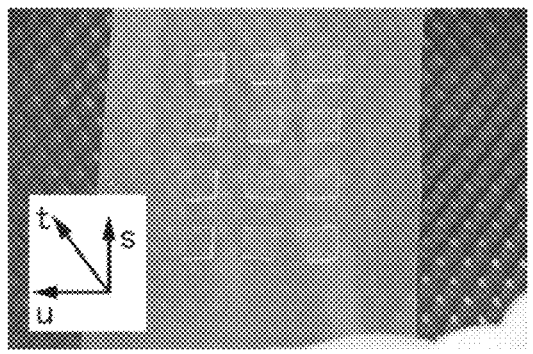
FIGS. 30A to 30D are each a photograph of a sample.

FIG. 30A is a photograph of a sample in which a silicone rubber sheet (KS05000, produced by Kyowa Industries, Inc.) was used as the support substrate 501, Super X No. 8008 (produced by CEMEDINE Co., Ltd.) was used as each of the adhesives 502, and glass substrates (AN100, produced by Asahi Glass Co., Ltd.) were used as the substrates 503. The substrates 503 were each processed into 10 mm square and provided in a matrix of four rows and three columns over the support substrate 501 with an interval MMT of 10 mm.

Figure 30B:
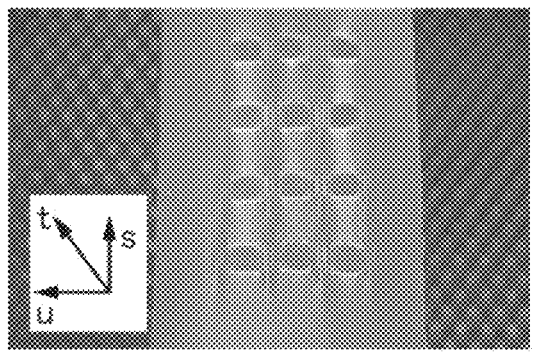
Figure 30C:
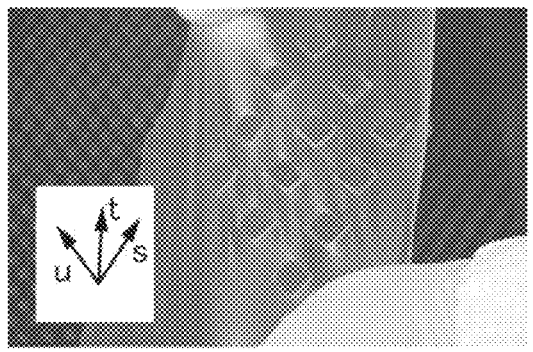
Figure 30D:
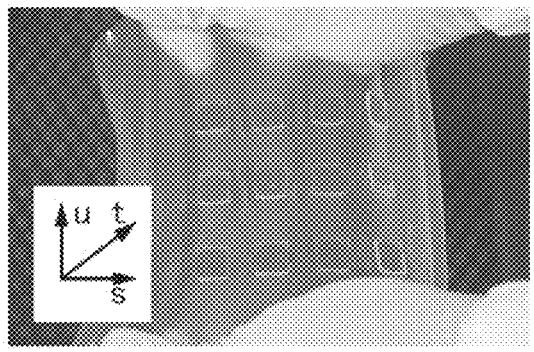

FIG. 30B is an image of the sample in FIG. 30A stretched in the s direction. FIG. 30C is an image of the sample in FIG. 30A stretched in the t direction. FIG. 30D is an image of the sample in FIG. 30A stretched in the u direction. Note that FIGS. 30B to 30D each show the sample stretched by 10 mm or more and 20 mm or less with the hands of an experimenter.

The sample in FIG. 30A formed using the above-described materials can be stretched without the separation of the substrates 503 from the support substrate 501 as shown in FIGS. 30B to 30D.

Note that the structures described in this example can be used in combination with any of the structures described in the other embodiments as appropriate.

REFERENCE NUMERALS

SLa[1]: signal line, SLa[2]: signal line, SLb[1]: signal line, SLb[2]: signal line, SL[1]: signal line, SL[2]: signal line, GLa[1]: gate line, GLa[2]: gate line, GLb[1]: gate line, GLb[2]: gate line, 30: unit, 31: unit, 32: connection region, 41: conductor, 41a: disk, 41b: column, 41c: disk, 42: conductor, 43: conductor, 44: conductor, 44a: disk, 44b: cylinder, 44c: disk, 45: conductor, 46: conductor, 47: conductor, 48: conductor, 51: code, 52: code, 53: code, 54: code, 60: shaft, 60A: shaft, 60a: shaft, 60b: shaft, 60c: shaft, 60d: shaft, 60e: shaft, 60f: shaft, 60g: shaft, 60h: shaft, 60i: shaft, 61: shaft, 62: shaft, 69b[1]: opening, 69b[2]: opening, 69c[1]: opening, 69c[2]: opening, 70: support unit, 72: connection region, 73: support, 80: display unit, 80A: display unit, 80B: display unit, 80a: display unit, 80b: display unit, 80c: display unit, 80d: display unit, 81: display portion, 81A: display portion, 82: connection region, 82a: connection region, 82b: connection region, 82c: connection region, 82d: connection region, 82e: connection region, 82f: connection region, 82g: connection region, 82h: connection region, 83: support, 83A: support, 85: display unit group, 85A: display unit group, 85B: display unit group, 85C: display unit group, 86: display unit group, 86A: display unit group, 86B: display unit group, 80[1]: display unit, 80[2]: display unit, 80[3]: display unit, 80[4]: display unit, 86b: wiring, 86c: wiring, 90: driver circuit unit, 91: driver circuit portion, 92: connection region, 93: support, 100: display device, 100a region, 100b: region, 100A: display device, 100B: display device, 101: display region, 101a: region, 101b: region, 102A: driver region, 102B: driver region, 105a: region, 105b: region, 106: region, 240: insulator, 250: display unit, 250a: display unit, 250a[1]: display unit, 250a[2]: display unit, 250b: display unit, 251: circuit, 252: light-emitting portion, 255: display unit, 256: circuit, 260: display region, 260A: display region, 260B: display region, 261A: display region, 261B: display region, 262A: display region, 262B: display region, 270: driver region, 270A: driver region, 271: driver circuit unit, 272: wiring, 280: driver region, 280A: driver region, 281: driver circuit unit, 282: wiring, 301: support substrate, 302: substrate, 303: substrate, 311: substrate, 315: substrate, 321: insulator, 322: insulator, 323: insulator, 324: insulator, 325: insulator, 326: insulator, 341: conductor, 342a: conductor, 342b: conductor, 343: conductor, 344a: conductor, 344b: conductor, 345: conductor, 350: metal oxide, 361: opening, 362: opening, 370: light-emitting element, 380: conductor, 381: conductor, 390: protective layer, 391: protective layer, 401: transistor, 501: support substrate, 502: adhesive, 503: substrate, 1101: electrode, 1102: electrode, 1103: EL layer, 1103a: EL layer, 1103b: EL layer, 1104: charge-generation layer, 1111: hole-injection layer, 111l a: hole-injection layer, 1111b: hole-injection layer, 1112: hole-transport layer, 1112a: hole-transport layer, 1112b: hole-transport layer, 1113: light-emitting layer, 1113a: light-emitting layer, 1113b: light-emitting layer, 1114: electron-transport layer, 1114a: electron-transport layer, 1114b: electron-transport layer, 1115: electron-injection layer, 1115a: electron-injection layer, 1115b: electron-injection layer, 1201: substrate, 1202: FET, 1203R: light-emitting element, 1203G: light-emitting element, 1203B: light-emitting element, 1203W: light-emitting element, 1204: EL layer, 1205: substrate, 1206R: color filter, 1206R': color filter, 1206G: color filter, 1206G': color filter, 1206B: color filter, 1206B': color filter, 1207: electrode, 1208: electrode, 1209: black layer, 1210R: conductive layer, 1210G: conductive layer, 1211R: optical path length, 1211G: optical path length, 1211B: optical path length, 5701: display panel, 5702: display panel, 5703: display panel, 5704: display panel, 5801: clothing, 5802: display portion, 5901: housing, 5902: display portion, 5903: operation button, 5904: operator, 5905: band, 6001: building, 6002: signboard, 6002A: signboard, 6003: steel frame, 6100: digital signage, 6101: display portion, 6102: structure body, 6103: caster, 6200A: digital signage, 6200B: digital signage, 6201: wall, 6300A: digital signage, 6300B: digital signage 6301: wall, 7000: electronic device, and 7001: finger.

This application is based on Japanese Patent Application Serial No. 2016-248914 filed with Japan Patent Office on Dec. 22, 2016 and Japanese Patent Application Serial No. 2017-159979 filed with Japan Patent Office on Aug. 23, 2017, the entire contents of which are hereby incorporated by reference.

The invention claimed is:

1. A display device comprising:
   a plurality of first units arranged in parallel to each other; and
   a plurality of second units arranged in parallel to each other;
   wherein each of the first units comprises at least one light-emitting portion and a plurality of connection regions,
   wherein in each of the first units, the connection regions and the light-emitting portion are arranged alternately to form a straight line,
   wherein each of the second units comprises at least one light-emitting portion and a plurality of connection regions, wherein in each of the second units, the connection regions and the light-emitting portion are arranged alternately to form a straight line, wherein the connection regions of the second units are overlapped and electrically connected with the connection regions of the first units, so that the first units and the second units intersect with each other, wherein the first units and the second units are configured to form a display region and wherein an aspect ratio of the display device is changeable.

2. The display device according to claim 1,
wherein some of the first units comprises at least one driver circuit portion, and
wherein each of the second units comprises at least one driver circuit portion.

3. The display device according to claim 2, further comprising a third unit comprising two connection regions and one driver circuit portion.

4. The display device according to claim 1,
wherein lengths of the first units are different from each other, and
wherein lengths of the second units are different from each other.

5. The display device according to claim 1, wherein the light-emitting portion comprises a light-emitting element.

6. A display device comprising:
a plurality of display units, the plurality of display units comprising a first display unit, a second display unit, a third display unit, a fourth display unit, a fifth display unit, a sixth display unit, and a seventh display unit,
wherein the plurality of display units are configured to form a display region,
wherein each of the plurality of display units comprises:
a light-emitting portion;
a first connection region comprising an opening; and
a second connection region comprising an opening,
wherein the first connection region is at a first end portion of the display unit, and
wherein the second connection region is at a second end portion opposite to the first end portion of the display unit,
wherein the first end portion of the first display unit overlaps with the second display unit, the third display unit, and the fourth display unit, wherein the second end portion of the first display unit overlaps with the fifth display unit, the sixth display unit, and the seventh display unit, wherein the first connection region of the first display unit is configured to make the first display unit being electrically connected to the second display unit, the third display unit, and the fourth display unit by a first shaft passing through the opening of the first connection region, and wherein the second connection region of the first display unit is configured to make the first display unit being electrically connected to the fifth display unit, the sixth display unit, and the seventh display unit by a second shaft passing through the opening of the second connection region.

7. The display device according to claim 6,
wherein the first display unit and the third display unit are arranged on a straight line, and
wherein the first display unit and the second display unit are not arranged on a straight line.

8. The display device according to claim 7, wherein the second display unit and the fourth display unit are arranged on a straight line.

9. The display device according to claim 7, wherein the first display unit, the third display unit, and the sixth display unit are arranged on a straight line.

10. The display device according to claim 7,
wherein an angle between the first display unit and the second display unit is configured to be changed, and
wherein an aspect ratio of the display device is changeable in accordance with the change of the angle.

11. The display device according to claim 6, further comprising a plurality of driver units,
wherein each of the plurality of the driver units comprises a driver circuit portion and a third connection region,
wherein the driver circuit portion is configured to drive the display region, and
wherein the third connection region of each of the driver units is configured to make the driver unit to be electrically connected to any one of the display units.

12. The display device according to claim 6, wherein the light-emitting portion comprises a light-emitting element.

* * * * *